(12) United States Patent
Kawauchi et al.

(10) Patent No.: US 6,423,467 B1
(45) Date of Patent: Jul. 23, 2002

(54) PHOTOSENSITIVE RESIN COMPOSITION

(75) Inventors: Ikuo Kawauchi; Keiji Akiyama; Noriaki Watanabe; Koichi Kawamura, all of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/287,568

(22) Filed: Apr. 6, 1999

(30) Foreign Application Priority Data

| Apr. 6, 1998 | (JP) | 10-093143 |
| Apr. 6, 1998 | (JP) | 10-093413 |
| Apr. 28, 1998 | (JP) | 10-118961 |
| May 7, 1998 | (JP) | 10-124884 |
| Jun. 25, 1998 | (JP) | 10-178966 |

(51) Int. Cl.[7] .................. G03F 7/004; G03F 7/021; G03F 7/023
(52) U.S. Cl. ............... 430/270.1; 430/176; 430/190; 430/191; 430/192; 430/193; 430/288.1; 430/302; 430/907
(58) Field of Search .................... 430/270.1, 302, 430/907, 190, 191, 192, 193, 176, 288.1

(56) References Cited

U.S. PATENT DOCUMENTS

| 4,839,256 A | * | 6/1989 | Muller ............... 430/192 |
| 5,958,648 A | * | 9/1999 | Nishimura et al. ...... 430/270.1 |
| 6,110,640 A | * | 8/2000 | Kawamura et al. .... 430/270.01 |

FOREIGN PATENT DOCUMENTS

| EP | 0 167 778 | 1/1986 |
| EP | 0 230 995 | 8/1987 |
| EP | 0 412 765 | 2/1991 |
| EP | 0 761 429 | 3/1997 |
| EP | 0 843 218 | 5/1998 |
| JP | 8-15858 | 1/1996 |

OTHER PUBLICATIONS

Database WPI, Section Ch, Week 199136, Derwent Publications Ltd., London, GB; Glass A14, AN 1991–263243—XP002123001 and JP 03 172849 A (Fuji Photo Film Co Ltd), Jul. 26, 1991.

Database WPI, Section Ch, Week 199613, Derwent Publications Ltd., London, GB; Class A14, AN 1996–120230—XP002123008 and JP 08 015858 A (Dainippon Ink & Chem Inc), Jan. 19, 1996.

* cited by examiner

*Primary Examiner*—John S. Chu
(74) *Attorney, Agent, or Firm*—Burns, Doane, Swecker & Mathis, LLP

(57) ABSTRACT

A photosensitive resin composition containing a high molecular compound having at least a) a fluoro aliphatic group, and b) a group represented by formula —L—P (wherein L represents a divalent organic group connected to the skeleton of the high molecular compound, and P represents an aromatic group having a carboxyl group at the ortho-position).

3 Claims, No Drawings

PHOTOSENSITIVE RESIN COMPOSITION

FIELD OF THE INVENTION

The present invention relates to a photosensitive resin composition containing a novel fluorine-based high molecular compound (hereinafter sometimes referred to as "a fluorine-containing polymer"), in particular, to a photosensitive resin composition useful in a lithographic printing plate. The present invention further relates to a photosensitive resin composition which gives image-forming property of high contrast in a lithographic printing plate.

The present invention relates to a positive type photosensitive resin composition which is suitable for use in manufacturing a lithographic printing plate, an IC circuit and a photomask, in particular, relates to a positive type photosensitive resin composition which gives image-forming property of high sensitivity and high contrast, is excellent in antihalation, safelight tolerance and development latitude. More specifically, the present invention relates to a positive type photosensitive resin composition which exhibits image-forming property of high contrast, excellent antihalation, safelight tolerance and wide development latitude, which is obtained by adding a specific compound to a positive type photosensitive resin composition highly sensitized by a conventionally well-known method without reducing the sensitivity.

The present invention further relates to an image-recording material usable as an offset printing master, in particular, relates to a positive type photosensitive resin composition for infrared laser for a so-called direct plate-making capable of directly plate-making from digital signals of, e.g., a computer.

BACKGROUND OF THE INVENTION

A lithographic printing plate comprising a substrate having coated thereon a photosensitive resin composition is generally subjected to exposure, then the exposed area or the unexposed area is removed by alkali development, thereby an image is obtained. In succeeding printing process, the image area comprising the remaining photosensitive resin composition works as an ink-receiving area and the substrate appeared after dissolution works as a moisture-receiving area, thus a printed matter is obtained. At this time, for obtaining good printed matters, no matter whether it is a negative type lithographic printing plate or a positive type lithographic printing plate, it is preferred that the image area and the non-image area of the image obtained after exposure and development be discriminative as far as possible, i.e., high gradation (high contrast), in view of image reproducibility and scratch resistance, and also high sensitivity is required.

A photosensitive resin composition comprising an o-quinonediazide compound, which is a representative positive type lithographic printing plate, has been industrially used as a very excellent positive type photosensitive resin composition in the production of a lithographic printing plate and as a photoresist. Various methods have so far been suggested for increasing the sensitivity of o-quinonediazide-based positive type photosensitive resin composition, however, those exhibiting image-forming property of high contrast, satisfactory antihalation, safelight tolerance and development latitude without reducing the sensitivity have not yet been found.

For example, when the amount of an o-quinonediazide compound is reduced, the sensitivity increases as a matter of course, but the gradation of the image becomes soft with the increase of sensitivity, and antihalation, safelight tolerance and development latitude are deteriorated. Further, when an o-quinonediazide compound is used in combination with a binder having high alkali solubility, the sensitivity increases but the gradation of the image becomes soft with the increase of sensitivity, and antihalation, safelight tolerance and development latitude are deteriorated the same as above.

On the other hand, chemical amplification series photosensitive substances having higher sensitivity than o-quinonediazide compounds in which an alkali-soluble group is protected with an acid decomposable group are suggested in U.S. Pat. No. 4,491,628 and European Patent 249139 and widely used. However, even with these compounds, photosensitive resin compositions having image-forming property of high contrast and satisfactory wide development latitude have not yet been obtained.

Here, the terminology "image of soft gradation" means that the difference between the step numbers from which an image begins to remain and the step numbers at which a film perfectly remains is large when a printing plate is exposed through a step wedge and developed. Conversely, "image of high contrast" means the difference between the step numbers from which an image begins to remain and the step numbers at which a film perfectly remains is small.

Halation is caused in consequence of a lith film being lifted due to the nitrogen gas generated as a result of the decomposition of quinonediazide and perfect contact exposure becoming impossible. In general, when clear sensitivity is the same, the higher the contrast of the image, the more easily is solved the halation.

Safelight tolerance is a criterion showing the stability of the sensitivity of an image when a printing plate is exposed to a safelight such as a fluorescent lamp and the higher the contrast of the image, the higher is the safelight tolerance. This concerns with the fact that quinonediazide is partially decomposed by a safelight. This is because if the quinonediazide is a little decomposed by a weak safelight when an image is high contrast, the image is not eluted and becomes the same with the image not exposed to a safelight.

A step wedge is a strip film the density of which changes every step, e.g., by 0.15, which is used for obtaining the relationship between the exposure amount and the remaining film amount of the photo sensitive layer after exposure and development. Clear sensitivity means the sensitivity when an image begins to be formed after exposure and development.

Development latitude is a characteristic showing the degree of fluctuation of the sensitivity of an image after exposure and development when the concentration of a developing solution is changed and the smaller the fluctuation of the sensitivity, the better is the development latitude.

On the other hand, in a photopolymerization series printing plate containing a monomer having a double bond polymerizable with a photopolymerization initiator, which is a representative negative type lithographic printing plate, in particular, in a laser direct exposure type printing plate which is highly sensitive to a laser beam in a visible light region, when image exposure is carried out with an inner drum type laser plate setter comprising exposing a fixed printing plate with a mirror rotating at high speed, fog is liable to occur due to scattered light and reflected light as the gradation is constitutionally soft. If exposure is conducted with a high energy for increasing the press life, fog due to scattered light and reflected light is worsened more and more, therefore, it has not been possible to increase the exposure amount while increasing the press life. It is necessary to prevent fog due to scattered light and reflected light from generating even with high exposure amount for the purpose of increasing the press life. This problem can be solved by making the gradation high contrast. An image exposure by a laser beam is effected for the time of about 1 μsec order per dot but fog due to scattered light and reflected light is caused by exposing a photosensitive material to extremely weak light for several minutes of order, as a result the photosensitive layer is photo-set.

Therefore, if the gradation of a photosensitive material is high contrast, the material is photo-set with difficulty by a weak light and removed by development, and does not result in fog.

In a heat-sensitive type lithographic printing plate comprising imaging using an infrared laser beam, etc., as the discrimination of an image area and a non-image is low, i.e., the gradation is low (soft), there are problems such as the area of the plate touched with a bare hand causes a blank area of an image or the stability against scratches is poor.

Techniques for increasing sensitivity by adding a photo-insensitive compound to a photosensitive composition containing an o-quinonediazide compound have been proposed but these techniques respectively have some drawbacks.

For example, a technique of increasing sensitivity by adding a cyclic acid anhydride is disclosed in JP-A-52-80022 (the term "JP-A" as used herein means an "unexamined published Japanese patent application"). However, although the effect of increasing sensitivity is certainly observed according to this method, if an acid anhydride is added in the amount to be able to obtain a sufficient sensitivity increase, the image becomes soft and safelight tolerance and development latitude extremely deteriorate. Further, for increasing sensitivity, the addition of a condensation product of hydroxybenzophenone and formaldehyde is disclosed in JP-A-55-73045. In this case also as the same with the above JP-A-52-80022, the effect of increasing sensitivity is observed but if the addition amount is such-that a sufficient sensitivity increase can be obtained, the image becomes soft and safelight tolerance and development latitude deteriorate.

Further, for preparing a lithographic printing plate from a photosensitive composition, a photosensitive composition must be coated on a support. A solution of a photosensitive composition dissolved or dispersed in an organic solvent (hereinafter referred to as "a coating solution") is coated on a support and dried. At this time, if a foam is present in a coating solution, that part is empty of the photosensitive composition, and the obtained product becomes an off-specification product. Therefore, it is known that the higher the defoaming property, the higher is the production suitability, which is the criterion of the liability to defoaming in a coating solution. However, when fluorine-containing polymers so far been used are added, defoaming property is lowered.

Here, "image is high contrast" means that the difference between the step numbers from which an image begins to remain and the step numbers at which a film perfectly remains is small when a printing plate is exposed through a step wedge and developed. Conversely, "image is soft" means the difference is large.

Further, techniques for increasing sensitivity by adding a photoinsensitive compound to a photosensitive composition containing an o-quinonediazide compound have been proposed but these techniques respectively have some drawbacks in the present state.

For example, a technique of increasing sensitivity by adding a cyclic acid anhydride is disclosed in JP-A-52-80022. However, although the effect of increasing sensitivity is certainly observed according to this method, if an acid anhydride is added in the amount to be able to obtain a conspicuous sensitivity increase, the image becomes soft.

There are disclosed in JP-A-62-226143, JP-A-3-172849 and JP-A-8-15858 fluorine-containing polymers having a fluoro aliphatic group and a polyoxyalkylene group as a surfactant. However, these polymers did not contribute toward obtaining the photosensitive composition providing an image of high contrast and a coating solution having good defoaming property.

The advancement of a laser is remarkable in recent years, in particular, a high output and compact size solid state laser and semiconductor laser having an emission area in near infrared to infrared region are easily available. These lasers are very useful as exposure light sources for direct plate-making from digital data such as a computer.

A material for a positive type lithographic printing plate for an infrared laser comprises as essential components a binder resin which is soluble in an aqueous alkali solution and an IR dye which absorbs a light and generates heat. The IR dye functions as a dissolution inhibitor to substantially lower the solubility of the binder resin by the interaction with the binder resin at a non-exposed area (an image area), and the interaction of the IR dye with the binder resin is weakened by the heat generated at an exposed area (a non-image area), and the binder resin is dissolved in an alkali developing solution, thereby a lithographic printing plate is formed.

However, there is such a problem as a material for a positive type lithographic printing plate for an infrared laser is in an unstable condition before development, for example, if the surface condition slightly varies by, e.g., mere touching of the surface during handling, the non-exposed area (the image area) is dissolved at development.

Such a problem originates in the fundamental difference in plate-making mechanism between a positive type lithographic printing plate material for an infrared laser and a positive type lithographic printing plate material by UV exposure.

That is, a positive type lithographic printing plate material in which plate-making is performed by UV exposure comprises a binder resin soluble in an aqueous alkali solution, an onium salt and quinonediazide compounds as essential components, and these onium salt and quinonediazide compounds not only function as a dissolution inhibitor by the interaction with the binder resin at a non-exposed area (an image area), but also are decomposed by light and generate an acid and function as a dissolution accelerator at an exposed area (a non-image area).

On the other hand, the IR dye in a material for a positive type lithographic printing plate for an infrared laser functions only as a dissolution inhibitor at a non-exposed area (an image area) and does not accelerate dissolution at an exposed area (a non-image area).

Accordingly, in a material for a positive type lithographic printing plate for an infrared laser, for making discrimination between the solubilities at a non-exposed area and at an exposed area, those having high solubility in an alkali developing solution cannot help being used as a binder resin. Therefore, the condition before development becomes unstable.

Fluorine-containing polymers having a fluoro aliphatic group, a polyoxyalkylene group, and an acidic hydrogen atom as surfactants are disclosed in JP-A-8-15858. However, antihalation and safelight tolerance could not be improved at all using the polymers disclosed in JP-A-8-15858 as specific examples.

The present invention aims at solving the above problems and providing a photosensitive resin composition showing image-forming property of high contrast without decreasing the sensitivity, in particular, providing a photosensitive resin composition exhibiting high contrast, satisfactory antihalation, safelight tolerance and wide development latitude.

For solving these problems, several techniques of adding a surfactant have so far been proposed. For example, a technique of widening development latitude by the addition of an ampholytic surfactant and an organic boron-based surfactant to a highly sensitized positive type photosensitive composition is disclosed in JP-A-59-121044. A technique of widening development latitude by the addition of a nonionic surfactant to a highly sensitized positive type photosensitive composition is disclosed in JP-A-62-251740. Although both techniques showed the effect of improving development latitude to a certain degree, noticeable results could not be obtained. If the amount is sufficient to obtain the desired effect, the sensitivity is decreased. As for antihalation and safelight tolerance, improving effect could not be obtained. In addition, fluorine-containing polymers having a fluoro aliphatic group, a polyoxyalkylene group or an anionic group as a surfactant are disclosed in JP-A-62-226143, JP-A-3-172849 and JP-A-8-15858. Antihalation and safelight tolerance, however, could not be improved at all using these polymers.

SUMMARY OF THE INVENTION

Accordingly, the object of the present invention is to solve the problems in the prior art and to provide a positive type photosensitive composition showing high contrast image-forming property, and satisfying all of antihalation, safelight tolerance and development latitude without decreasing the sensitivity.

Furthermore, the present invention is to solve the above-described problems in the prior art by using a specific fluorine-containing polymer having a fluoro aliphatic group and to provide a photosensitive lithographic printing plate which can provide a high contrast image and the coating solution of which shows good defoaming property.

Still further object of the present invention is to provide a positive type-photosensitive composition for an infrared laser for direct plate-making which is stable before development and excellent in handleability.

As a result of eager studies, the present inventors have found that the above object of the present invention can be attained by adding a specific fluorine-containing polymer to a photosensitive resin composition.

That is, the present inventors have found that when the following copolymer is added to a photosensitive resin composition as the first fluorine-containing polymer, a positive type photosensitive resin composition showing image-forming property of high contrast, antihalation, safelight tolerance and wide development latitude can be obtained without decreasing the sensitivity. This method of the present invention is particularly effective for making a positive type photosensitive resin composition highly sensitized by conventionally known methods. A soft image can be made high contrast, and halation, safelight tolerance and development latitude can be improved by the addition of the fluorine-containing polymer according to the present invention.

Further, it has been found that the gradation of a negative type lithographic printing plate becomes high contrast by the addition of the fluorine-containing polymer according to the present invention, in particular, in a laser-sensitive photopolymerization series printing plate, a printing plate which is highly sensitive to a laser beam, in which halation due to scattered light and reflected light has been improved, and having high press life can be obtained. In a heat-sensitive type lithographic printing plate, a printing plate having high discrimination and high image strength, i.e., the area of the plate touched with a bare hand does not cause a blank area of an image, and the stability against scratches has been improved can be obtained.

The first fluorine-containing polymer contained in the photosensitive resin composition according to the present invention is a polymer (a high molecular compound) having at least a) a fluoro aliphatic group, and b) a group represented by formula —L—P (wherein L represents a divalent organic group connected to the skeleton of the high molecular compound, and P represents an aromatic group having a carboxyl group at the ortho-position).

It is thought that due to the fluorine-containing polymer having an aromatic group having a carboxyl group at the ortho-position, the interaction of the fluorine-containing polymer with the binder becomes strong, as a result, further high contrast is accelerated at development.

As a result of eager investigation by the present inventors, it has been further found that the above object can be achieved by adding the second fluorine-containing polymer to a positive type photosensitive composition. That is, a positive type photosensitive composition showing image-forming property of high contrast, antihalation, safelight tolerance and wide development latitude can be obtained without decreasing the sensitivity by adding, as a fluorine-containing polymer, a copolymer having (1) a constituting component having a fluorine atom, (2) a constituting component having an acidic hydrogen atom, and (3) a constituting component showing lipophilic property to a photosensitive composition. This method of the present invention is particularly effective for making a positive type photosensitive composition highly sensitized by conventionally known methods. A soft image can be made high contrast, and halation, safelight tolerance and development latitude can be improved by the addition of the fluorine-containing polymer according to the present invention.

Accordingly, the object of the present invention can be attained by the following positive type photosensitive composition.

(1) A photo sensitive resin composition containing a high molecular compound (the second fluorine-containing polymer) having at least the constituting components represented by the following formulae (1), (2) and (3) as copolymer components, and o-quinonediazide compound:

$$CH_2=CAb[COO—Rb'—Rf] \quad (1)$$

wherein Ab represents a hydrogen atom or a methyl group; Rb' represents a single bond, —$(CH_2)_{mb}$—, —$(CH_2)_{mb}$NRb"$SO_2$—, or —$(CH_2)_{mb}$NRb"CO—; mb represents an integer of from 1 to 4; RB" represents a hydrogen atom or an alkyl group; Rf represents $C_nF_{2n+1}$; and n represents an integer of 3 or more;

$$CH_2=CAb[CO—Wb—R_{1b}—SO_2NH—R_{2b}] \quad (2)$$

wherein Ab represents a hydrogen atom or a methyl group; Wb represents an oxygen atom or —$NR_{3b}$—; $R_{3b}$ represents a hydrogen atom, an alkyl group, or an aryl group; $R_{1b}$ represents an alkylene group or an arylene group, each of which may have a substituent; and $R_{2b}$ represents a hydrogen atom, an alkyl group, or an aryl group;

$$CH_2=CAb[CO-Wb-R_{5b}] \quad (3)$$

wherein Ab represents a hydrogen atom or a methyl group; Wb represents an oxygen atom or $-NR_{3b}-$; $R_{3b}$ represents a hydrogen atom, an alkyl group, or an aryl group; and $R_{5b}$ represents an aliphatic group having 9 or more carbon atoms, or an aromatic group substituted with an aliphatic group having 2 or more carbon atoms.

Furthermore, the present inventors have found that the above object of the present invention can be attained by adding the third fluorine-containing polymer having a fluoro aliphatic group to a photosensitive composition.

That is, the present invention has been attained by the following:

(1) A photosensitive lithographic printing plate comprising a support having coated thereon a photosensitive layer containing the following components (a), (b) and (c), (a) an o-naphthoquinonediazide compound, (b) a resin soluble in an alkaline aqueous solution, and (c) a polymer (the third fluorine-containing polymer) having a (meth)acrylate monomer having two or three perfluoroalkyl groups having from 3 to 20 carbon atoms in the molecule as a polymer component.

(2) The photosensitive lithographic printing plate as described in the above item (1), wherein the polymer as in the above item (1) is a copolymer of the above polymer component, i.e., a (meth)acrylate monomer having two or three perfluoroalkyl groups having from 3 to 20 carbon atoms in the molecule, and a (meth)acrylate monomer having an OH group.

In the present invention, "a (meth)acrylate monomer having two or three perfluoroalkyl groups having from 3 to 20 carbon atoms in the molecule (sometimes referred to as a fluorine-containing monomer)" is not particularly restricted as long as it is a monomer comprising two or three perfluoroalkyl groups having from 3 to 20 carbon atoms connected to an acryloyl group or a methacryloyl group by a trivalent or tetravalent connecting groups. If the monomer has only one perfluoroalkyl group or the perfluoroalkyl groups have less than three carbon atoms, it is difficult to obtain the effect of the present invention.

The present inventors have found as a result of earnest studies that by adding the fourth fluorine-containing polymer to a positive type photosensitive composition for an infrared laser, a positive type lithographic printing plate material prepared from the photosensitive composition is stable before development.

That is, the present invention is a positive type photosensitive composition for an infrared laser which comprises the following (a), (b) and (c):

(a) a substance which absorbs a light and generates heat, (b) an alkaline aqueous solution-soluble resin having a phenolic hydroxyl group, and (c) a fluorine-containing polymer containing at least the following (1), (2) and (3) as a copolymer component:

(1) an addition polymerizable fluorine-containing monomer having, at the side chain, a fluoro aliphatic group, (2) a monomer represented by the following formula (1), (2), (3) or (4):

$$CH_2=CAd^1[CO-Wd-R^{2d}] \quad (1)$$

$$CH_2=CAd^1[O-CO-R^{3d}] \quad (2)$$

$$CH_2=CAd^1[Ud] \quad (3)$$

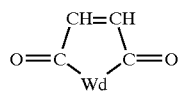

(4)

wherein $Ad^1$ represents a hydrogen atom, a halogen atom, or an alkyl group; Wd represents an oxygen atom or $-NR^{1d}-$; $R^{1d}$ represents a hydrogen atom, an alkyl group, or an aryl group; $R^{2d}$ represents an alkyl group which may have a substituent, or an aryl group which may have a substituent; $R^{3d}$ represents an alkyl group or an aryl group; Ud represents a cyano group, an aryl group, an alkoxyl group, an aryloxy group, an acyloxymethyl group, a nitrogen-containing heterocyclic group, or $-CH_2OCOR^{3d}$ (wherein $R^{3d}$ has the same meaning as above); and (3) an addition polymerizable monomer having an acidic hydrogen atom and an acidic group, the acidic hydrogen atom being bonded to a nitrogen atom of the acidic group.

Further, when an alkaline aqueous solution-soluble resin having a phenolic hydroxyl group, as a binder resin, is used in combination with a copolymer containing at least one of the following (4), (5) and (6) in an amount of 10 mol % or more as a copolymer component, the addition effect of the above fluorine-containing polymer is conspicuous, (4) a monomer having a sulfonamido group in which at least one hydrogen atom is bonded on the nitrogen atom in one molecule, (5) a monomer having an active imino group represented by the following formula in one molecule:

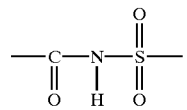

(6) acrylamide, methacrylamide, acrylic ester, methacrylic ester, or hydroxystyrene each having a phenolic hydroxyl group.

The reason why the positive type lithographic printing plate material prepared from the photosensitive composition becomes stable before development by the addition of the above-described fluorine-containing polymer is not clearly known, but from the fact that the static friction coefficient of the surface of the obtained positive type lithographic printing plate material is reduced due to the addition as compared with the case of not being added, it is presumably because the fluorine-containing polymer coated on a support and dried comes up to the surface of the positive type lithographic printing plate material obtained and forms a film and this film functions as a protective film.

According to the present invention, a positive type photosensitive composition for an infrared laser for direct plate-making which is stable before development and excellent in handleability can be obtained.

DETAILED DESCRIPTION OF THE INVENTION

The first fluorine-containing polymer according to the present invention is described in detail below.

The first fluorine-containing polymer for use in the present invention may be any polymer so long as the polymer has groups a) and b). Specific examples which can be used include an acrylic resin, a methacrylic resin, a styryl resin, a polyester resin, a polyurethane resin, a polycarbonate resin, a polyamide resin, and a polyacetal resin. Of these, an acrylic resin, a methacrylic resin, a styryl resin, a polyester resin, and a polyurethane resin are preferably used, and an acrylic resin, a methacrylic resin, and a polyurethane resin are particularly preferably used.

Among an acrylic resin, a methacrylic resin, and a polyurethane resin, an acrylic resin and a methacrylic resin are particularly useful in view of synthesizing suitability. An acrylic resin and a methacrylic resin are described in detail below.

When the first fluorine-containing polymer for use in the present invention is a (meth) acrylic resin, the polymer comprises the following constituting unit as a copolymer component:

a) an addition polymerizable monomer having a fluoro aliphatic group
b) an addition polymerizable monomer having a carboxylic-acid group represented by the following formula (1a) or (2a):

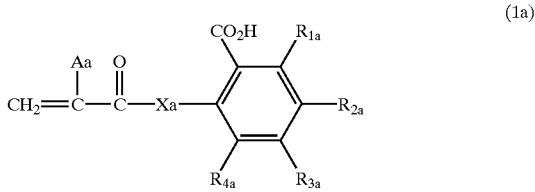

(1a)

wherein Aa represents a hydrogen atom, a halogen atom, or an alkyl group; Xa represents an oxygen atom, NH or N—$R_{5a}$ (wherein $R_{5a}$ represents an alkyl group); $R_{1a}$, $R_{2a}$, $R_{3a}$ and $R_{4a}$ each represents a hydrogen atom, a halogen atom, an alkyl group, a substituted alkyl group, an aryl group, a substituted aryl group, —O—$R_{6a}$, —OCO—$R_{7a}$, —NHCO—$R_{8a}$, —NHCONH—$R_{9a}$, —OCONH—$R_{10a}$, —COO—$R_{11a}$, —CONHR$_{12a}$, —CO—$R_{13a}$, —CON ($R_{14a}$) ($R_{15a}$), —CN, or —CHO group, or two of $R_{1a}$, $R_{2a}$$R_{3a}$ and $R_{4a}$ may be bonded to form a ring; and $R_{6a}$, $R_{7a}$, $R_{8a}$, $R_{9a}$, $R_{10a}$, $R_{11a}$, $R_{12a}$, $R_{13a}$, $R_{14a}$, and $R_{15a}$ each represents an alkyl group, a substituted alkyl group, an aryl group, or a substituted aryl group; provided that at least one of $R_{1a}$, $R_{2a}$, $R_{3a}$ and $R_{4a}$ preferably represents a group other than a hydrogen atom;

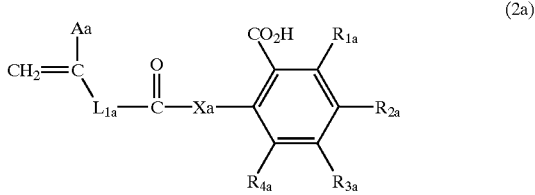

(2a)

wherein Aa represents a hydrogen atom, a halogen atom, or an alkyl group; Xa represents an oxygen atom, NH or N—$R_{5a}$ (wherein —$R_{5a}$ represents an alkyl group); $R_{1a}$, $R_{2a}$, $R_{3a}$ and $R_{4a}$ each represents a hydrogen atom, a halogen atom, an alkyl group, a substituted alkyl group, an aryl group, a substituted aryl group, —O—$R_{6a}$, —OCO—$R_{7a}$, —NHCO—$R_{8a}$, —NHCONH—$R_{9a}$, —OCONH—$R_{10a}$, —COO—$R_{11a}$, —CONH—$R_{12a}$, —CO—$R_{13a}$, —CON ($R_{14a}$) ($R_{15a}$), —CN, or —CHO group, or two of $R_{1a}$, $R_{2a}$ $R_{3a}$ and $R_{4a}$ may be bonded to form a ring; $R_{6a}$, $R_{7a}$, $R_{8a}$, $R_{9a}$, $R_{10a}$, $R_{11a}$, $R_{12a}$, $R_{13a}$, $R_{14a}$, and $R_{15a}$ each represents an alkyl group, a substituted alkyl group, an aryl group, or a substituted aryl group; provided that at least one of $R_{1a}$, $R_{2a}$, $R_{3a}$ and $R_{4a}$ preferably represents a group other than a hydrogen atom; and $L_{1a}$ represents a divalent organic group.

In the first place, an addition polymerizable monomer having a fluoro aliphatic group, which is copolymer component a) of the first fluorine-containing polymer of the present invention, is described in detail below.

A fluoro aliphatic group is in general a monovalent or divalent aliphatic group in which the hydrogen atom on the carbon atom is fluorinated and generally saturated, which includes straight chain, branched or cyclic group. For sufficiently exhibiting the effect of the present invention, the fluoro aliphatic group has from 3 to 20, preferably from 6 to 12, carbon atoms, and contains fluorine atoms, which are bonded to carbon atoms, in an amount of 40 wt % or more, preferably 50 wt % or more. A preferred fluoro aliphatic group is substantially completely, or sufficiently fluorinated perfluoro aliphatic group such as $C_nF_{2n+1}$— (n is an integer of 1 or more, preferably 3 or more) (hereinafter sometimes abbreviated to an Rf group).

As the addition polymerizable monomer part in an addition polymerizable monomer having a fluoro aliphatic group, which is component a), vinyl monomers having a radical polymerizable unsaturated group are used. Preferred examples of such vinyl monomers are acrylate, methacrylate, acrylamide, methacrylamide, styrene series and vinyl series.

As specific examples of fluoro aliphatic group-bonded acrylate and methacrylate, e.g., a compound represented by Rf—R'—OOC—C(R")=$CH_2$ (wherein R' represents a single bond, alkylene, sulfonamidoalkylene, or carbonamidoalkylene, R" represents a hydrogen atom, a methyl group, a halogen atom, or a perfluoro aliphatic group) can be exemplified.

As specific examples thereof, those disclosed in U.S. Pat. Nos. 2,803,615, 2,642,416, 2,826,564, 3,102,103, 3,282, 905, 3,304,278, JP-A-6-256289, JP-A-62-1116, JP-A-62-48772, JP-A-63-77574, JP-A-62-36657, Nihon Kagaku Kai-Shi, No. 10 (1985), pp. 1884–1888 can be exemplified.

Fluoro aliphatic group-bonded macromers described in Reports Res. Lab. Asahi Glass Co., Ltd., Vol. 34 (1984), pp. 27–34 can preferably be used other than the above-described fluoro aliphatic group-bonded monomers.

As fluoro aliphatic group-bonded monomers, a mixture of different lengths of perfluoroalkyl groups as represented by the following formula can be used:

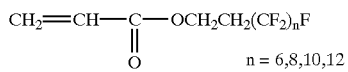

n = 6,8,10,12

The content of fluoro aliphatic group-containing vinyl monomers for use in the fluorine-containing polymer of the present invention is from 3 to 70 wt %, preferably from 7 to 60 wt %, based on the weight of the fluorine-containing polymer.

Subsequently, copolymer component b) of the first fluorine-containing polymer of the present invention is described in detail below.

In the first place, an addition polymerizable monomer having a carboxylic acid group represented by the following formula (1a) is described below.

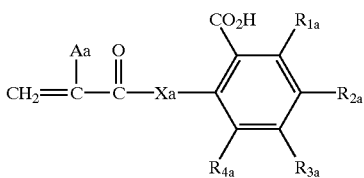

(1a)

wherein Aa represents a hydrogen atom, a halogen atom, or an alkyl group; Xa represents an oxygen atom, NH or N—$R_{5a}$ (wherein $R_{5a}$ represents an alkyl group); $R_{1a}$, $R_{2a}$, $R_{3a}$ and $R_{4a}$ each represents a hydrogen atom, a halogen atom, an alkyl group, a substituted alkyl group, an aryl group, a substituted aryl group, —O—$R_{6a}$, —OCO—$R_{7a}$, —NHCO—$R_{8a}$, —NHCONH—$R_{9a}$, —OCONH—$R_{10a}$, —COO—$R_{11a}$, —CONH—$R_{12a}$, —CO—$R_{13a}$, —CON ($R_{14a}$) ($R_{15a}$) , —CN, or —CHO group, or two of $R_{1a}$, $R_{2a}$, $R_{3a}$ and $R_{4a}$ may be bonded to form a ring; and $R_{6a}$, $R_{7a}$, $R_{8a}$, $R_{9a}$, $R_{10a}$, $R_{11a}$, $R_{12a}$, $R_{13a}$, $R_{14a}$, and $R_{15a}$ each represents an alkyl group, a substituted alkyl group, an aryl group, or a substituted aryl group; provided that at least one of $R_{1a}$, $R_{2a}$, $R_{3a}$ and $R_{4a}$ preferably represents a group other than a hydrogen atom.

In formula (1a), Aa represents a hydrogen atom, a halogen atom, or an alkyl group. Preferred halogen atoms are a chlorine atom and a bromine atom. An alkyl group having from 1 to 6, preferably from 1 to 4, carbon atoms can be used.

In formula (1a), $R_{1a}$, $R_{2a}$, $R_{3a}$ and $R_{4a}$ each represents a hydrogen atom, a halogen atom, an alkyl group, a substituted alkyl group, an aryl group, a substituted aryl group, —O—$R_{6a}$, —OCO—$R_{7a}$, —NHCO—$R_{8a}$, —NHCONH—$R_{9a}$, —OCONH—$R_{10a}$, —COO—$R_{11a}$, —CONH—$R_{12a}$, —CO—$R_{13a}$, —CON ($R_{14a}$) ($R_{15a}$), —CN, or —CHO group. Preferred halogen atoms are a fluorine atom, a chlorine atom and a bromine atom. As the alkyl group, an alkyl group having from 1 to 20, preferably from 1 to 8 carbon atoms, is used. As the aryl group, an aryl group having from 6 to 20, preferably from 6 to 10, carbon atoms, e.g., phenyl or naphthyl, is used. Examples of the substituents of the substituted alkyl group and the substituted aryl group include an aryl group, an alkoxyl group having from 1 to 10 carbon atoms, a halogen atom, an alkoxycarbonyl group, an acyloxy group, a formyl group, and an ether group. As the substituent of the substituted aryl group, an alkyl group having from 1 to 10 carbon atoms can be used other than described above.

Two of $R_{1a}$, $R_{2a}$, $R_{3a}$ and $R_{4a}$ may be bonded to form a ring. As the ring formed by two of $R_{1a}$, $R_{2a}$, $R_{3a}$ and $R_{4a}$, a 5- to 7-membered ring is preferred, e.g. , an aliphatic ring having from 4 to 14 carbon atoms, such as cyclopentane, cyclohexane, benzene, and naphthalene, an aryl ring, and a heterocyclic ring having from 1 to 4 hetero atoms such as pyridyl, furyl, pyrrole and indole can be exemplified.

$R_{5a}$ represents an alkyl group having from 1 to 6, preferably from 1 to 4, carbon atoms.

$R_{6a}$ to $R_{15a}$ each represents an alkyl group, a substituted alkyl group, an aryl group, or a substituted aryl group. As the alkyl group, an alkyl group having from 1 to 20, preferably from 1 to 8, carbon atoms, is used. As the aryl group, an aryl group having from 6 to 20, preferably from 6 to 10, carbon atoms, e.g., phenyl or naphthyl, is used. Examples of the substituents of the substituted alkyl group and the substituted aryl group include an aryl group having from 6 to 10 carbon atoms, an alkoxyl group having from 1 to 10 carbon atoms, a halogen atom, an alkoxycarbonyl group having from 2 to 10 carbon atoms, an acyloxy group having from 1 to 10 carbon atoms, and a formyl group. As the substituent of the substituted aryl group, an alkyl group having from 1 to 10 carbon atoms can be used other than described above.

In formula (1a), Aa preferably represents a hydrogen-atom or a methyl group; Xa preferably represents NH, $R_{1a}$ to $R_{4a}$ each preferably represents a halogen atom, an alkyl group having from 1 to 8 carbon atoms; an alkyl group substituted with a halogen atom, an aryl group or an alkoxyl group (totally having from 1 to 15 carbon atoms); an —O—$R_{6a}$ group, an —OCO—$R_{7a}$ group, or an —OCONH—$R_{10a}$ group (wherein $R_{6a}$, $R_{7a}$, and $R_{10a}$ each independently represents an alkyl group having from 1 to 8 carbon atoms; an aryl group; a substituted alkyl group substituted with a halogen atom, an aryl group or an alkoxyl group (totally having from 1 to 15 carbon atoms); or a substituted aryl group substituted with a halogen atom, an alkyl group or an alkoxyl group (totally having from 6 to 15 carbon atoms). It is also preferred that two of $R_{1a}$, $R_{2a}$, $R_{3a}$ and $R_{4a}$ are bonded to form a ring. Preferred examples of such rings include, as the condensed form with the aryl group to which a carboxyl group is bonded, naphthalene, tetralin, indene, indanone, tetralone, benzofuran and indole.

Specific examples of the polymer units represented by formula (1a) are shown below, but the present invention is not restricted to these examples.

1.

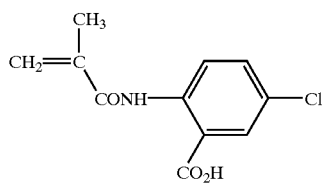

2.

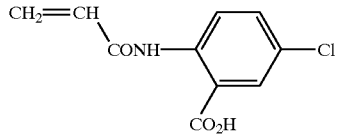

3.

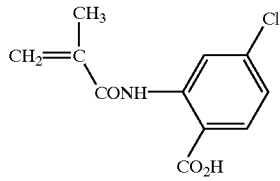

4.

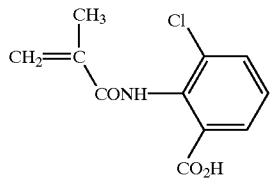

5.

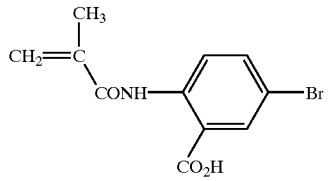

6.
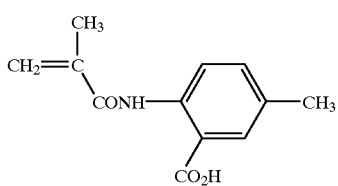

7.
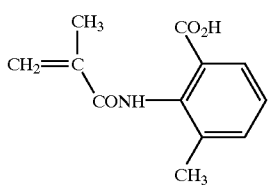

8.
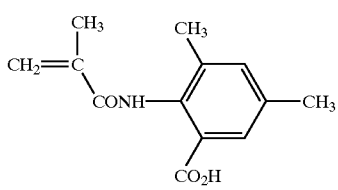

9.
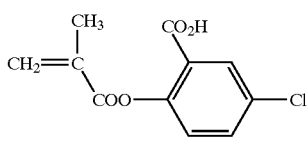

10.
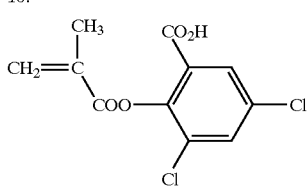

11.
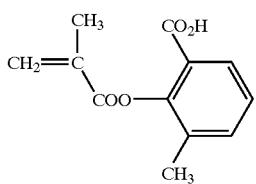

12.
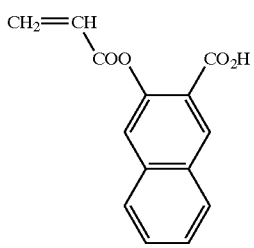

13.
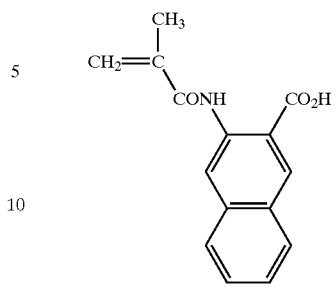

14.
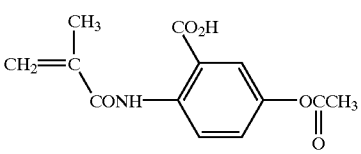

15.
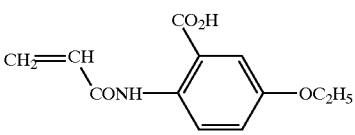

An addition polymerizable monomer having a carboxylic acid group represented by the following formula (2a) is described in detail below.

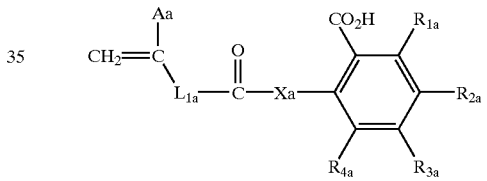

(2a)

wherein Aa represents a hydrogen atom, a halogen atom, or an alkyl group; Xa represents an oxygen atom, NH or N—$R_{5a}$ (wherein $R_{5a}$ represents an alkyl group); $R_{1a}$, $R_{2a}$, $R_{3a}$ and $R_{4a}$ each represents a hydrogen atom, a halogen atom, an alkyl group, a substituted alkyl group, an aryl group, a substituted aryl group, —O—$R_{6a}$, —OCO—$R_{7a}$, NHCO—$R_{8a}$, —NHCONH—$R_{9a}$, —OCONH—$R_{10a}$, —COO—$R_{11a}$, —CONH $R_{12a}$, —CO—$R_{13a}$, —CON($R_{14a}$)($R_{15a}$), —CN, or —CHO group, or two of $R_{1a}$, $R_{2a}$, $R_{3a}$ and $R_{4a}$ may be bonded to form a ring; $R_{6a}$, $R_{7a}$, $R_{8a}$, $R_{9a}$, $R_{10a}$, $R_{11a}$, $R_{12a}$, $R_{13a}$, $R_{14a}$, and $R_{15a}$ each represents an alkyl group, a substituted alkyl group, an aryl group, or a substituted aryl group; provided that at least one of $R_{1a}$, $R_{2a}$, $R_{3a}$ and $R_{4a}$ preferably represents a group other than a hydrogen atom; and $L_{1a}$ represents a divalent organic group.

In formula (2a), Aa represents a hydrogen atom, a halogen atom, or an alkyl group. Preferred halogen atoms are a bromine atom and a chlorine atom. An alkyl group having from 1 to 6, preferably from 1 to 4, carbon atoms can be used.

In formula (2a), $R_{1a}$, $R_{2a}$, $R_{3a}$ and $R_{4a}$ each represents a hydrogen atom, a halogen atom, an alkyl group, a substituted alkyl group, an aryl group, a substituted aryl group, —O—R$_{6a}$, OCO—R$_{7a}$, —NHCO—R$_{8a}$, —NHCONH—R$_{9a}$, —OCONH—R$_{10a}$, —COO—R$_{11a}$, —CONH—R$_{12a}$, —CO—R$_{13a}$, —CON(R$_{14a}$)(R$_{15a}$), —CN, or —CHO group. Preferred halogen atoms are a fluorine atom, a chlorine atom and a bromine atom. As the alkyl group, an alkyl group having from 1 to 20, preferably from 1 to 8, carbon atoms is used. As the aryl group, an aryl group having from 6 to 20, preferably from 6 to 10, carbon atoms, e.g., phenyl or naphthyl, is used. Examples of the substituents of the substituted alkyl group and the substituted aryl group include an aryl group having from 6 to 10 carbon atoms, an alkoxyl group having from 1 to 10 carbon atoms, a halogen atom, an alkoxycarbonyl group having from 2 to 11 carbon atoms, an acyloxy group having from 2 to 11 carbon atoms, and a formyl group. As the substituent of the substituted aryl group, an alkyl group having from 1 to 10 carbon atoms can be used other than described above.

Two of T$_{1a}$, R$_{2a}$, R$_{3a}$ and R$_{4a}$ may be bonded to form a ring. As examples of such rings, an aliphatic ring having from 4 to 14 carbon atoms, such as cyclohexyl, phenyl and naphthyl, an aryl ring, and a heterocyclic ring having from 1 to 4 hetero atoms such as pyridyl, furyl, pyrrole and indole can be exemplified.

R$_{5a}$ represents an alkyl group having from 1 to 6, preferably from 1 to 4, carbon atoms.

R$_{6a}$ to R$_{15a}$ each represents an alkyl group, a substituted alkyl group, an aryl group, or a substituted aryl group. As the alkyl group, an alkyl group having from 1 to 20, preferably from 1 to 8, carbon atoms, is used. As the aryl group, an aryl group having from 6 to 20, preferably from 6 to 10, carbon atoms, e.g., phenyl or naphthyl, is used. Examples of the substituents of the substituted alkyl group and the substituted aryl group include an aryl group having from 6 to 10 carbon atoms, an alkoxyl group having from 1 to 10 carbon atoms, a halogen atom, an alkoxycarbonyl group having from 2 to 11 carbon atoms, an acyloxy group having from 2 to 11 carbon atoms, and a formyl group. As the substituent of the substituted aryl group, an alkyl group having from 1 to 10 carbon atoms can be used other than described above.

In formula (2a), L$_{1a}$ represents a divalent organic group. Examples of useful divalent organic group represented by L$_{1a}$ include an alkylene group having from 1 to 20 carbon atoms (e.g., methylene, ethylene), an arylene group having from 6 to 20 carbon atoms (e.g., phenylene, naphthylene), and an alkenylene group having from 2 to 10 carbon atoms (e.g., vinylidene), and these alkylene, arylene, and alkenylene groups may further be substituted. Examples of preferred substituents include a halogen atom (e.g., chlorine, bromine), and a cyano group.

Two or more groups of these alkylene, arylene, and alkenylene groups, each of which may have a substituent, can be combined and form a divalent organic group as defined in L$_{1a}$.

Further, at either terminal, both terminals, between both terminals, or either terminal and between both terminals or both terminals and between both terminals, of the organic group defined in L$_{1a}$, an ester group (—COO—), an amido group (—CONH—), a carbamate group (—NHCO$_2$—), a urea group (—NHCONH—), an ether group (—O—), an imino group (—NH—), a thioether group (—S—), or a sulfonamido group (—SO$_2$NH—) may be contained or may intervene.

Particularly preferred L$_{1a}$ is a divalent organic group represented by the following formula (3).

(3)

wherein L$_{11a}$ represents —COO— or —CONH—; L$_{2a}$ represents —(CH$_2$)$_{1a}$—O— (1a represents an integer of from 2 to 15), or —(CH$_2$)$_{ma}$— (ma represents an integer of from 2 to 15); L$_{13a}$ represents —CO— or =CO—(CH$_2$)$_{na}$—COO— (na represents an integer of from 2 to 15); L$_{14a}$ represents an arylene group having from 6 to 10 carbon atoms, —(CH$_2$)$_{pa}$— (pa represents an integer of from 2 to 15), or NH; aa represents an integer of 0 or 1; ba represents an integer of 0, 1 or 2; and ca represents an integer of 0 or 1.

In formula (2a), Aa preferably represents a hydrogen atom or a methyl group; Xa preferably represents NH; R$_{1a}$ to R$_{4a}$ each preferably represents a hydrogen atom, a halogen atom, an alkyl group, an alkyl group having from 1 to 8 carbon atoms; an alkyl group substituted with a halogen atom, an aryl group or an alkoxyl group (totally having from 1 to 15 carbon atoms); an —O—R$_{6a}$ group, an —OCO—R$_{7a}$ group, or an —OCONH—R$_{10a}$ group (wherein R$_{6a}$, R$_{7a}$, and R$_{10a}$ each represents an alkyl group having from 1 to 8 carbon atoms; an aryl group; a substituted alkyl group substituted with a halogen atom, an aryl group or an alkoxyl group (totall having from 1 to 15 carbon atoms); or a substituted aryl group substituted with a halogen atom, an alkyl group or an alkoxyl group (totally having from 6 to 15 carbon atoms). It is also preferred that two of R$_{1a}$, R$_{2a}$, R$_{3a}$ and R$_{4a}$ are bonded to form a ring. Preferred examples of such rings include, as the condensed form with the aryl group to which a carboxyl group is bonded, naphthalene, tetralin, indene, indanone, tetralone, benzofuran and indole.

Specific examples of the polymer units represented by formula (2a) are shown below, but the present invention is not restricted to these examples.

16.

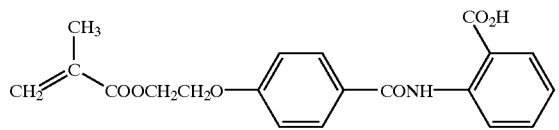

17.

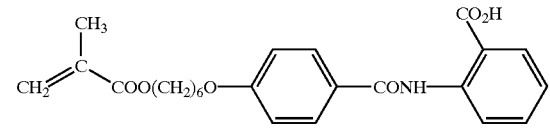

18.

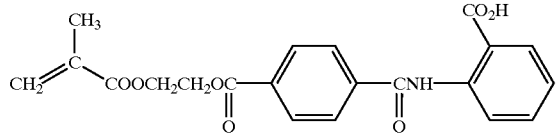

19.

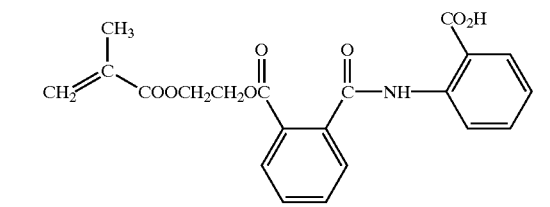

20.

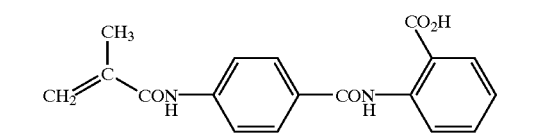

21.

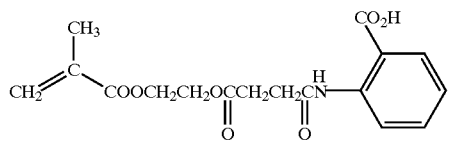

22.

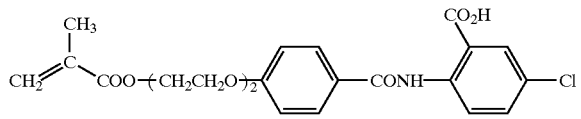

23.

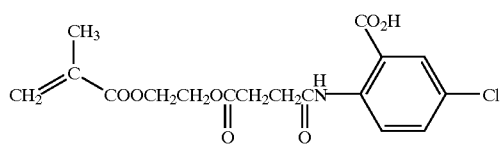

24.

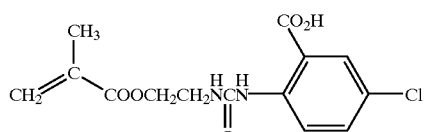

25.

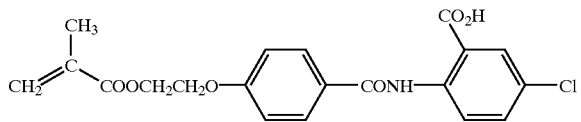

26.

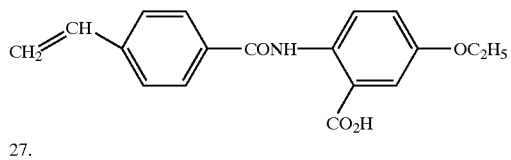

27.

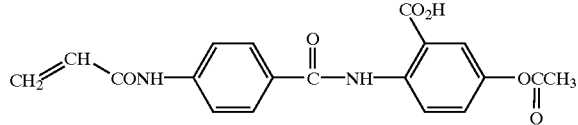

The content of the monomers represented by formula (1a) or (2a) having a carboxylic acid group at the side chain for use in the first fluorine-containing polymer of the present invention is from 5 to 80 wt %, preferably from 20 to 50 wt %, based on the weight of the first fluorine-containing polymer.

The first fluorine-containing polymer of the present invention can be manufactured by conventionally well-known methods. For example, the fluorine-containing polymer can be produced by adding a widely used radical polymerization initiator to (meth)acrylate (component a)) having a fluoro aliphatic group and (meth)acrylate (component b)) represented by formula (1a) or (2a) in an organic solvent and bringing about thermal polymerization, alternatively, in some cases, by adding other addition polymerizable unsaturated compounds and in the same manner as above.

For achieving the object of the present invention, it is essential that the fluorine-containing polymer comprises components a) and b), but more preferably (meth)acrylate or (meth)acrylamide having-an aliphatic group or an aromatic group can be contained as other addition polymerizable unsaturated compound.

Preferred examples of such (meth)acrylate or (meth)acrylamide having an aliphatic group or an aromatic group include (meth)acrylate or (meth)acrylamide having an aliphatic group or an aromatic group, which have 4 or more carbon atoms.

An aliphatic group having 4 or more carbon atoms includes a monovalent or divalent aliphatic group. An aliphatic group having 4 or more carbon atoms also includes straight chain, branched or cyclic aliphatic group. For these aliphatic groups to exhibit the effect of the present invention effectually, they have from 6 to 30, preferably from 8 to 25, carbon atoms. Specifically, an n-hexyl group, a cyclohexyl group, an n-octyl group, a nonyl group, a decyl group, a undecyl group, a dodecyl group, a tridecyl group, a tetradecyl group, and an octadecyl group can be exemplified.

As such aromatic groups, those having from 6 to 30, preferably from 6 to 20, carbon atoms are preferably used. An aromatic group substituted with an aliphatic group having 1 or more carbon atoms is preferably used. As aliphatic groups having 1 or more carbon atoms for use as the substituent, straight chain, branched or cyclic aliphatic groups having preferably from 1 to 20, more preferably from 4 to 18, carbon atoms, e.g., n-butyl, t-butyl, cyclohexyl, and 2-ethyhexyl are preferably used.

Such aliphatic and aromatic groups may have substituents, e.g., a halogen atom, an acyl group, an acyloxy group, an acylamino group, an alkoxycarbonyl group, a cyano group, and an aromatic group can be exemplified as examples of substituents.

Specific examples of acrylate, methacrylate, acrylamide, and methacrylamide having aliphatic group and/or an aromatic group having 4 or more carbon atoms include the following monomers:

For example, n-butyl acrylate, isobutyl acrylate, t-butyl acrylate, pentyl acrylate, octyl acrylate, nonyl acrylate, decyl acrylate, lauryl acrylate, stearyl acrylate, behenyl acrylate, benzyl acrylate, methylbenzyl acrylate, dimethylbenzyl acrylate, chlorobenzyl acrylate, bromobenzyl acrylate, ethylbenzyl acrylate, n-propylbenzyl acrylate, isopropylbenzyl acrylate, n-butylbenzyl acrylate, isobutylbenzyl acrylate, tert-butylbenzyl acrylate, phenyl acrylate, naphthyl acrylate, tolyl acrylate, xylyl acrylate, chlorophenyl acrylate, bromophenyl acrylate, ethylphenyl acrylate, n-propylphenyl acrylate, isopropylphenyl acrylate, n-butylphenyl acrylate, isobutylphenyl acrylate, and tert-butylphenyl acrylate. Preferred of these are lauryl acrylate, stearyl acrylate, behenyl acrylate, tert-butylbenzyl acrylate, t-butyl acrylate, and tert-butylphenyl acrylate.

Further, methacrylic esters can be cited, e.g., n-butyl methacrylate, isobutyl methacrylate, tert-butyl methacrylate, pentyl methacrylate, octyl methacrylate, nonyl methacrylate, decyl methacrylate, lauryl methacrylate, stearyl methacrylate, behenyl methacrylate, benzyl methacrylate, methylbenzyl methacrylate, dimethylbenzyl methacrylate, chlorobenzyl methacrylate, bromobenzyl methacrylate, ethylbenzyl methacrylate, n-propylbenzyl methacrylate, isopropylbenzyl methacrylate, n-butylbenzyl methacrylate, isobutylbenzyl methacrylate, tert-butylbenzyl methacrylate, phenyl methacrylate, naphthyl methacrylate, tolyl methacrylate, xylyl methacrylate, chlorophenyl methacrylate, bromophenyl methacrylate, ethylphenyl methacrylate, n-propylphenyl methacrylate, isopropylphenyl methacrylate, n-butylphenyl methacrylate, isobutylphenyl methacrylate, and tert-butylphenyl methacrylate. Preferred of these are lauryl methacrylate, stearyl methacrylate, behenyl methacrylate, tert-butyl methacrylate, tert-butylbenzyl methacrylate, and tert-butylphenyl methacrylate.

Further, the following acrylamides and methacrylamides can also be exemplified: N-nonylacrylamide, N-decylacrylamide, N-laurylacrylamide, N-stearylacrylamide, N-nonylmethacrylamide, N-decylmethacrylamide, N-laurylmethacrylamide, and N-stearylmethacrylamide.

The content of the vinyl monomers bonded to an aliphatic group or an aromatic group having 4 or more carbon atoms which can be preferably used for the first fluorine-containing polymer of the present invention is from 5 to 70 wt %, preferably from 10 to 50 wt %, based on the weight of the first fluorine-containing polymer.

Further, as examples of other addition polymerizable unsaturated compounds which are used according to cases, those described in J. Brandrup, *Polymer Handbook*, 2nd Ed., Chap. 2, pp. 1–483, Wiley Interscience (1975) can be used, for example, (meth)acrylates such as methyl (meth)acrylate, ethyl (meth)acrylate, 2-chloroethyl (meth)acrylate, 2-hydroxyethyl (meth)acrylate, and glycidyl (meth)acrylate; (meth)acrylamides such as (meth)acrylamide, N-ethyl (meth)acrylamide, N-propyl(meth)acrylamide, N-methylol (meth)acrylamide, N,N-dimethyl(meth)acrylamide, N-hydroxyethyl(meth)acrylamide, and N-(p-hydroxyphenyl) (meth)acrylamide; alkali compounds such as allyl acetate, allyl caproate, allyl stearate, and allyloxyethanol; vinyl ethers such as ethyl vinyl ether, propyl vinyl ether, butyl vinyl ether, octyl vinyl ether, methoxyethyl vinyl ether, ethoxyethyl vinyl ether, 2-chloroethyl vinyl ether, hydroxyethyl vinyl ether, benzyl vinyl ether, tetrahydrofurfuryl vinyl ether, phenyl vinyl ether, tolyl vinyl ether, and diethylaminoethyl vinyl ether; vinyl esters such as vinyl acetate, vinyl butyrate, vinyl caproate, vinyl chloroacetate, vinyl methoxyacetate, vinyl phenyl acetate, vinyl acetoacetate, vinyl benzoate, and vinyl chlorobenzoate; styrenes such as styrene, α-methylstyrene, methylstyrene, dimethylstyrene, chloromethylstyrene, ethoxymethylstyrene, hydroxystyrene, chlorostyrene, and bromostyrene; vinyl ketones-such as methyl vinyl ketone, ethyl vinyl ketone, propyl vinyl ketone, and phenyl vinyl ketone; olefins such as isobutylene, butadiene, and isoprene; and butyl crotonate, dimethyl itaconate, diethyl itaconate, dimethyl maleate, diethyl fumarate, N-vinylpyrrolidone, N-vinylpyridine, and acrylonitrile can be exemplified.

Other than these monomers, polyoxyalkylene (meth) acrylates disclosed in JP-A-62-226143 and JP-A-3-172849 can be used.

Further, when the fluorine-containing polymer of the present invention is used in the form other than acrylic resin or methacrylic resin, it is desired from the viewpoint of increasing the ink receptivity of the lithographic printing plate that the component having an aliphatic group or an aromatic group, as hydrophobic component c), is polymerized in addition to components a) and b). In particular, when the fluorine-containing polymer is used in the form of a polyurethane resin, it is preferred that the polymer component has at least one selected from a straight chain or branched aliphatic groups or alkylene groups having 10 carbon atoms or more and aromatic groups substituted with an aliphatic group having 4 or more carbon atoms.

Specific examples of the structures of the first fluorine-containing polymer according to the present invention are shown below. Numerals in formulae indicate the molar ratio of each monomer component.

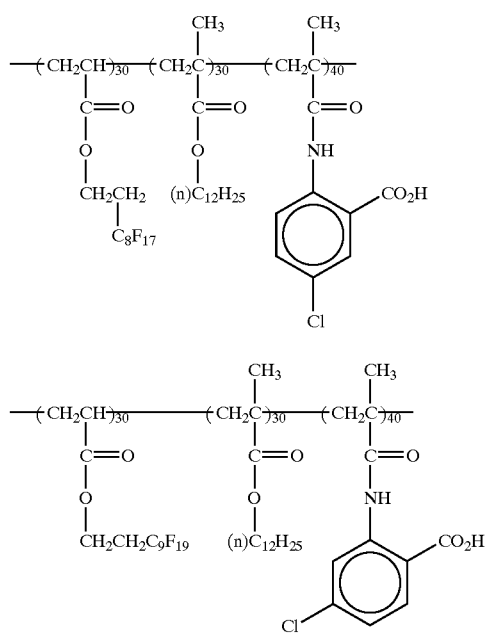

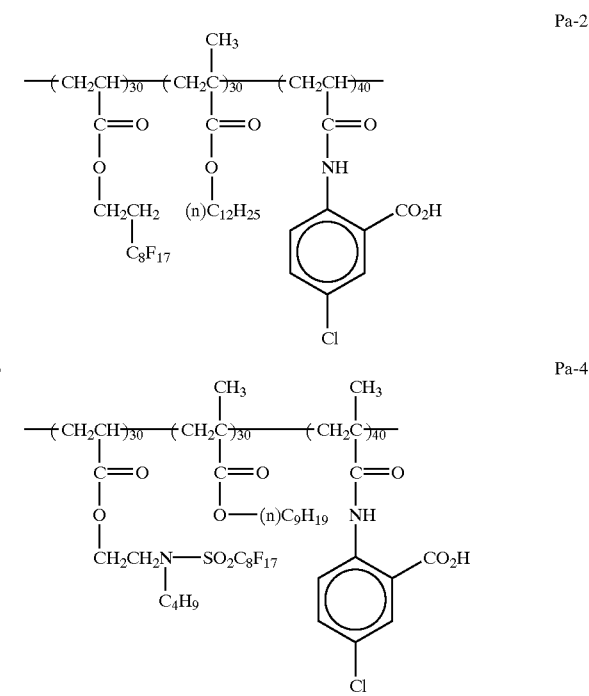

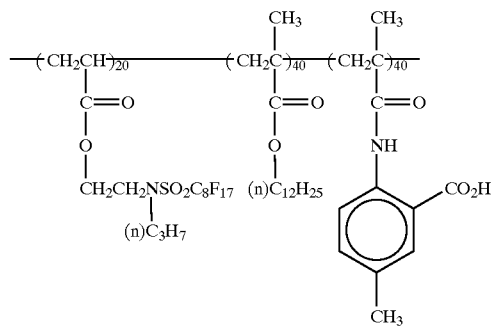
Pa-5
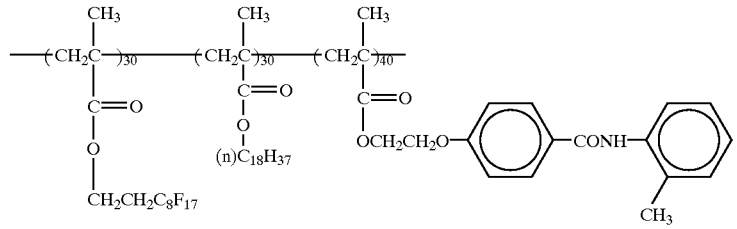
Pa-6
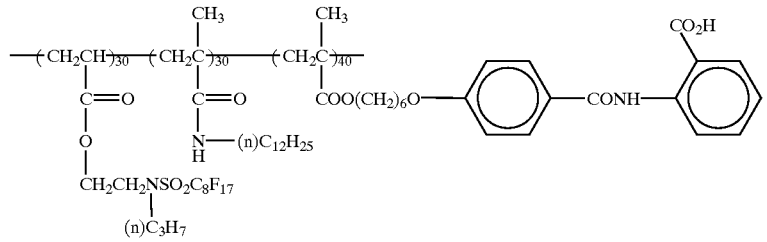
Pa-7
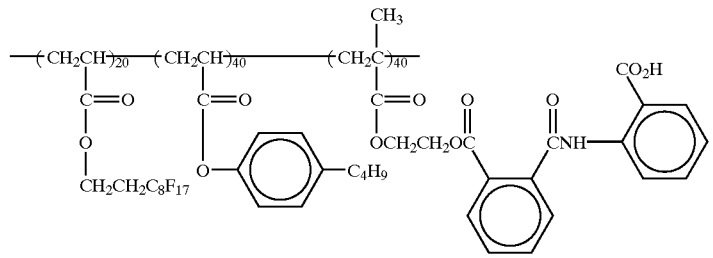
Pa-8
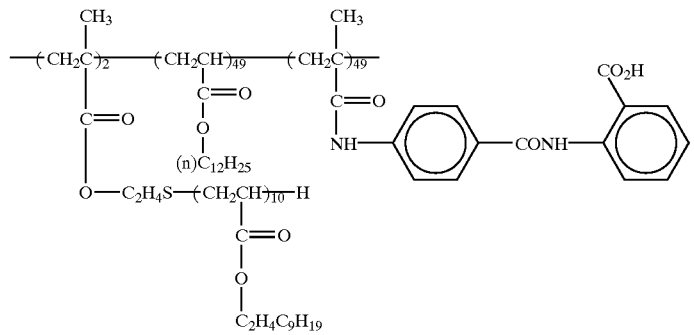
Pa-9

-continued

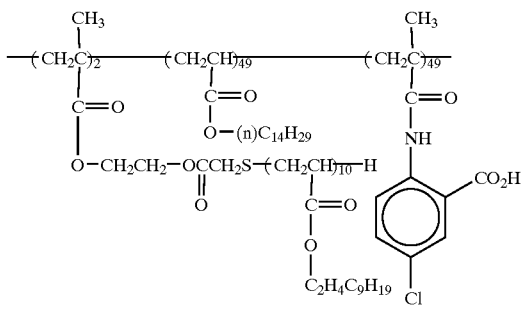
Pa-10

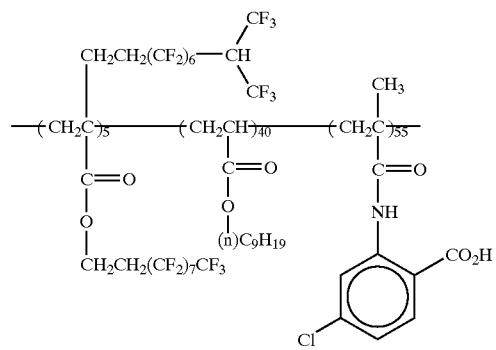
Pa-11

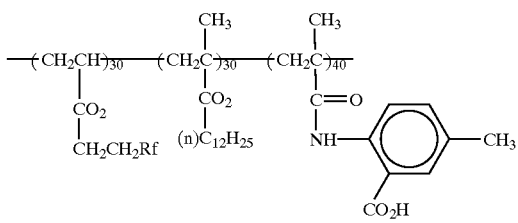
Pa-12

Rf: $C_nF_{2n+1}$ (n = 6, 8, 10, 12 mixture)

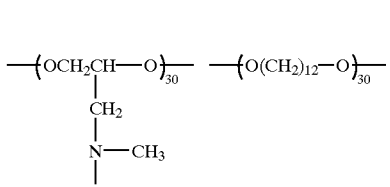

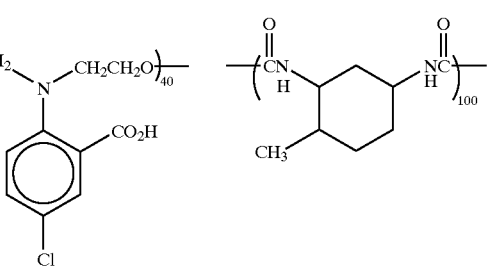
Pa-13

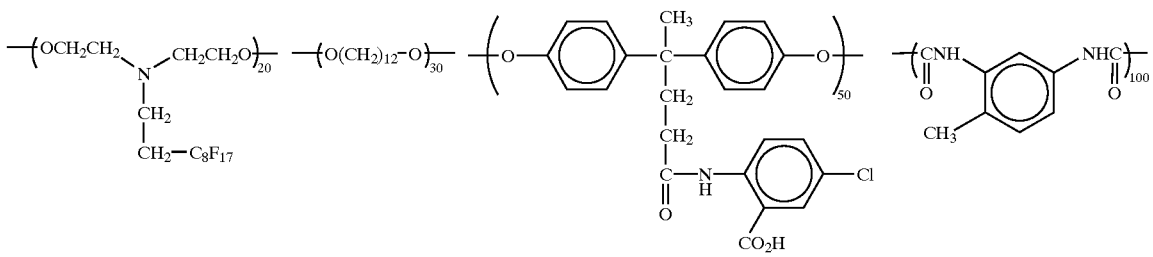
Pa-14

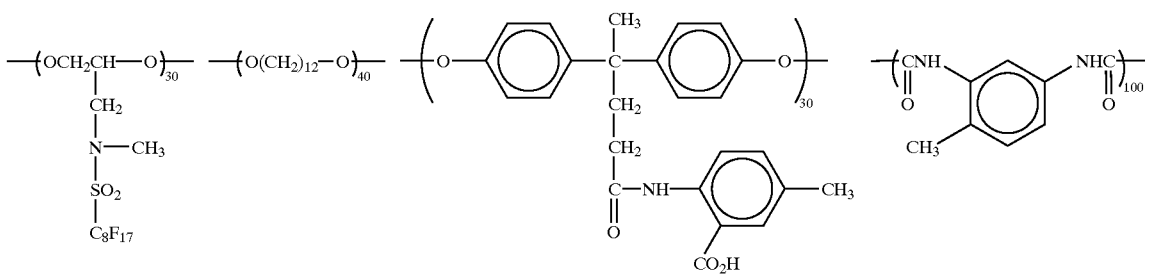
Pa-15

The first fluorine-containing polymer for use in the present invention has an average molecular weight of from 3,000 to 200,000, more preferably from 6,000 to 100,000.

The addition amount of the first fluorine-containing polymer in the photosensitive resin composition according to the present invention is preferably from 0.001 to 10 wt %, more preferably from 0.01 to 5 wt %, based on the entire components excluding the solvent.

Other components necessary in the production of the positive working photosensitive resin composition according to the present invention are described below.

As positive working photosensitive resin compositions, those having solubility or swelling property changing in a developing solution before and after exposure can be used in the present invention, and an o-quinonediazide compound can be exemplified as the preferred compound contained therein. For example, in the case of the positive type photosensitive resin composition containing an alkali-soluble resin and an o-quinonediazide compound, the o-quinonediazide compound is a compound having at least one o-quinonediazide group, and compounds whose solubility in an aqueous alkali solution changes by actinic ray are preferred.

Compounds of various structures are known as such a compound and described in detail in, e.g., J. Kosar, *Light-Sensitive Systems*, pp. 336–352, John Wiley & Sons, Inc. (1965).

As photosensitive compounds of a positive type photosensitive resin composition, a variety of sulfonates of o-benzoquinonediazide or o-naphthoquinonediazide and hydroxylated compounds are particularly preferred.

Examples of such o-quinonediazide compounds include an ester of 1,2-naphthoquinone-2-diazido-5-sulfonyl chloride and a phenol/formaldehyde resin or cresol/formaldehyde resin; an ester of 1,2-naphthoquinone-2-diazido-5-sulfonyl chloride and a pyrogallol/acetone resin as disclosed in U.S. Pat. No. 3,635,709; an ester of 1,2-naphthoquinone-2-diazido-5-sulfonyl chloride and a resorcin/benzaldehyde resin as disclosed in JP-B-63-13528 (the term "JP-B" as used herein means an "examined Japanese patent publication"); an ester of 1,2-naphthoquinone-2-diazido-5-sulfonyl chloride and a resorcin/pyrogallol/acetone co-condensation resin as disclosed in JP-B-62-44257; an ester of 1,2-naphthoquinone-2-diazido-5-sulfonyl chloride and a polyester having a hydroxyl group at the terminals as disclosed in JP-B-56-45127; an ester of 1,2-naphthoquinone-2-diazido-5-sulfonyl chloride and a-homopolymer of N-(4-hydroxyphenyl)-methacrylamide or a copolymer of N-(4-hydroxyphenyl)-methacrylamide with other polymerizable monomer as disclosed in JP-B-50-24641; an ester of 1,2-naphthoquinone-2-diazido-5-sulfonyl chloride and a bisphenol/formaldehyde resin as disclosed in JP-B-54-29922; an ester of 1,2-naphthoquinone-2-diazido-5-sulfonyl chloride and a homopolymer of p-hydroxystyrene or a copolymer of p-hydroxystyrene with other polymerizable monomer as disclosed in JP-B-52-36043; and an ester of 1,2-naphthoquinone-2-diazido-5-sulfonyl chloride and a polyhydroxybenzophenone.

In addition to the above, well-known o-quinonediazide compounds which can be used in the present invention are disclosed in JP-A-63-80254, JP-A-58-5737, JP-A-57-111530, JP-A-57-111531, JP-A-57-114138, JP-A-57-142635, JP-A-51-36129, JP-B-62-3411, JP-B-62-51459 and JP-B-51-483.

The content of these o-quinonediazide compounds is generally from 5 to 60 wt %, preferably from 10 to 40 wt %, based on the entire solid content of the photosensitive resin composition.

As photosensitive compounds other than o-quinonediazide compound, chemical amplification type photosensitive substances comprising the combination of a compound in which an alkali-soluble group is protected with an acid decomposable group and a photo-acid generater can be used.

Well-known photo-acid generators can be used in chemical amplification types.

Examples of such photo-acid generators include diazonium salts described in S. I. Schlesinger, *Photogr. Sci. Eng.*, 18, 387 (1974), T. S. Bal et al., *Polymer*, 21, 423 (1980), etc.; ammonium salts disclosed in U.S. Pat. Nos. 4,069,055, 4,069,056, JP-A-3-140140, etc.; phosphonium salts described in D. C. Necker et al., *Macromolecules*, 17, 2468 (1984), C. S. Wen et al., *Teh, Proc. Conf. Rad. Curing ASIA*, p. 478, Tokyo, Oct (1988), U.S. Pat. Nos. 4,069,055, 4,069,056, etc.; iodonium salts described in J. V. Crivello et al., *Macromolecules*, 10 (6), 1307 (1977), *Chem. & Eng. News*, November 28, p. 31 (1988), EP 104143, U.S. Pat. Nos. 339,049, 410,201, JP-A-2-150848, JP-A-2-296514, etc.; sulfonium salts, described in J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *Polymer Sci.*, Polymer Chem. Ed., 17, 2877 (1979), EP370693, U.S. Pat. No. 3,902,114, EP233567, EP233567, EP297443, EP297442, U.S. Pat. Nos. 4,933,377, 410,201, 339,049, 4,760,013, 4,734,444, 2,833,827, German Patents 2,904,626, 3,604, 580, and 3,604,581, etc.; selenonium salts described in J. V. Crivello et al., *Macromolecules*, 10 (6), 1307 (1977), and J. V. Crivello et al., *J. Polymer Sci.*, Chem. Ed., 17, 1047 (1979), etc.; onium salts such as arsonium salt, etc., described in C. S. Wen et al., *Teh, Proc. Conf. Rad. Curing ASIA*, p. 478, Tokyo, Oct (1988), etc.; organic halide compounds disclosed in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metal/organic halide compounds described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), JP-A-2-161445, etc.; photo-acid generator having o-nitrobenzyl type protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24), 2205 (1973), D. H. R. Barton et al., *J. Chem. Soc.*, 3571 (1965), P. M. Collins et al., *J. Chem. Soc.*, Perkin I, 1695 (1975), M. Rudinsteinetal., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130 (6), F. M. Houlihan et al., *Macromolecules*, 21, 2001 (1988), EP 0290750, EP 46083, EP 156535, EP 271851, EP 0388343, U.S. Pat. Nos. 3,901,710, 4,181,531, JP-A-60-198538, JP-A-53-133022, etc.; compounds which generate sulfonic acid by photolysis represented by iminosulfonate described in M. Tunook et al., *Polymer Preprints, Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), EP 0199672, EP 84515, EP 199672, EP 044115, EP 0101122, U.S. Pat. Nos. 4,618,564, 4,371,605, 4,431,774, JP-A-64-18143, JP-A-2-245756, Japanese Patent Application No. 3-140109, etc.; and disulfone compounds disclosed in JP-A-61-166544.

The addition amount of these compounds capable of being decomposed by irradiation of actinic ray or radiation to thereby generate an acid is generally from 0.001 to 40 wt %, preferably from 0.01 to 20 wt %, and more preferably from 0.1 to 5 wt %, based on the total weight of the photosensitive resin composition (excluding the coating solvent).

A compound in which an alkali-soluble group is protected with an acid decomposable group is a compound having a —C—O—C— or —C—O—Si— bond, and the following can be exemplified.

<a> a compound containing at least one selected from orthocarboxylic acid esters and a carboxylic acid amide acetals, capable of having polymerizability, in which the above group can occur as a crosslinking element or a side substituent,
<b> an oligomerizable or polymeric compound containing in the main chain compounds at least one selected from repeating acetal and ketal groups,
<c> a compound containing at least a kind of enol ester or an N-acylaminocarbonate group,
<d> a cyclic acetal or ketal of B-keto ester or B-ketoamide,
<e> a compound containing a silyl ether group,
<f> a compound containing a silyl enol ether group,
<g> a monoacetal or monoketal in which the aldehyde or ketone component has solubility of from 0.1 to 100 g per liter of a developer,
<h> an ether of a tertiary alcohol, and
<i> a carboxylate and a carbonate of an alcohol of tertiary allylic position or benzylic position.

As components of light irradiation-sensitive mixtures, compounds of kind <a> capable of cleavage by acid are disclosed in German Patents 2,610,842 and 2,928,636; mixtures containing compounds of kind <b> are disclosed in German Patents 2,306,248 and 2,718,254; compounds of kind <c> in EP 0006626 and EP 0006627; compounds of kind<d> in EP 0202196; compounds of kind <e> in German Patents 3,544,165 and 3,601,264; compounds of kind <f> in German Patents 3,730,785 and 3,730,783; compounds of kind <g> in German Patents 3,730,783; compounds of kind <h> in U.S. Pat. No. 4,603,101; and compounds of kind <h> are disclosed in U.S. Pat. No. 4,491,628 and M. Frechet et al., *J. Imaging Sci.*, 30, 59–64 (1986).

The content of these compounds protected with an acid decomposable group is generally from 1 to 60 wt %, preferably from 5 to 40 wt %, based on the entire solid content of the photosensitive resin composition.

As examples of resins insoluble in water and soluble in an alkaline aqueous solution (hereinafter referred to as an alkali-soluble resin), there can be exemplified a phenol/formaldehyde resin, a cresol/formaldehyde resin, a phenol/cresol/formaldehyde co-condensation resin, a phenol-modified xylene resin, polyhydroxystyrene, polyhydroxystyrene halide, an N-(4-hydroxyphenyl) methacrylamide copolymer, a hydroquinone monomethacrylate copolymer, sulfonylimide polymers disclosed in JP-A-7-28244, and carboxyl group-containing polymers disclosed in JP-A-7-36184. In addition, various alkali-soluble high molecular compounds such as acrylic resins having a phenolic hydroxyl group as disclosed in JP-A-51-34711, acrylic resins having a sulfonamido group as disclosed in JP-A-2-866, and urethane resins can also be used. These alkali-soluble polymer compounds preferably have a weight average molecular weight of from 500 to 20,000 and a number average molecular weight of from 200 to 60,000.

These alkali-soluble high molecular compounds can be used alone or in combination of two or more, in an addition amount of 80 wt % or less based on the entire compositions.

Further, for the purpose of improving the sensitizing property of an image, it is preferred to use, as disclosed in U.S. Pat. No. 4,123,279, a condensation product of formaldehyde and phenol having an alkyl group having from 3 to 8 carbon atoms as a substituent, such as a t-butylphenol/formaldehyde resin, and an octylphenol/formaldehyde resin. Such an alkali-soluble resin is generally used in an amount of 90 wt % or less based on the total weight of the composition.

Cyclic acid anhydrides for increasing sensitivity, printing out agents for obtaining a visible image immediately after exposure, dyes as an image-coloring agent, and other fillers can further be added to the photosensitive resin composition, if necessary.

For increasing sensitivity, it is preferred in the present invention to use cyclic acid anhydrides, phenols and organic acids.

Examples of cyclic acid anhydrides include, as disclosed in U.S. Pat. No. 4,115,128, phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride, and pyromellitic anhydride.

Examples of phenols include bisphenol A, p-nitrophenol, p-ethoxyphenol, 2,3,4-trihydroxybenzophenone, 4-hydroxybenzophenone, 2,4,4'-trihydroxybenzophenone, 4,4',4"-trihydroxy-triphenylmethane, and 4,4',3",4"-tetrahydroxy-3,5,3',5'-tetramethyltriphenylmethane.

Examples of organic acids include, as disclosed in JP-A-60-88942 and JP-A-2-96755, sulfonic acids, sulfinic acids, alkylsulfuric acids, phosphonic acids, phosphinic acids, phosphates, and carboxylic acids, specifically, p-toluenesulfonic acid, dodecylbenzenesulfonic acid, p-toluenesulfinic acid, ethyl sulfate, phenyl phosphonate, phenyl phosphinate, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicarboxylic acid, erucic acid, lauric acid, n-undecanoic acid, and ascorbic acid can be exemplified.

The content of cyclic acid anhydrides, phenols and organic acids in the photosensitive composition is preferably from 0.05 to 15 wt %, more preferably from 0.1 to 5 wt %.

As the printing out agent for obtaining a visible image immediately after exposure, a photosensitive compound which releases an acid upon exposure and an organic dye which forms a salt with the acid to change a color tone can be used in combination.

Examples of photosensitive compounds which release an acid upon exposure include, e.g., o-naphthoquinonediazide-4-sulfonic acid halogenide disclosed in JP-A-50-36209; trihalomethyl-2-pyrone and trihalomethyl-s-triazine disclosed in JP-A-53-36223; various o-quinonediazide compounds disclosed in JP-A-55-62444; 2-trihalomethyl-5-aryl-1,3,4-oxadiazole compounds disclosed in JP-A-55-77742; and diazonium salts. These compounds can be used alone or in mixture, and the addition amount is preferably from 0.3 to 15 wt % based on the total weight of the composition.

In photosensitive resin composition according to the present invention, at least one kind of an organic dye which changes a color tone by the interaction with the photolysis product of a compound which generates an acidic substance by photolysis. As such an organic dye, diphenylmethane, triarylmethane, thiazine, oxazine, phenazine, xanthene, anthraquinone, iminonaphthoquinone, and azomethine dyes can be used.

Specific examples of such dyes include Brilliant Green, Eosine, Ethyl Violet, Erythrosine B, Methyl Green, Crystal Violet, Basic Fuchsine, Phenolphthalein, 1,3-diphenyltriazine, Alizarin Red, Thymolphthalein, Methyl Violet 2B, Quinaldine Red, Rose Bengale, Thymolsulfophthalein, Xylenol Blue, Methyl Orange, Orange IV, Diphenylthiocarbazone, 2,7-dichlorofluorescein, Paramethyl Red, Congo Red, Benzopurpurine 4B, α-Naphthyl Red, Nile Blue 2B, Nile Blue A, Phenacetalin, Methyl Violet, Malachite Green, Parafuchsine, Oil Blue #603 (a product of Orient Kagaku Kogyo Co., Ltd.), Oil Pink #312 (a product of Orient Kagaku Kogyo Co., Ltd.), Oil Red 5B (a product of Orient Kagaku Kogyo Co., Ltd.), Oil Scarlet #308 (a product of Orient Kagaku Kogyo Co., Ltd.), Oil Red OG (a product of Orient Kagaku Kogyo Co., Ltd.), Oil Red RR (a product of Orient Kagaku Kogyo Co., Ltd.), Oil Green #502 (a product of Orient Kagaku Kogyo Co., Ltd.), Spiron Red BEH Special (a product of Hodogaya Chemical Co., Ltd.) , Victoria Pure Blue BOH (a product of Hodogaya Chemical Co., Ltd.), Patent Pure Blue (a product of Sumitomo Mikuni Kagaku Kogyo Co. , Ltd.) , Sudan Blue II (a product of BASF Co., Ltd.), m-cresol purple, Cresol Red, Rhodamine B, phodamine 6G, Firs t Acid Violet R, Sulfo Rhodamine B, Auramine, 4-p-diethylaminophenyliminonaphtho-quinone, 2-carboxyanilino-4-p-diethylaminophenyliminonaphthoquinone, 2-carbostearylamino-4-p-dihydroxyethylaminophenyl-iminonaphthoquinone, p-methoxybenzoyl-p'-diethylamino-o'-methylphenyliminoacetanilide, cyano-p-diethylaminophenyl-iminoacetanilide, 1-phenyl-3-methyl-4-p-diethylaminophenyl-imino-5-pyrazolone, and 1-β-naphthyl-4-p-diethylaminophenyl-imino-5-pyrazolone.

Particularly preferred organic dyes are triarylmethane series dyes. Of triarylmethane series dyes, those having a sulfonic acid compound as a counter anion disclosed in JP-A-62-2934471, Japanese Patent Application No. 4-112844 are particularly useful.

These dyes can be used alone or in mixture. The addition amount is preferably from 0.3 to 15 wt % based on the total weight of the photosensitive resin composition. These dyes can be used in combination with other dyes and pigments, if necessary, and the amount at that time is 70 wt % or less, preferably 50 wt % or less, based on the total weight of the dyes and pigments.

The photosensitive resin composition of the case when it is used as a photosensitive layer of a negative type photopolymerizable printing plate is described-below.

When the photosensitive resin composition of the present invention is a photopolymerizable photosensitive resin composition, the main components are a compound containing an addition polymerizable ethylenical double bond and a photopolymerization initiator, in addition to the fluorine-containing polymer and, if necessary, compounds such as a thermal polymerization preventing agent can be added.

A compound containing an addition polymerizable ethylenical double bond can be arbitrarily selected from among the compounds having at least one, preferably two or more, terminal ethylenically unsaturated bond.

For example, such a compound has the chemical form of a monomer, a prepolymer, i.e., a dimer, a trimer, and an oligomer or mixtures of these and a polymer of these.

As examples of monomers and copolymers thereof, esters of unsaturated carboxylic acids (e.g., acrylic acid, methacrylic acid, itaconic acid, crotonic acid, isocrotonic acid, maleic acid) and aliphatic polyhydric alcohol compounds, amide of unsaturated carboxylic acid and aliphatic polyhydric amine compounds can be exemplified.

Specific examples of monomers of esters of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri (acryloyloxyethyl) isocyanurate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane, bis[p-(methacryloxy)phenyl]dimethylmethane, etc.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

Further, the mixtures of the above-described ester monomers can also be exemplified.

Further, examples of amide monomers of aliphatic polyhydric amine compounds and unsaturated carboxylic acid include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As other example, as is disclosed in JP-B-48-41708, a vinyl urethane compound having two or more polymerizable vinyl groups in one molecule can be exemplified, which comprises a polyisocyanate compound having two or more isocyanate groups in one molecule having been added with a vinyl monomer having a hydroxyl group represented by the following formula (A).

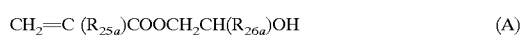

$$CH_2=C(R_{25a})COOCH_2CH(R_{26a})OH \qquad (A)$$

wherein $R_{25a}$ and $R_{26a}$ each represents H or $CH_3$.

Further, polyfunctional acrylates and methacrylates, such as urethane acrylates as disclosed in JP-A-51-37193, polyester acrylates, and epoxy acrylates obtained by reaction of epoxy resins with (meth)acrylic acid as disclosed in JP-A-48-64183, JP-B-49-43191 and JP-B-52-30490 can be exemplified. Monomers introduced into *Bulletin of Nihon Setchaku Kyokai,* Vol. 20, No. 7, pp. 300–308 (1984) as photosetting monomers and oligomers can be used as well. The use amount of these monomers is generally from 5 to 70 wt % (hereinafter abbreviated to merely %), preferably from 10 to 50%, based on the entire components.

Various photopolymerization initiators well known in patents and literature, and series comprising two or more photopolymerization initiators in combination can arbitrarily be applied to the photopolymerization initiator contained in the photopolymerizable photosensitive resin composition for use in the present invention selectively according to the wavelength of the light source to be used.

For example, when a light source in the vicinity of 400 nm is used, benzyl, benzoin ether, Michler's ketone, anthraquinone, thioxanthone, acridine, phenazine, benzophenone, etc., are widely used as a photopolymerization initiator.

When a visible light of 400 nm or more, an Ar laser, a second harmonic generator of a semiconductor laser, or an SHG-YAG laser is used as a light source, various photopolymerization initiators are suggested. For example, a certain kind of photoreductive dyes as disclosed in U.S. Pat. No. 2,850,445, e.g., Rose Bengale, Eosine and Erythrosine, or series comprising a combination of a dye and a photopolymerization initiator, e.g., a composite initiator comprising a dye and amine (JP-B-44-20189), series comprising a combination of hexaarylbiimidazole, a radical generator and a dye (JP-B-45-37377), series comprising hexaarylbiimidazole and p-dialkylaminobenzylidene ketone (JP-B-47-2528, JP-A-54-155292), series comprising a cyclic cis-a-dicarbonyl compound and a dye (JP-A-48-84183), series comprising cyclic triazine and a merocyaninedye (JP-A-54-151024), series comprising 3-ketocoumarin and an activator (JP-A-52-112681, JP-A-58-15503), series comprising biimidazole, a styrene derivative and thiol (JP-A-59-140203), series comprising an organic peroxide and a dye (JP-A-59-1504, JP-A-59-140203, JP-A-59-189340, JP-A-62-174203, JP-B-62-1641, U.S. Pat. No. 4,766,055), series comprising a dye and an active halide compound (JP-A-63-258903, JP-A-2-63054), series comprising a dye and a borate compound (JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348, JP-A-1-138204), series comprising a dye--having a rhodanine ring and a radical generator (JP-A-2-179643, JP-A-2-244050), series comprising titanocene and a 3-ketocoumarin dye (JP-A-63-221110), series comprising a combination of titanocene, a xanthene dye, and an addition polymerizable ethylenically unsaturated compound having an amino group or a urethane group (JP-A-4-221958, JP-A-4-219756), series comprising titanocene and a specific merocyanine dye (JP-A-6-295061), and series comprising titanocene and a dye having a benzopyran ring (JP-A-8-334897) can be exemplified.

The use amount of these photopolymerization initiators is from 0.05 to 100 parts by weight, preferably from 0.1 to 70 parts by weight, and more preferably from 0.2 to 50 parts by weight, based on 100 parts by weight of the ethylenically unsaturated compound.

Further, it is preferred to add a small amount of a thermal polymerization preventing agent to the photopolymerizable photosensitive resin composition of the present invention in addition to the above fundamental components for preventing unnecessary thermal polymerization of the polymerizable ethylenically unsaturated compound during production or storage of the photosensitive resin composition. Examples of suitable thermal polymerization preventing agents include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine primary cerium salt, and N-nitrosophenylhydroxylamine aluminum salt.

The addition amount of the thermal polymerization preventing agent is preferably from about 0.01% to about 5% based on the weight of the entire compositions. Further, if necessary, higher fatty acid derivatives such as behenic acid and behenic acid amide may be added and distributed locally on the surface of the photosensitive layer during drying process after coating with a view to preventing the hindrance of the polymerization due to the oxygen. The addition amount of the higher fatty acid derivatives is preferably from about 0.5% to about 10% of the entire compositions.

The photosensitive layer of the lithographic printing plate of the present invention comprising the photopolymerizable photosensitive resin composition can be provided with an oxygen-cutting off protective layer for the purpose of preventing the hindrance of the polymerization due to the oxygen.

As the water-soluble vinyl polymers contained in the oxygen-cutting off protective layer, polyvinyl alcohol, and its partial ester, ether, and acetal, and its copolymer containing unsubstituted vinyl alcohol unit of a substantial amount capable of imparting necessary water solubility can be used. Polyvinyl alcohols hydrolyzed from 71 to 100% and have a polymerization degree of from 300 to 2,400 are preferably used.

Specifically, PVA-105, PVA-110, PVA-117, PVA-117H, PVA-120, PVA-124, PVA-124H, PVA—CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (manufactured by Kuraray Co., Ltd.) can be exemplified.

As the above copolymers, polyvinyl acetate, chloroacetate, propionate, polyvinyl formal, polyvinyl acetal hydrolyzed from 88 to 100%, and copolymers of them can be used. Other useful copolymers are polyvinyl pyrrolidone, gelatin and gum arabic, and they can be used alone or in combination.

As the solvent for coating the oxygen-cutting off protective layer of the present invention, pure water is preferably used, but alcohols such as methanol and ethanol, and ketones such as acetone, methyl ethyl ketone may be mixed with pure water. The concentration of the solid content in the coating solution is preferably from 1 to 20 wt %.

Known additives such as a surfactant for improving the coating property, and a water-soluble plasticizer for improving physical properties of the film may be added to the oxygen-cutting off protective layer of the present invention. Examples of water-soluble plasticizers include, e.g., propionamide, cyclohexanediol, glycerin, sorbitol, etc. Water-soluble (meth)acrylate series polymers may be used as well.

The covering amount of the oxygen-cutting off protective layer is preferably about $0.1/m^2$ to about $15/m^2$, more preferably from $1.0/m^2$ to about $5.0/m^2$, by dry weight.

Besides positive-type PS plates in which the above quinonediazide or a compound having an alkali-soluble group protected with an acid-decomposable group is used, and negative type PS plates in which a photopolymerizable series compound is used, the present invention can be applied to the lithographic printing plate materials of the following types.

(1) negative type lithographic printing plate material in which a diazo resin is contained,
(2) negative type lithographic printing plate material in which a photo-crosslinking resin is contained, (3) negative type direct imaging lithographic printing plate material for a laser in which an alkali-soluble binder, an acid generating agent, and an acid (thermal) crosslinking compound are used, (4) positive type direct imaging lithographic printing plate material for a laser containing an alkali-soluble binder and a substance which is thermal-decomposable and substantially lowers the solubility of the alkali-soluble binder when it is in the state not being decomposed.

Materials for use are described in detail below in order.

(1) As diazo resins for use in type (1), e.g., diazo resins represented by the salts of the condensation products of diazodiarylamine and an active carbonyl compound. Photo-sensitive, water-insoluble but organic solvent soluble diazo resins are preferably used.

Particularly preferred diazo resins include, e.g., organic acid salts or inorganic acid salts of condensation products of 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxydiphenylamine, 4-diazo-3-methoxydiphenylamine, etc., with formaldehyde, paraformaldehyde, acetaldehyde, benzaldehyde, 4,4'-bis-methoxymethyldiphenyl ether, etc.

Organic acids at this time are methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, and 2-hydroxy-4-methoxybenzophenone-5-sulfonic acid, and inorganic acids are hexafluorophosphoric acid, tetrafluoroboric acid, and thiocyanic acid.

Further, a diazo resin the main chain of which is a polyester group disclosed in JP-A-54-30121; a diazo resin obtained by the reaction of a polymer having a carboxylic anhydride residue with a diazo compound having a hydroxyl group disclosed in JP-A-61-273538; and a diazo resin obtained by the reaction of a polyisocyanate compound with a diazo compound having a hydroxyl group can also be used.

The use amount of these diazo resins is preferably from 0 to 40 wt % based on the solid content of the composition and two or more diazo resins may be used in combination, according to necessity.

When a negative type photosensitive resin composition is prepared, a high molecular binder is generally used in combination. As such high molecular binders, e.g., an acrylic resin, a polyamide resin, a polyester resin, an epoxy resin, a polyacetal resin, a polystyrene resin, and a novolak resin can be exemplified.

Further, for the improvement of properties, known additives, e.g., a thermal polymerization preventing agent, a dye, a pigment, a plasticizer, a stability improver and the like can be added.

Examples of preferred dyes include a basic oil-soluble dye such as Crystal Violet, Malachite Green, Victoria Blue, Methylene Blue, Ethyl Violet, Rhodamine B, etc. As commercially available products, e.g., Victoria Pure Blue BOH (a product of Hodogaya Chemical Co., Ltd.), Oil Blue #603 (a product of Orient Kagaku Kogyo Co., Ltd.), etc., can be exemplified. Examples of pigments include Phthalocyanine Blue, Phthalocyanine Green, Dioxane Violet, Quinacridone Red, etc.

As plasticizers, e.g., diethyl phthalate, dibutyl phthalate, dioctyl phthalate, tributyl phosphate, trioctyl phosphate, tricresyl phosphate, tri(2-chloroethyl)phosphate, tributyl citrate, etc., can be exemplified.

As well-known stability improvers, e.g., phosphoric acid, phosphorous acid, oxalic acid, tartaric acid, malic acid, citric acid, dipicolinic acid, polyacrylic acid, benzenesulfonic acid, and toluenesulfonic acid can also be used in combination.

The addition amount of these additives varies according to purposes but in general from 0 to 30 wt % based on the solid content of the photosensitive resin composition is preferred.

(2) Photo-crosslinking resins for use in type (2) preferably have affinity with an aqueous alkali developing solution, e.g., copolymers having a cinnamic acid group and a carboxyl group disclosed in JP-A-54-15711; polyester resins having a phenylenediacrylic acid residue and a carboxyl group disclosed in JP-A-60-165646; polyester resins having a phenylenediacrylic acid residue and a phenolic hydroxyl group disclosed in JP-A-60-203630; polyester resins having a phenylenediacrylic acid residue and a sodium iminodisulfonyl group disclosed in JP-B-57-42858; polymers having an azido group and a carboxyl group at the side chain disclosed in JP-A-59-208552; and polymers having a maleimido group at the side chain disclosed in JP-A-7-295212 can be used.

(3) In type (3), the same materials used in a positive type PS plate, in which quinonediazide or a compound having an alkali-soluble group protected with an acid-decomposable group is used, can be used as the alkali-soluble binder and the acid generating agent. An acid (thermal) crosslinking compound means a compound which is crosslinked in the presence of an acid, e.g., aromatic compounds and heterocyclic compounds poly-substituted with a hydroxymethyl group, an acetoxymethyl group or an alkoxymethyl group, can be exemplified, and preferred examples are compounds obtained by condensation reaction of phenols with aldehydes in the basic condition.

Preferred of the above compounds are, e.g., compounds obtained by condensation reaction of phenols with aldehydes in the basic condition, compounds obtained from m-resol and formaldehyde in the same manner, compounds obtained from bisphenol A and formaldehyde, compounds obtained from 4,4'-bisphenol and formaldehyde, and besides the above, compounds disclosed in British Patent 2,082,339 as resol resins can be exemplified.

These acid crosslinking compounds preferably have a weight average molecular weight of from 500 to 100,000 and a number average molecular weight of from 200 to 50,000.

Other preferred examples of acid crosslinking compounds include aromatic compounds substituted with an alkoxymethyl group or an oxiranylmethyl group disclosed in EP-A-0212482, condensation products of monomers and oligomers disclosed in EP-A-0133216, DE-A-3,634,671 and DE-3,711,264 with melamine/formaldehyde and condensation products of the above monomers and oligomers with urea/formaldehyde, and alkoxyl-substituted compounds disclosed in EP-A-0212482.

Further, other preferred examples include, e.g., melamine/formaldehyde derivatives having at least two free N-hydroxymethyl, N-alkoxymethyl or N-acyloxymethyl groups. Of these, N-alkoxymethyl derivative is particularly preferred.

Low molecular weight or oligomer silanols can be used as a silicon-containing crosslinking agent. Examples thereof are dimethylsilanediol and diphenylsilanediol, and oligomers which are already preliminarily condensed and have these units. For example, those disclosed in EP-A-0377155 can be used.

Of aromatic compounds and heterocyclic compounds poly-substituted with an alkoxymethyl group, a compound having the alkoxymethyl group adjacent to the hydroxyl group, and the alkoxyl group of the alkoxymethyl group has 18 or less carbon atoms can be exemplified as preferred examples. Particularly preferred examples of compounds are represented by the following formula (B), (C), (D) or (E):

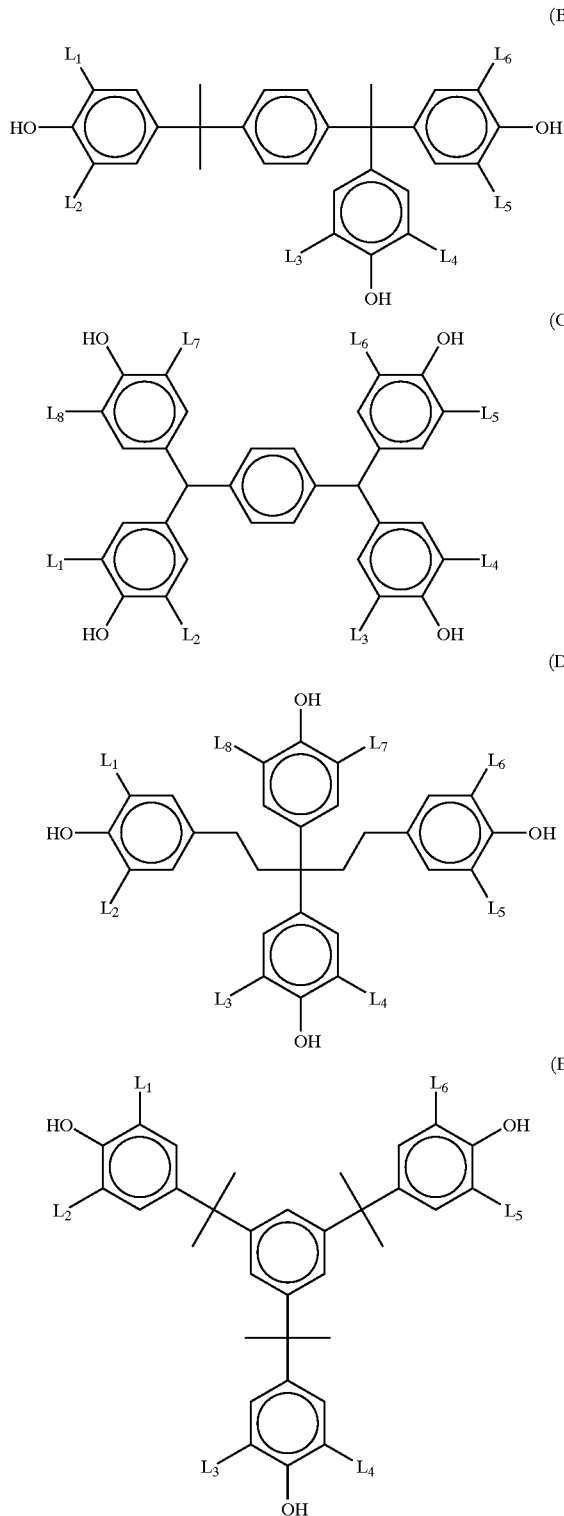

wherein $L_1$ to $L_8$, which may be the same or different, each represents an alkoxymethyl group substituted with an alkoxyl group having 18 or less carbon atoms such as a methoxymethyl or ethoxymethyl.

These compounds are preferred in view of high cross-linking efficiency and for improving press life.

The thermally crosslinkable compound can be used alone or may be used in combination of two or more.

The addition amount of the acid-crosslinkable compound for use in the present invention is from 5 to 80 wt %, preferably from 10 to 75 wt %, and particularly preferably from 20 to 75 wt %, based on the entire solid content of the lithographic printing plate material. When the addition amount of the acid-crosslinkable compound is less than 5 wt %, the durability of the photosensitive layer of the lithographic printing plate obtained is deteriorated, while when it exceeds 80 wt %, the storage stability disadvantageously lowers.

(4) The same alkali-soluble binder as used in a positive type PS plate in which quinonediazide is used can be used in step (4). As substances which are thermal-decomposable and substantially lower the solubility of alkali-soluble binders when they are in the state not being decomposed, various onium salts and quinonediazide compounds are excellent in capability of substantially reducing the solubility of alkali-soluble binders and advantageously used.

As onium salts, a diazonium salt, an ammonium salt, a phosphonium salt, an iodonium salt, a sulfonium salt, a selenonium salt, and an arsonium salt can be exemplified.

Preferred examples of onium salts for use in the present invention include, e.g., diazonium salts described in S. I. Schlesinger, *Photoar. Sci. Eng.*, 18, 387 (1974), T. S. Bal et al., *Polymer*, 21, 423 (1980), JP-A-5-158230; ammonium salts described in U.S. Pat. Nos. 4,069,055, 4,069,056, JP-A-3-140140; phosphonium salts described in D. C. Necker et al., *Macromolecules*, 17, 2468 (1984), C. S. Wen et al., *Teh, Proc. Conf. Rad. Curing ASIA*, p. 478, Tokyo, October (1988), U.S. Pat. Nos. 4,069,055, 4,069,056; iodonium salts described in J. V. Crivello et al., *Macromolecules*, 10 (6), 1307 (1977), *Chem. & Eng. News*, November 28, p. 31 (1988) EP 104143, U.S. Pat. Nos. 339,049, 410,201, JP-A-2-150848, JP-A-2-296514; sulfonium salts described in J. V. Crivello et al., *Polymer J.*, 17, 73 (1985), J. V. Crivello et al., *J. Org, Chem,*, 43, 3055 (1978), W. R. Wattet al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17, 2877 (1979), EP 370693, U.S. Pat. No. 3,902,114, EP 233567, EP 297443, EP 297442, U.S. Pat. Nos. 4,933,377, 410,201, 339,049, 4,760,013, 4,734,444, 2,833,827, German Patents 2,904,626, 3,604,580, 3,604,581; J. V. Crivello et al., *Macromolecules*, 10 (6), 1307 (1977), J. V. Crivello et al.,*J. Polymer Sci.*, Polymer Chem. Ed., 17, 1047 (1979); and arsonium salts described in C. S. Wen et al., *Teh. Proc. Conf. Rad. Curina ASIA*, p. 478, Tokyo, October (1988).

Of these, diazonium salts are particularly preferably used in the present invention, and diazonium salts disclosed in JP-A-5-158230 are particularly preferred.

Preferred quinonediazide compounds are o-quinonediazide compounds.

The o-quinonediazide compounds for use in the present invention are compounds having at least one o-quinonediazido group and whose alkali solubility is increased by thermal decomposition and compounds of various structures can be used. That is, by thermal decomposition, o-quinonediazide loses the function of inhibiting dissolution of an alkali-soluble binder and o-quinonediazide per se converts to an alkali-soluble substance, thereby assist the solution of photosensitive materials. o-Quinonediazide compounds described in, e.g., J. Kosar, *Light-Sensitive Systems*, pp. 339–352, John Wiley & Sons, Inc. can be used in the present invention. In particular, sulfonates or sulfonic acid amides of o-quinonediazide obtained by reaction with various aromatic polyhydroxyl compounds or aromatic amino compounds are preferred. Further, esters of benzoquinone-(1,2)-diazidosulfonic acid chloride or naphthoquinone-(1,2)-diazido-5-sulfonic acid chloride and pyrogallol/acetone resins disclosed in JP-B-43-28403, and esters of benzoquinone-(1,2)-diazidosulfonic acid chloride or naphthoquinone-(1,2)-diazido-5-sulfonic acid chloride and phenol/formaldehyde resins disclosed in U.S. Pat. Nos. 3,046,120 and 3,188,210 are also preferably used.

Further, esters of naphthoquinone-(1,2)-diazido-4-sulfonic acid chloride and phenol/formaldehyde resins or cresol/formaldehyde resins, and esters of naphthoquinone-(1,2)-diazido-4-sulfonic acid chloride and pyrogallol/acetone resins are also preferably used in the present invention. As other useful o-quinonediazide compounds, those disclosed in the following patents can be exemplified: JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,554,323, 3,573,917, 3,674,495, 3,785,825, British Patents 1,277,602, 1,251,345, 1,267,005, 1,329,888, 1,330,932, and German Patent 854,890.

The addition amount of the o-quinonediazide compounds for use in the present invention is preferably from 1 to 50 wt %, more preferably from 5 to 30 wt %, and particularly preferably from 10 to 30 wt %, based on the entire solid content of the lithographic printing plate material. These compounds can be used alone or they may be used as mixtures. When the addition amount of the o-quinonediazide compounds is less than 1 wt %, image recording property is deteriorated, while when it exceeds 50 wt %, durability of the image area is deteriorated or sensitivity lowers.

As counter ions of onium salts, boric acid tetrafluoride, phosphoric acid hexafluoride, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid, and paratoluenesulfonic acid can be exemplified. Of these, alkyl aromatic sulfonic acid such as phosphoric acid hexafluoride, triisopropylnaphthalenesulfonic acid, and 2,5-dimethylbenzenesulfonic acid are preferred.

The addition amount of the above-described compounds other than the o-quinonediazide compound is preferably from 1 to 50 wt %, more preferably from 5 to 30 wt %, and particularly preferably from 10 to 30 wt %, based on the entire solid content of the lithographic printing plate material.

In addition, various additives can be added to the composition of the present invention according to purposes, for example, various resins having a hydrophobic group for improving the ink-receiving property of the image, e.g., octylphenol/formaldehyde resins, t-butylphenol/formaldehyde resins, t-butylphenol/benzaldehyde resins, rosin-modified novolak resins, o-naphthoquinonediazidosulfonate of these modified novolak resins, etc.; and plasticizers for improving the flexibility of the coating film, e.g., dibutyl phthalate, dioctyl phthalate, butyl glycolate, tricresyl phosphate, dioctyl adipate, etc. The addition amount of additives is preferably from 0.01 to 30 wt % based on the total weight of the composition.

Moreover, known resins can be added to the composition for further improving the abrasion resistance of the film. For example, polyvinyl acetal resins, polyurethane resins, epoxy resins, vinyl chloride resins, nylons, polyester resins, and acrylic resins can be used for such a purpose. These can be used alone or in combination. The addition amount is preferably from 2 to 40 wt % based on the total weight of the composition.

Surfactants can be added to the photosensitive resin composition of the present invention for widening development latitude, e.g., nonionic surfactants as disclosed in JP-A-62-251740 and JP-4-68355, and ampholytic surfactants as disclosed in JP-A-59-121044 and JP-A-4-13149 can be added.

Specific examples of nonionic surfactants include sorbitan tristearate, sorbitan monopalmitate, sorbitan trioleate, stearic acid monoglyceride, polyoxyethylene sorbitan monooleate, polyoxyethylenenonylphenyl ether, etc., and specific examples of ampholytic surfactants include alkyldi(aminoethyl)glycine, alkylpolyaminoethylglycine hydrochloride, Amorgen K (trade name, Daiichi Kogyo Seiyaku Co., Ltd., N-tetradecyl-N,N-betaine type), 2-alkyl-N-carboxyethyl-N-hydroxyethylimidazolinium betaine, Rebon 15 (trade name, Sanyo Kasei Co., Ltd., alkylimidazoline series), etc.

The proportion of the above-described nonionic and ampholytic surfactants in the photosensitive resin composition is preferably from 0.05 to 15 wt %, more preferably from 0.1 to 5 wt %.

Improvement of Coating Surface Quality

Surfactants, e.g., fluorine surfactants disclosed in JP-A-62-170950 can be added to the photosensitive resin composition according to the present invention for improving the coating surface quality. Addition amount is preferably from 0.001 to 1.0 wt %, more preferably from 0.005 to 0.5 wt %, based on the entire photosensitive resin composition.

Yellow dyes can be added to the photosensitive resin composition according to the present invention, preferably yellow dyes the light absorption of which at 417 nm is 70% or more of that at 436 nm.

When a photosensitive material for a lithographic printing plate is prepared from the photosensitive resin composition containing the fluorine-containing polymer of the present invention, the resin composition is provided on an appropriate support in the first place. The photo sensitive resin composition containing the fluorine-containing polymer of the present invention is dissolved or dispersed in a single or mixed organic solvents described below, coated on a support and dried.

Any known organic solvent can be used, but those having a boiling point of from 40° C. to 200° C., particularly preferably from 60° C. to 160° C., are preferably used from the viewpoint of advantageousness at drying. As a matter of course, organic solvents in which the surfactants of the present invention are dissolved are preferably selected.

Examples of organic solvents include alcohols, e.g., methyl alcohol, ethyl alcohol, n-propyl alcohol, isopropyl alcohol, n-butyl alcohol, isobutyl alcohol, diacetone alcohol, etc.; ketones, e.g., acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone, acetylacetone, etc.; hydrocarbons, e.g., benzene, toluene, xylene, cyclohexane, methoxybenzene, etc.; acetates, e.g., ethyl acetate, n-propyl acetate, isopropyl acetate, n-butyl acetate, isobutyl acetate, ethylbutyl acetate, hexyl acetate, etc.; halides, e.g., methylene dichloride, ethylene dichloride, monochlorobenzene, etc.; ethers, e.g., isopropyl ether, n-butyl ether, dioxane, dimethyl dioxane, tetrahydrofuran, etc.; polyhydric alcohols and derivatives thereof, e.g., ethylene glycol, methyl cellosolve, methyl cellosolve acetate, ethyl cellosolve, diethyl cellosolve, cellosolve acetate, butyl cellosolve, butyl cellosolve acetate, methoxymethoxyethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, 3-methyl-3-methoxybutanol, etc.; and specific solvents, e.g., dimethyl sulfoxide, N,N-dimethylformamide. They are used alone or in combination. The concentration of the solid content in the composition for coating is preferably from 2 to 50 wt %.

Various coating methods are used in the present invention, e.g., roll coating, dip coating, air knife coating, gravure coating, gravure offset coating, hopper coating, blade coating, wire doctor coating, or spray coating. Dry coating weight is preferably from 0.3 to 4.0 g/m$^2$. As the coating amount reduces, the exposure amount for obtaining images can be saved but the film strength lowers. As the coating amount increases, the exposure amount increases but the photosensitive film comes to be strong, as a result, when the plate is used as a printing plate, a printing plate having high press life can be obtained.

The photosensitive resin composition coated on a support is generally dried by hot air. Heating temperature is from 30° C. to 200° C., particularly preferably from 40° C. to 140° C. Drying temperature may be maintained constant or may be increased stepwise.

The removal of moisture of drying air sometimes brings about good results. Drying air is preferably supplied to the coated surface at a rate of from 0.1 m/sec to 30 m/sec, particularly preferably from 0.5 m/sec to 20 m/sec.

Matting Layer

It is preferred to provide a matting layer on the thus-provided photosensitive layer surface for shortening the vacuum time at contact exposure using a vacuum printing frame and preventing halation. Specifically, providing methods of a matting layer as disclosed in JP-A-50-125805, JP-B-57-6582 and JP-B-61-28986, and a method of fusing solid particles by heat as disclosed in JP-B-62-62337 can be exemplified.

A support for use in a photosensitive lithographic printing plate is a plate having dimensional stability and supports so far been used as a support of lithographic printing plate can be preferably used. Examples of such supports include paper; paper laminated with plastics (e.g., polyethylene, polypropylene, polystyrene); metal plates, e.g., aluminum (including aluminum alloys), zinc, iron, and copper; plastic films, e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal; and paper or plastic films laminated or deposited with metals as above; and an aluminum plate is particularly preferably used. Aluminum plates include a pure aluminum plate and an aluminum alloy plate. Various aluminum alloys can be used, e.g., alloys of aluminum with metals such as silicon, copper, manganese, magnesium, chromium, zinc, lead, bismuth, or nickel. These compositions include a negligible amount of impurities in addition to a certain amount of iron and titanium.

A support is subjected to surface treatment, if necessary. For example, in the case of a photosensitive lithographic printing plate, the surface of the support is subjected to hydrophilization treatment.

In the case of a metal support, in particular, a support having an aluminum surface, it is preferred to perform surface treatment such as sanding treatment, immersion treatment in an aqueous solution of sodium silicate, potassium zirconium acid fluoride, phosphate, etc., or anodic oxidation treatment. Further, as disclosed in U.S. Pat. No. 2,714,066, an aluminum plate subjected to immersion treatment in an aqueous sodium silicate solution after sanding treatment, or an aluminum plate surface treated by immersion in an aqueous solution of alkali metal silicate after anodic oxidation treatment as disclosed in U.S. Pat. No. 3,181,461 are also preferably used. Anodic oxidation treatment is carried out by turning on electricity with the aluminum plate being the anode in an electrolytic solution comprising alone or combination of two or more of an aqueous solution or nonaqueous solution of an inorganic acid such as phosphoric acid, chromic acid, sulfuric acid, boric acid, etc., or an organic acid such as oxalic acid, sulfamic acid, etc., or salts of these.

Electrodeposition of silicate as disclosed in U.S. Pat. No. 3,658,662 is also useful.

These hydrophilization treatments are conducted for preventing harmful reactions of a support with a photosensitive resin composition provided on the support, or for improving the adhesion of the support with the photosensitive layer, in addition to making the support surface hydrophilic.

If needed, a treatment to remove rolling oil and a treatment to expose the clean surface may be effected prior to the sanding treatment. The former is conducted with a solvent such as trichlene and a surfactant and the latter is widely conducted with an alkali etching agent such as sodium hydroxide or potassium hydroxide.

As sanding methods, any of mechanical, chemical and electrochemical methods can be used. Mechanical methods include a ball abrading method, a blasting method, and a brushing method in which water dispersion slurry of an abrasive such as pumice or the like is rubbed on the surface of a plate with a nylon brush, as a chemical method, a method of immersion in a saturated aqueous solution of an aluminum salt of a mineral acid as disclosed in JP-A-54-31187 is preferred, and as an electrochemical method, a method of performing alternating current electrolysis in an acid electrolytic solution of hydrochloric acid, nitric acid or combination of these can be cited as a preferred method. Of these surface roughening methods, a method of combining mechanical roughening with electrochemical roughening as disclosed in JP-A-55-137993 is preferred because strong adhesion of a sensitized image to the support can be obtained.

Sanding as described above is preferably performed so as to reach the center line surface roughness (Ra) of the surface of an aluminum plate of from 0.3 to 1.0 μm.

The aluminum plate thus surface treated is washed and subjected to chemical etching, if necessary.

An etching solution is generally selected from among aqueous solutions of base or acid for dissolving aluminum.

In this case, an etching solution is selected such that a film different from the aluminum derived from the ingredient of the etching solution is not formed on the etched surface. Examples of preferred etching agent include, as basic substances, sodium hydroxide, potassium hydroxide, trisodium phosphate, disodium phosphate, tripotassium phosphate, and dipotassium phosphate; and as acid substances, sulfuric acid, persulfuric acid, phosphoric acid, hydrochloric acid and salts thereof. Salts of metals having a lower tendency to ionization than aluminum, e.g., zinc, chromium, cobalt, nickel, and copper are not preferred because an unnecessary film is formed on the etched surface.

The concentration and temperature of these etching agents are most preferably set up such that the solution rate of the aluminum or alloy to be used falls within the range of from 0.3 to 40 g/m$^2$ per immersion time of one hour, but lower than that or higher than that may be used.

Etching is performed by immersing an aluminum plate in an etching solution or coating the etching solution on the aluminum plate, and the etching is preferably carried out with the amount of the etching solution of from 0.5 to 10 g/m$^2$.

Since the etching speed is fast with the above etching agents, it is preferred to use a basic aqueous solution. In this case, as smutting is generated, desmutting treatment is generally conducted. As acids for use in desmutting treatment, nitric acid, sulfuric acid, phosphoric acid, chromic acid, hydrofluoric acid, borofluorohydroacid, etc., are used.

The etching-treated aluminum plate is washed and anodically oxidized, if necessary. Anodic oxidation can be effected by conventionally used methods in this field. Specifically, by applying a direct or alternating electric current to an aluminum plate in an aqueous solution or nonaqueous solution comprising single or combination of two or more of sulfuric acid, phosphoric acid, chromic acid, oxalic acid, sulfamic acid, or benzenesulfonic acid, an anodic oxidation film can be formed on the surface of the aluminum support.

Treatment conditions of anodic oxidation cannot be determined unconditionally as conditions fluctuate variously depending upon the electrolytic solution to be used, but generally appropriately the concentration of an electrolytic solution is from 1 to 80 wt %, temperature is from 5 to 70° C., electric current density is from 0.5 to 60 ampere/dm$^2$, voltage is from 1 to 100 V, and electrolytic time is from 30 seconds to 5 minutes.

Of these anodic oxidation treatments, the method of effecting anodic oxidation in sulfuric acid at high electric current density as disclosed in British Patent 1,412,768, and the method of effecting anodic oxidation with phosphoric acid being an electrolytic bath disclosed in U.S. Pat. No. 3,511,661 are particularly preferred.

The thus-roughened and further anodically oxidized aluminum plate may be hydrophilized, if necessary. As preferred examples thereof, there are methods of treatment with alkali metal silicate, e.g., an aqueous solution of sodium silicate as disclosed in U.S. Pat. Nos. 2,714,066 and 3,181,461, with potassium zirconium acid fluoride as disclosed in JP-B-36-22063, and with polyvinylsulfonic acid as disclosed in U.S. Pat. No. 4,153,461.

Organic Undercoating Layer

It is preferred that the photosensitive lithographic printing plate according to the present invention is provided with an organic undercoating layer before coating a photosensitive layer in view of reducing the photosensitive layer remaining on a non-image area. Organic compounds which are used in such an undercoating layer are selected from carboxymethyl cellulose, dextrin, gum arabic, organic phosphonic acid, e.g., phosphonic acids having an amino group, such as 2-aminoethylphosphonic acid, phenylphosphonic acid which may have a substituent, naphthylphosphonic acid, alkylphosphonic acid, glycerophosphonic acid, methylenediphosphonic acid, and ethylenediphosphonic acid, organic phosphoric acid, e.g., phenylphosphoric acid which may have a substituent, naphthylphosphoric acid, alkylphosphoric acid, and glycerophosphoric acid, organic phosphinic acid, e.g., phenylphosphinic acid which may have a substituent, naphthylphosphinic acid, alkylphosphinic acid, and glycerophosphinic acid, amino acids, e.g., glycine and β-alanine, and amine hydrochloride having a hydroxyl group such as triethanolamine hydrochloride. These compounds may be used in combination of two or more.

Further, at least one compound selected from among high molecular compounds having the structural unit represented by the following formula (F), such as poly (p-vinylbenzoic acid), in the molecule can be used in the present invention:

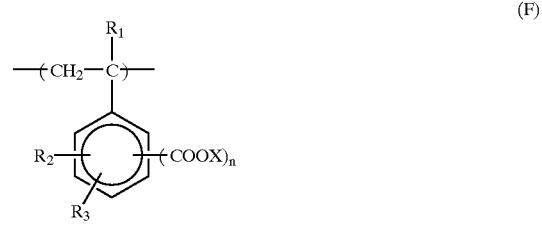

(F)

wherein $R_1$ represents a hydrogen atom, a halogen atom, or an alkyl group, preferably a hydrogen atom, a chlorine atom, or an alkyl group having from 1 to 4 carbon atoms, particularly preferably a hydrogen atom or a methyl group.

$R_2$ and $R_3$ each represents a hydrogen atom, a hydroxyl group, a halogen atom, an alkyl group, a substituted alkyl group, an aromatic group, a substituted aromatic group, —$OR_4$, —$COOR_5$, —$CONHR_6$, —$COR_7$, or —CN, or $R_2$ and $R_3$ may be bonded to form a ring, wherein $R_4$, $R_5$, $R_6$ and $R_7$ each represents an alkyl group or an aromatic group. $R_2$ and $R_3$ each more preferably represents a hydrogen atom, a hydroxyl group, a chlorine atom, an alkyl group having from 1 to 4 carbon atoms, a phenyl group, —$OR_4$, —$COOR_5$, —$CONHR_6$, —$COR_7$, or —CN, wherein $R_4$ to $R_7$ each represents an alkyl group having from 1 to 4 carbon atoms, or a phenyl group. $R_2$ and $R_3$ each particularly preferably represents a hydrogen atom, a hydroxyl group, a methyl group, or a methoxy group.

X represents a hydrogen atom, a metal atom, or $NR_8R_9R_{10}R_{11}$, where $R_8$, $R_9$, $R_{10}$ and $R_{11}$ each represents a hydrogen atom, an alkyl group, a substituted alkyl group, an aromatic group, or a substituted aromatic group, or $R_8$ and $R_9$, may be bonded to form a ring. X more preferably represents a hydrogen atom, a monovalent metal atom, or $NR_8R_9R_{10}R_{11}$, where $R_8$ to $R_{11}$ each represents a hydrogen atom, an alkyl group having from 1 to 4 carbon atoms, or a phenyl group. X particularly preferably represents a hydrogen atom, sodium, potassium, or $NR_8R_9R_{10}R_{11}$, wherein $R_8$ to $R_{11}$ each represents a hydrogen atom, a methyl group, or an ethyl group.

na represents an integer of from 1 to 3, preferably 1 or 2, and more preferably 1.

An organic undercoating layer can be provided by the following methods, that is, a solution obtained by dissolving the above-described organic compounds in water or a single or mixed organic solvent such as methanol, ethanol, methyl ethyl ketone, etc., is coated on an aluminum plate, and dried to provide an organic undercoating layer. Alternatively, an aluminum plate is immersed in a solution obtained by dissolving the above-described organic compounds in water or a single or mixed organic solvent such as methanol, ethanol, methyl ethyl ketone, etc., thereby the organic compounds are adsorbed onto the aluminum plate, the plate is washed with water or the like, and then dried to provide an organic undercoating layer. According to the former method, the solution containing the above organic compounds in concentration of from 0.005 to 10 wt % can be coated by various means. For example, any method of bar coating, rotating coating, spray coating and curtain coating may be used. In the latter method, the concentration of the solution is from 0.01 to 20 wt %, preferably from 0.05 to 5 wt %, immersion temperature is from 20 to 90° C., preferably from 25 to 50° C., and immersion time is from 0.1 second to 20 minutes, preferably from 2 seconds to 1 minute.

The pH of the solution is adjusted to 1 to 12 with basic substance, e.g., ammonia, triethylamine, or potassium hydroxide, or acidic substance, e.g., hydrochloric acid or phosphoric acid. A yellow dye can be added to the solution for improving tone reproducibility of the photosensitive lithographic printing plate.

Further, a compound represented by the following formula (a) can be added to this solution:

$$(HO)_m\text{—}R_1\text{—}(COOH)_n \quad (a)$$

wherein $R_1$ represents an arylene group having 14 or less carbon atoms, which may have a substituent; and m and n each represents an integer of from 1 to 3. Specific examples of compounds represented by formula (a) include 3-hydroxybenzoic acid, 4-hydroxybenzoic acid, salicylic acid, 1-hydroxy-2-naphthoic acid, 2-hydroxy-1-naphthoic acid, 2-hydroxy-3-naphthoic acid, 2,4-dihydroxybenzoic acid, and 10-hydroxy-9-anthracenecarboxylic acid.

The dry coating weight of the organic undercoating layer is generally from 2 to 200 mg/m$^2$, preferably from 5 to 100 mg/m$^2$. If the coating weight is less than 2 mg/m$^2$, sufficient press life cannot be obtained, while when it is more than 200 mg/m$^2$, press life similarly lowers.

Back Coating Layer

The back surface of the support is provided with a back coating layer, if necessary. Coating layers comprising a metal oxide obtained by hydrolyzing and polycondensing the organic high molecular compounds disclosed in JP-A-5-45885 and the organic or inorganic metal compounds disclosed in JP-A-6-35174 are preferably used as such a back coating layer.

Of these coating layers, alkoxyl compounds of silicon such as Si(OCH$_3$)$_4$, Si(OC$_2$H$_5$)$_4$, Si(OC$_3$H$_7$)$_4$, Si(OC$_4$H$_9$)$_4$ are inexpensive and easily available, and coating layers of the metal oxides obtained from these compounds are excellent in resistance against a developing solution and particularly preferred.

The thus-obtained lithographic printing plate is generally subjected to image exposure and development process.

As the light sources of actinic ray used for image exposure, e.g., a mercury lamp, a metal halide lamp, a xenon lamp, a chemical lamp, and a carbon arc lamp are used. Radial rays include electron beams, X-rays, ion beams, and far infrared rays. Further, g-rays, i-rays, Deep-UV rays, high density energy beams (laser beams) are also used. As laser beams, helium-neon laser, argon laser, krypton laser, helium-cadmium laser, and KrF exima laser can be cited. Further, in a direct imaging printing plate for laser, light sources having light emission wavelength at near infrared to infrared are preferred, and a solid state laser and a semiconductor laser are particularly preferred.

Developing solutions containing (a) at least one kind of sugar selected from nonreducing sugars, (b) at least one kind of base, and having pH of from 9.0 to 13.5 are preferably used as a developing solution for a lithographic printing plate using the photosensitive resin composition according to the present invention.

This developing solution is described in detail below. Unless otherwise indicated, a developing solution means a developing initiator (a developing solution in a narrow sense) and a developing replenisher.

This developing solution preferably comprises, as main components, at least one compound selected from nonreducing sugars and at least one base, and the pH of the solution is preferably within the range of from 9.0 to 13.5.

Such nonreducing sugars are sugars which do not have a free aldehyde group and a ketone group and do not show reducing property. They are classified to a trehalose type oligosaccharide in which reducing groups are bonded to each other, a glycoside in which reducing groups of sugars and nonsugars are bonded to each other, and a sugar alcohol obtained by the reduction by hydrogenation of sugars, and all of these nonreducing sugars can be preferably used. Trehalose type oligosaccharides include succharose and trehalose, glycosides include alkyl glycoside, phenol glycoside, and mustard oil glycoside, and sugar alcohols include D- and L-arabitol, ribitol, xylitol, D- and L-sorbitol, D- and L-mannitol, D- and L-iditol, D- and L-talitol, dulicitol, and allodulcitol. In addition, maltitol obtained by hydrogenation of disaccharide and the reductant (reduced starch syrup) obtained by hydrogenation of oligosaccharide are preferably used. Particularly preferred of these nonreducing sugars are sugar alcohols and succharose. Above all, D-sorbitol, succharose and reduced starch syrup are preferred for the reasons that they show buffer action in an appropriate pH range and inexpensive.

Such nonreducing sugars can be used alone or in combination of two or more, and the proportion of nonreducing sugars in the developing solution is preferably from 0.1 to 30 wt %, more preferably from 1 to 20 wt %. If the concentration is less than this range, sufficient buffer action cannot be obtained, while when the concentration is out of this range, high concentration of developing solutions is difficult to obtain and the problem of the production cost increase arises.

When reducing sugars are used in combination with bases, the system discolors to brown with the lapse of time and pH gradually decreases, which results in the reduction of developing property.

Alkali agents so far known can be used as a base to be used in combination with reducing sugars. Examples of such alkali agents include an inorganic alkali agent such as sodium hydroxide, potassium hydroxide, lithium hydroxide, trisodium phosphate, tripotassium phosphate, triammonium phosphate, disodiumphosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate, and ammonium borate. In addition to the above, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine are also used.

These alkali agents are used alone or in combination of two or more. Of these alkali agents, sodium hydroxide and potassium hydroxide are preferred for the reason that the pH adjustment in a wide pH range becomes possible by adjusting the amount of these alkali agents based on the nonreducing sugars. Further, trisodium phosphate, tripotassium phosphate, sodium carbonate, potassium carbonate are also preferred due to their own buffer action.

These alkali agents are added so as to reach the pH 9.0 to 13.5 of the developing solution, and the addition amount is determined depending upon the desired pH, the kind and the addition amount of the nonreducing sugars to be used. The preferred pH range is from 10.0 to 13.2.

An alkaline buffering solution comprising weak base and weak acid other than sugars can further be used in the developing solution in combination. Weak acids for use as such a buffering solution preferably have a dissociation constant (pKa) of from 10.0 to 13.2. Such weak acids are selected from the weak acids described, for example, in *Ionization Constants of Organic Acids in Aqueous Solution*, Pergamon Press Co. Examples of weak acids include alcohols, e.g., 2,2,3,3-tetrafluoropropanol-1 (pKa: 12.74), trifluoroethanol (pKa: 12.37), trichloroethanol (pKa: 12.24); aldehydes, e.g., pyridine-2-aldehyde (pKa: 12.68), pyridine-4-aldehyde (pKa: 12.05); compounds having a phenolic hydroxyl group, e.g., salicylic acid (pKa: 13.0), 3-hydroxy-2-naphthoic acid (pKa: 12.84), catechol (pKa: 12.6), gallic acid (pKa: 12.4), sulfosalicylic acid (pKa: 11.7), 3,4-dihydroxysulfonic acid (pKa: 12.2), 3,4-dihydroxybenzoic acid (pKa: 11.94), 1,2,4-trihydroxybenzene (pKa: 11.82), hydroquinone (pKa: 11.56), pyrogallol (pKa: 11.34), o-cresol (pKa: 10.33), resorcinol (pKa: 11.27), p-cresol (pKa: 10.27), m-cresol (pKa: 10.09); oximes, e.g., 2-butanoneoxime (pKa: 12.45), acetoxime (pKa: 12.42), 1,2-cycloheptanedionedioxime (pKa: 12.3), 2-hydroxybenzaldehydeoxime (pKa: 12.10), dimethylglyoxime (pKa: 11.9), ethanediamidodioxime (pKa: 11.37), acetophenoneoxime (pKa: 11.35); nucleic acid-relating substances, e.g., adenosine (pKa: 12.56), inosine (pKa: 12.5), guanine (pKa: 12.3), cytosine (pKa: 12.2), hypoxanthine (pKa: 12.1), xanthine (pKa: 11.9); diethylaminomethylsulfonic acid (pKa: 12.32), 1-amino-3,3,3-trifluorobenzoic acid (pKa: 12.29), isopropylidenedisulfonic acid (pKa: 12.10), 1,1-ethylidenediphosphonic acid (pKa: 11.54), 1,1-ethylidenediphosphonic acid-1-hydroxy (pKa: 11.52), benzimidazole (pKa: 12.86), thiobenzamide (pKa: 12.8), picolinethioamide (pKa: 12.55), and barbituric acid (pKa: 12.5).

Of these weak acids, sulfosalicylic acid and salicylic acid are preferred.

Sodium hydroxide, ammonium hydroxide, potassium hydroxide, and lithium hydroxide are preferably used as a base to be used in combination with a weak acid.

These alkali agents are used alone or in combination of two or more.

These alkali agents are used with adjusting pH in a desired range by the concentration and combination.

Various surfactants can be added to the developing solution according to necessity with a view to accelerating development, dispersing developer scum, and increasing the affinity to ink of the image area of a printing plate. As preferred surfactants, anionic, cationic, nonionic, and ampholytic surfactants can be exemplified.

Preferred examples of surfactants include nonionic surfactants, e.g., polyoxyethylenealkyl ethers, polyoxyethylenealkylphenyl ethers, polyoxyethylenepolystyrylphenyl ethers, polyoxyethylenepolyoxypropylenealkyl ethers, glycerol fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylenealkylamine, triethanolamine fatty acid ester, and trialkylamine oxide; fatty acid salts, abietates, hydroxyalkanesulfonates, alkanesulfonates, dialkylsulfosuccinates, straight chain alkylbenzenesulfonates, branched chain alkylbenzenesulfonates, alkylnaphthalenesulfonates, alkylphenoxypolyoxyethylenepropylsulfonates, polyoxyethylenealkylsulfophenyl ethers, N-methyl-N-oleyltaurine sodium salt, N-alkylsulfosuccinate monoamido disodium salt, petroleum sulfonates, sulfated tallow, fatty acid alkyl ester sulfates, alkylsulfates, polyoxyethylenealkyl ether sulfates, fatty acid monoglyceride sulfates, polyoxyethylenealkylphenyl ether sulfates, polyoxyethylenestyrylphenyl ether sulfates, alkylphosphates, polyoxyethylenealkyl ether phosphates, polyoxyethylenealkylphenyl ether phosphates, partially saponified products of styrene/maleic anhydride copolymers, anionic surfactants, e.g., condensation products of naphthalenesulfonate/formaldehyde, alkylamines, tertiary ammonium salts, e.g., tetrabutylammonium bromide, cationic surfactants, e.g., polyoxyethylenealkylamines, polyethylenepolyamine derivatives, ampholytic surfactants, e.g., carboxybetaines, aminocarboxylic acids, sulfobetaines, aminosulfates, and imidazolines. Of the above surfactants, "polyoxyethylene" can include polyoxyalkylene such as polyoxymethylene, polyoxypropylene, polyoxybutylene, therefore, surfactants thereof are also included.

More preferred surfactants are surfactants which include a perfluoroalkyl group in the molecule. Examples of such surfactants include an anionic type, e.g., perfluoroalkylcarboxylate, perfluoroalkylsulfonates, perfluoroalkylphosphates, an ampholytic type, e.g., perfluoroalkylbetaine, a cationic type, e.g., perfluoroalkyltrimethylammonium salt, and a nonionic type, e.g., perfluoroalkylamine oxide, perfluoroalkylethylene oxide adducts, oligomers containing a perfluoroalkyl group and a hydrophilic group, oligomers containing a perfluoroalkyl group and a lipophilic group, oligomers containing a perfluoroalkyl group, a hydrophilic group, and a lipophilic group, and urethane containing a perfluoroalkyl group and a lipophilic group.

These surfactants can be used alone or in combination of two or more, and they are added to a developing solution in the range of preferably from 0.001 to 10 wt %, more preferably from 0.01 to 5 wt %.

Various development stabilizers can be used in a developing solution. Polyethylene adducts of sugar alcohols disclosed in JP-A-6-282079, tetraalkylammonium salts such as tetrabutylammonium hydroxide, phosphonium salts such as tetrabutylphosphonium bromide, and iodonium salts such as diphenyliodonium chloride are exemplified as preferred examples of such development stabilizers.

Further, anionic surfactants and ampholytic surfactants disclosed in JP-A-50-51324, water-soluble cathionic polymers disclosed in JP-A-55-95946, water-soluble ampholytic high molecular electrolyte disclosed in JP-A-56-142528 can also be exemplified.

Further, organic boron compounds added with alkylene glycol disclosed in JP-A-59-84241, polyoxyethylene/polyoxypropylene block polymer type water-soluble surfactants disclosed in JP-A-60-111246, alkylenediamine compounds substituted with polyoxyethylene/polyoxypropylene disclosed in JP-A-60-129750, polyethylene glycol having a weight average molecular weight of 300 or more disclosed in JP-A-61-215554, fluorine-containing surfactants having a cationic group disclosed in JP-A-63-175858, and water-soluble ethylene oxide addition compounds obtained by adding 4 mols or more of ethylene oxide to alcohol, water-soluble polyalkylene compounds disclosed in JP-A-2-39157 can be exemplified.

Further, an organic solvent can be added to a developing solution, if necessary. Such an organic solvent has solubility in water of 10 wt % or less, preferably 5 wt % or less, e.g., 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine, and N-phenyldiethanolamine can be exemplified. The content of the organic solvent is from 0.1 to 5 wt % based on the total weight of the working solution. The use amount of the organic solvent is intimately related with the use amount of the surfactant. It is preferred to increase the amount of the surfactant as the amount of the organic solvent increases. This is because if the amount of the surfactant is small and the amount of the organic solvent is large, the organic solvent does not dissolve completely, therefore, good developing property cannot be ensured.

Moreover, a reducing agent can be added to a developing solution. A reducing agent is added in order to prevent a printing plate from being contaminated and it is particularly effective when a negative type lithographic printing plate containing a photosensitive diazonium salt compound is developed. As preferred organic reducing agents, phenol compounds, e.g., thiosalicylic acid, hydroquinone, metol, methoxyquinone, resorcin, and 2-methylresorcin, and amine compounds, e.g., phenylenediamine and phenylhydrazine can be exemplified. Examples of more preferred inorganic reducing agents include sodium salt, potassium salt, and ammonium salt of inorganic acid such as sulfurous acid, sulfurous acid hydroacid, phosphorous acid, phosphorous acid hydroacid, phosphorous acid secondary hydroacid, thiosulfuric acid, and dithionic acid. Of these reducing agents, sulfite is particularly excellent in contamination preventing effect. The amount of these reducing agents are from 0.05 to 5 wt % based on the developing solution.

Further, a developing agent can contain organic carboxylic acid. Preferred organic carboxylic acids are aliphatic and aromatic carboxylic acids having from 6 to 20 carbon atoms. Specific examples of aliphatic carboxylic acids include caproic acid, enanthylic acid, caprylic acid, lauric acid, myristic acid, palmitic acid, and stearic acid, and particularly preferred organic carboxylic acid is alkanoic acid having from 8 to 12 carbon atoms. Further, unsaturated fatty acids having a double bond in carbon chain can be used or carbon chain may be branched.

Examples of aromatic carboxylic acids include compounds in which a benzene ring, naphthalene ring, or anthracene ring is substituted with a carboxylic group, specifically o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, and 2-naphthoic acid, and hydroxynaphthoic acid is particularly effectively used.

It is preferred to use these aliphatic and aromatic carboxylic acids as sodium salt, potassium salt or ammonium salt for heightening water solubility. The content of carboxylic acids for use in a developing solution is not particularly limited, but when it is lower than 0.1 wt %, sufficient effect cannot be obtained, while when it is more than 10 wt %, not only further effect cannot be obtained but the solubility of other additives is hindered. Accordingly, a preferred content is from 0.1 to 10 wt %, more preferably from 0.5 to 4 wt %, based on the working developing solution.

Further, if necessary, a developing solution can contain antiseptics, coloring agents, thickeners, defoaming agents, and water softeners. Examples of water softeners include polyphosphoric acid and sodium salt, potassium salt and ammonium salt thereof, aminopolycarboxylic acid and sodium salt, potassium salt and ammonium salt thereof, e.g., ethylenediaminetetraacetic acid, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid, and 1,3-diamino-2-propanoltetraacetic acid, aminotri(methylenephosphonic acid), ethylenediaminetetra(methylenephosphonic acid), diethylenetriaminepenta(methylenephosphonic acid), triethylenetetraminehexa(methylenephosphonic acid), hydroxyethylethylenediaminetri(methylenephosphonic acid), and 1-hydroxyethane-1,1-diphosphonic acid and sodium salt, potassium salt and ammonium salt thereof.

The optimal value of water softeners varies according to chelation, the hardness and amount of the hard water to be used but is generally from 0.01 to 5 wt %, more preferably from 0.01 to 0.5 wt %, based on the working developing solution. If the addition amount is less than this range, the expected effect cannot be obtained sufficiently, and if the amount is more than this range, adverse effects on the image area comes to appear, such as color missing.

The remainder of the component of a developing solution is water. From the viewpoint of conveyance, it is convenient to prepare a developing solution in concentration to dilute with water at use. The concentration is preferably such that each component does not separate or precipitate.

The developing solution disclosed in JP-A-6-282079 can also be used as the developing solution of the lithographic printing plate using the photosensitive resin composition according to the present invention. This is a developing solution containing silicic acid alkali metal salt having an $SiO_2/M_2O$ (M represents alkali metal) molar ratio of from 0.5 to 2.0, and a water-soluble ethylene oxide adduct obtained by adding 5 mols or more ethylene oxide to a sugar alcohol having 4 or more hydroxyl groups. The sugar alcohol is a polyhydric alcohol corresponding to the alcohol in which the aldehyde group and the ketone group of the sugar are reduced to make a primary alcohol and a secondary alcohol. Specific examples of sugar alcohols include D- and L-threitol, erythritol, D- and L-arabitol, ribitol, xylitol, D- and L-sorbitol, D- and L-mannitol, D- and L-iditol, D- and L-talitol, dulicitol, and allodulcitol. Further, di-, tri-, tetra-, penta- and hexaglycerol which are condensation products of sugar alcohol can be exemplified. The aforesaid water-soluble ethylene oxide adduct can be obtained by adding 5 mols or more ethylene oxide to 1 mol of sugar alcohol. Further, if necessary, an ethylene oxide adduct may be block copolymerized with a propylene oxide within such a range as the solubility is not hindered. These ethylene oxide adducts may be used alone or in combination of two or more.

The addition amount of water-soluble ethylene oxide adduct is preferably from 0.001 to 5 wt %, more preferably from 0.001 to 2 wt %, based on the developing solution (working solution).

Various surfactants can be added to the developing solution according to necessity with a view to accelerating development, dispersing developer scum, and increasing the affinity to ink of the image area of a printing plate.

The PS plate development treated with the developing solution having the above composition is post-treated with a washing water, a rinsing water containing surfactants, a finisher or a protective mucilage containing gum arabic and starch derivatives as main components. In the post-treatment of the PS plate according to the present invention, these treatments are used in various combinations.

In recent years, an automatic processor for a PS plate is used prevailingly in the plate-making/printing industry for the purpose of rationalization and standardization of plate-making work. Such an automatic processor generally consists of a development part and a post-treatment part and equipped with a conveying unit of a PS plate, processing solution tanks, and spraying unit. Development and post-treatment are effected by spraying each processing solution pumped up to the PS plate by means of a spray nozzle while conveying the exposed PS plate horizontally. A method of development processing a PS plate while conveying with the PS plate being immersed in a processing solution tank filled with a processing solution by means of guide rolls in the solution, and a method of washing the plate surface after development by supplying a certain small amount of a washing water and reusing the waste solution as a diluent solution of a concentrated developing solution are also known.

In such automatic processing, processing can be carried out with replenishing each replenisher to each processing solution corresponding to the processing amount, the operating time, etc. Moreover, a nonreturnable system in which processing is carried out with substantially a virgin solution is also applicable.

A lithographic printing plate obtained through these processes is loaded on an offset printing machine for use for printing of a lot of sheets.

The second fluorine-containing polymer is described below.

Vinyl monomers represented by formulae (1b), (2b) and (3b) which are characteristics of the present invention are described in detail below.

A fluoro aliphatic group-containing vinyl monomer represented by formula (1b) is described below.

$$CH_2=CAb[COO—Rb'—Rfb] \quad (1b)$$

wherein Ab represents a hydrogen atom or a methyl group; Rb' represents a single bond, $—(CH_2)_{mb}—$, $—(CH_2)_{mb}NRB''SO_2—$, or $—(CH_2)_{mb}NRB''CO—$; mb represents an integer of from 1 to 4; RB" represents a hydrogen atom or an alkyl group; and Rfb represents $C_{nb}F_{2n+1}$; and nb represents an integer of 3 or more.

Rb" preferably represents a hydrogen atom, or an alkyl group having from 1 to 20 carbon atoms (e.g., methyl, ethyl, propyl, isopropyl); and nb preferably represents an integer of from 3 to 20.

Specific examples of preferred Compounds (1b-1) to (1b-8) represented by formula (1b) are shown below but the present invention is not restricted thereto.

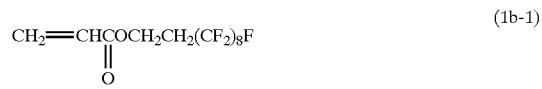

(1b-1)

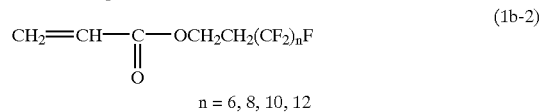

(1b-2)

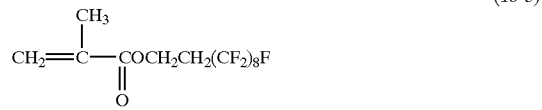

(1b-3)

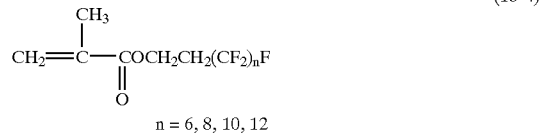

(1b-4)

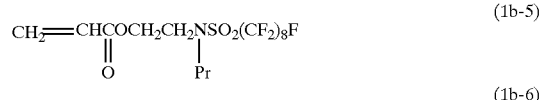

(1b-5)

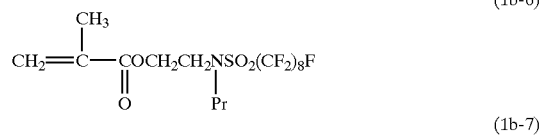

(1b-6)

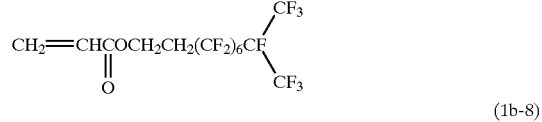

(1b-7)

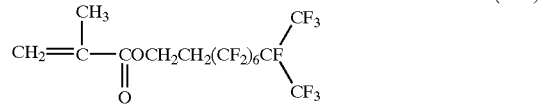

(1b-8)

The content of these fluoro aliphatic group-containing vinyl monomers which are used in the second fluorine-containing polymer according to the present invention is from 3 to 70 wt %, preferably from 7 to 40 wt %, based on the weight of the polymer.

An acidic hydrogen-containing vinyl monomer represented by the following formula (2b) is described below.

$$CH_2=CAb[CO—Wb—R_{1b}—SO_2NH—R_{2b}] \quad (2b)$$

wherein Ab represents a hydrogen atom or a methyl group; Wb represents an oxygen atom or $—NR_{3b}—$; $R_{3b}$ represents a hydrogen atom, an alkyl group, or an aryl group; $R_{1b}$ represents an alkylene group which may have a substituent or an arylene group which may have a substituent; and $R_{2b}$ represents a hydrogen atom, an alkyl group, or an aryl group.

As preferred range of the monomer represented by formula (2b), $R_{1b}$ represents an alkylene group having from 1 to 12 carbon atoms, which may have a substituent, or an arylene group having from 6 to 20 carbon atoms, which may have a substituent; $R_{2b}$ represents a hydrogen atom, an alkyl group having from 1 to 20 carbon atoms, or an aryl group having from 6 to 20 carbon atoms; and $R_{3b}$ represents a hydrogen atom, an alkyl group having from 1 to 20 carbon atoms, or an aryl group having from 6 to 20 carbon atoms.

In formula (2b), preferred alkylene groups represented by $R_{1b}$ are an alkylene group having from 1 to 20 carbon atoms, e.g., methylene, ethylene, and isopropylene; and preferred arylene groups represented by $R_{1b}$ are an arylene group having from 6 to 18 carbon atoms, e.g., phenylene and naphthylene.

The aryl group and the alkyl group represented by $R_{2b}$ may have a substituent, and examples of the substituents include a halogen atom (e.g., fluorine, chlorine, bromine), an alkoxyl group (e.g., methoxy, ethoxy), an aryloxy group (e.g., phenoxy), a cyano group, an amino group (e.g., acetamido), an alkoxycarbonyl group (e.g., ethoxycarbonyl), an alkyl group having from 1 to 20 carbon atoms, and an aryl group having from 6 to 18 carbon atoms.

Specific examples of preferred Compounds (2b-1) to (2b-10) represented by formula (2b) are shown below but the present invention is not restricted thereto.

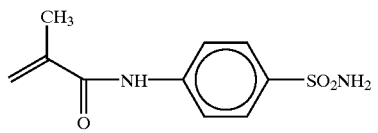
(2b-1)

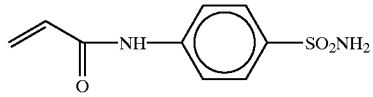
(2b-2)

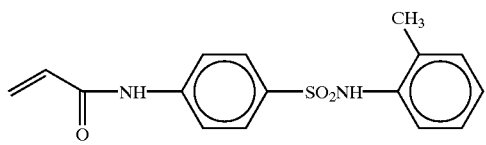
(2b-3)

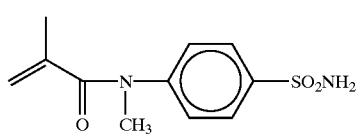
(2b-4)

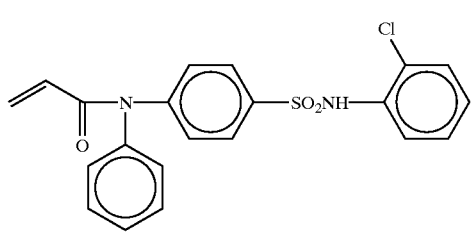
(2b-5)

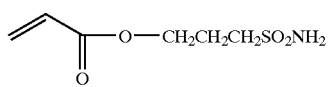
(2b-6)

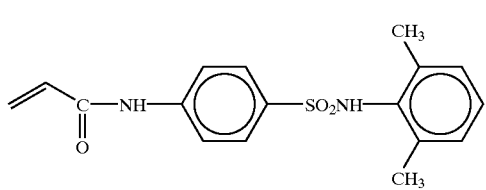
(2b-7)

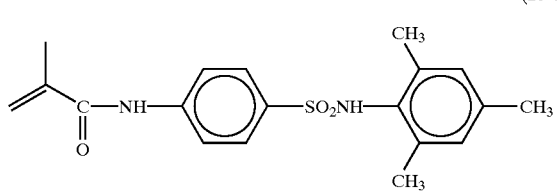
(2b-8)

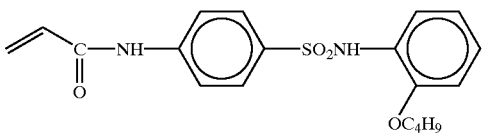
(2b-9)

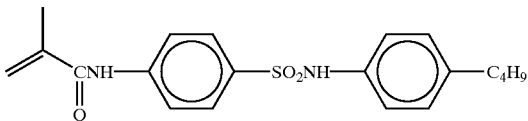
(2b-10)

The content of these acidic group-containing vinyl monomers of formula (2) which are used in the second fluorine-containing polymer according to the present invention is from 5 to 70 wt %, preferably from 10 to 50 wt %, based on the weight of the polymer.

A vinyl monomer represented by the following formula (3b) is described below.

$$CH_2=CAb[CO-Wb-R_{5b}] \tag{3b}$$

wherein Ab represents a hydrogen atom or a methyl group; Wb represents an oxygen atom or $-NR_{3b}-$; $R_{3b}$ represents a hydrogen atom, an alkyl group, or an aryl group; and $R_{5b}$ represents an aliphatic group having 9 or more carbon atoms, or an aromatic group substituted with an aliphatic group having 2 or more carbon atoms.

As preferred range of the monomer represented by formula (3b), Wb represents an oxygen atom or $-NR_{3b}-$; $R_{3b}$ represents a hydrogen atom, an alkyl group having from 1 to 20 carbon atoms, or an aryl group having from 6 to 20 carbon atoms; and $R_{5b}$ represents an aliphatic group having 9 or more carbon atoms, or an aromatic group substituted with an aliphatic group having 2 or more carbon atoms. As specific examples of the monomers, the following monomers can be exemplified.

For example, nonyl acrylate, decyl acrylate, lauryl acrylate, stearyl acrylate, behenyl acrylate, diethylbenzyl acrylate, ethylbenzyl acrylate, n-propylbenzyl acrylate, isopropylbenzyl acrylate, n-butylbenzyl acrylate, isobutylbenzyl acrylate, tert-butylbenzyl acrylate, ethylphenyl acrylate, n-propylphenyl acrylate, isopropylphenyl acrylate, n-butylphenyl acrylate, isobutylphenyl acrylate, and tert-butylphenyl acrylate. Preferred of these are lauryl acrylate, stearyl acrylate, behenyl acrylate, tert-butylbenzyl acrylate, and tert-butylphenyl acrylate.

Further, methacrylic esters can be cited, e.g., nonyl methacrylate, decyl methacrylate, lauryl methacrylate, stearyl methacrylate, behenyl methacrylate, diethylbenzyl methacrylate, ethylbenzyl methacrylate, n-prop ylbenzyl methacrylate, isopropylbenzyl methacrylate, n-butylbenzyl methacrylate, isobutylbenzyl methacrylate, tert-butylbenzyl methacrylate, ethylphenyl methacrylate, n-propylphenyl methacrylate, isopropylphenyl methacrylate, n-butylphenyl methacrylate, isobutylphenyl methacrylate, and tert-butylphenyl methacrylate. Preferred of these are lauryl methacrylate, stearyl methacrylate, behenyl methacrylate, tert-butylbenzyl methacrylate, and tert-butylphenyl methacrylate.

Further, the following acrylamides and methacrylamides can also be exemplified: N-nonylacrylamide, N-decylacrylamide, N-laurylacrylamide, N-stearylacrylamide, N-nonylmethacrylamide, N-decylmethacrylamide, N-laurylmethacrylamide, and N-stearylmethacrylamide.

Further, of the acrylate, methacrylate, acrylamide or methacrylamide having an aliphatic group having 9 or more carbon atoms, or an aromatic group substituted with an aliphatic group having 2 or more carbon atoms, more preferred monomer is acrylate, methacrylate, acrylamide or methacrylamide having an aliphatic group having 12 or more carbon atoms.

The content of the vinyl monomers of formula (3b) for use in the second fluorine-containing polymer of the present invention is from 5 to 80 wt %, preferably from 10 to 70 wt %, based on the weight of the second fluorine-containing polymer.

Further, as examples of other addition polymerizable unsaturated compounds which are used according to cases, those described in J. Brandrup, *Polymer Handbook*, 2nd Ed., Chap. 2, pp. 1–483, Wiley Interscience (1975) can be used.

The second fluorine-containing polymer of the present invention can be manufactured by conventionally well-known methods. For example, the second fluorine-containing polymer can be produced by adding a widely used radical polymerization initiator to (meth)acrylate having a fluoro aliphatic group, (meth)acrylate having an aliphatic group or an aromatic group, and a vinyl monomer containing an acidic group in which an acidic hydrogen atom is bonded to a nitrogen atom in an organic solvent and bringing about thermal polymerization, alternatively, in some cases, by adding other addition polymerizable unsaturated compounds and in the same manner as above.

Specific examples of the structures of the second fluorine-containing polymer according to the present invention (Pb-1) to (Pb-8) are shown below. Numerals in formulae indicate the molar ratio of each monomer component.

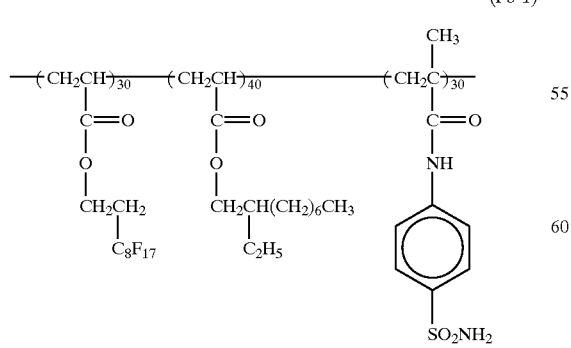
(Pb-1)

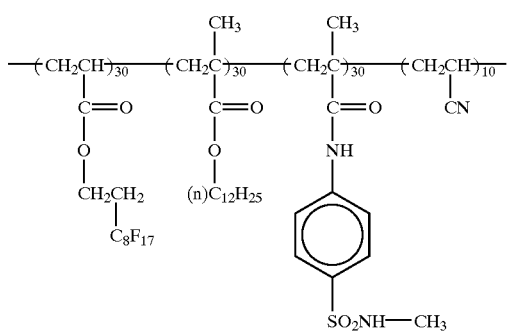
(Pb-2)

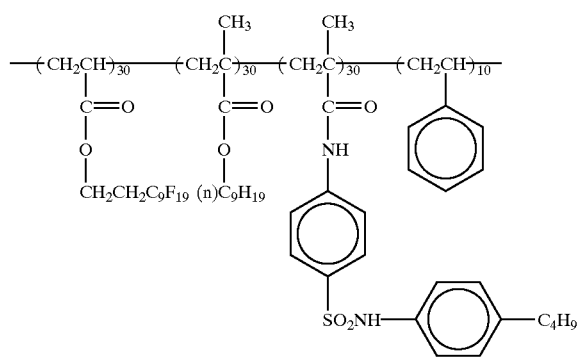
(Pb-3)

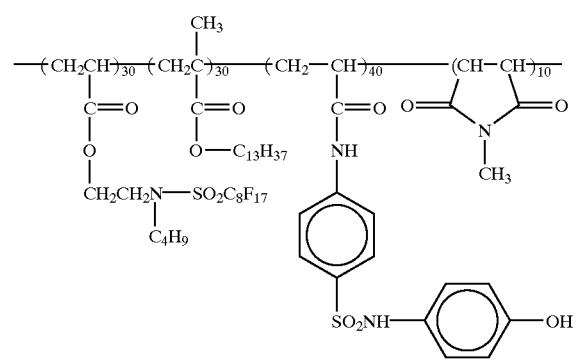
(Pb-4)

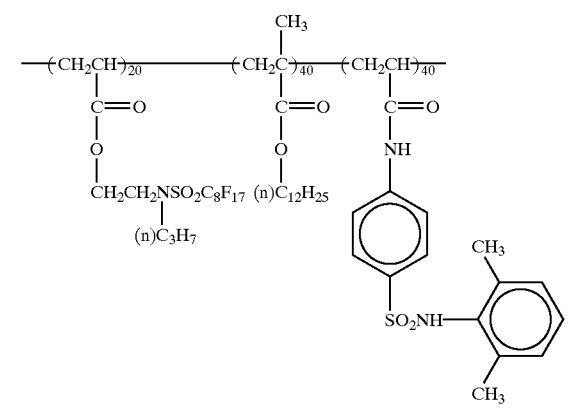
(Pb-5)

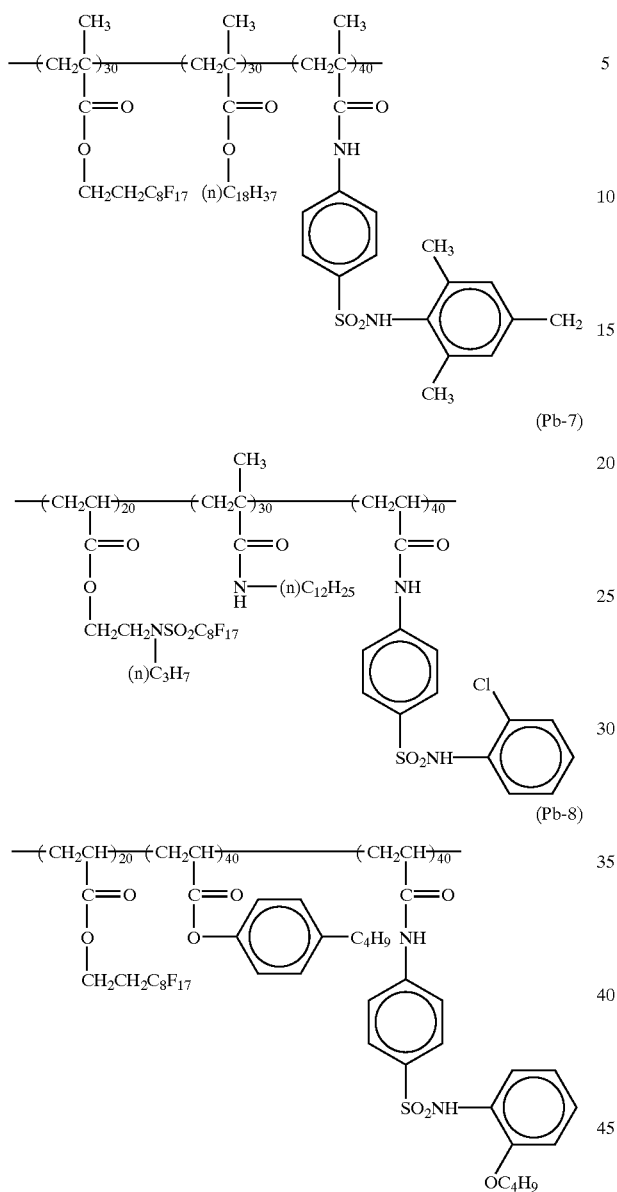

which is decomposed by an acid) and a photo-acid generator (a compound which generates an acid with irradiation of radiation) can be used.

Of the compounds which generate an acid by irradiation of actinic ray or radiation, particularly useful compounds are described below.

(1) The oxazole derivative represented by the following formula (PAG1) substituted with a trihalomethyl group and the S-triazine derivative represented by formula (PAG2):

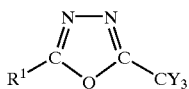

(PAG1)

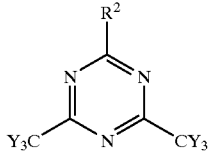

(PAG2)

wherein $R^1$ represents a substituted or unsubstituted aryl group, or an alkenyl group; $R^2$ represents a substituted or unsubstituted aryl group, an alkenyl group, an alkyl group, or —$CY_3$; and Y represents a chlorine atom or a bromine atom.

Specifically, the following compounds can be exemplified but the present invention is not limited thereto.

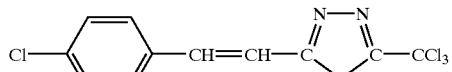

(PAG1-1)

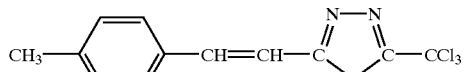

(PAG1-2)

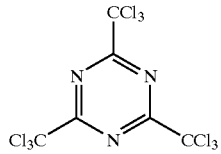

(PAG2-1)

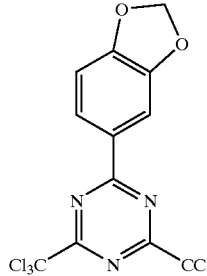

(PAG2-3)

The second fluorine-containing polymer for use in the present invention has an average molecular weight of from 3,000 to 200,000, more preferably from 6,000 to 100,000.

Other components necessary in the production of the positive type photosensitive resin composition according to the present invention are described below.

In the second photosensitive composition according to the present invention, the aforesaid o-quinonediazide compound is an essential photosensitive component in addition to a high molecular compound having the constitutional components represented by formulae (1b), (2b) and (3b) as copolymer components.

As photosensitive compounds other than o-quinonediazide compound, chemical amplification series photosensitive substances comprising the combination of a compound in which an alkali-soluble group is protected with an acid decomposable group (a group having the nature -continued

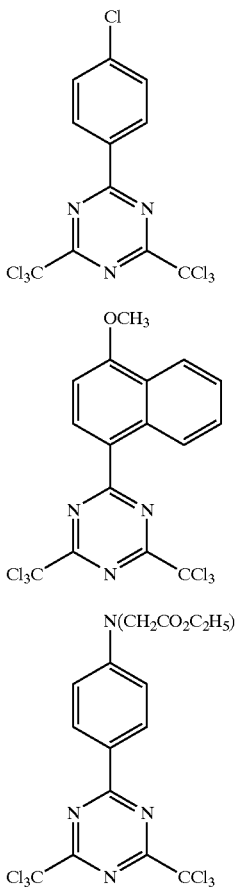
(PAG2-2)

(PAG2-4)

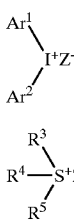
(PAG2-5)

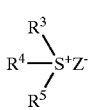

(2) The iodonium salt represented by the following formula (PAG3), and the sulfonium salt or diazonium salt represented by formula (PAG4)

$$Ar^1{\underset{Ar^2}{\overset{}{\diagup}}}I^+Z^-$$ (PAG3)

$$R^4-\underset{R^5}{\overset{R^3}{|}}S^+Z^-$$ (PAG4)

wherein $Ar^1$ and $Ar^2$ each represents a substituted or unsubstituted aryl group. As preferred substituents, an alkyl group, a haloalkyl group, a cycloalkyl group, an aryl group, an alkoxyl group, a nitro group, a carboxyl group, an alkoxycarbonyl group, a hydroxyl group, a mercapto group and a halogen atom can be exemplified.

$R^3$, $R^4$ and $R^5$ each represents a substituted or unsubstituted alkyl group or an aryl group, preferably an aryl group having from 6 to 14 carbon atoms, an alkyl group having from 1 to 8 carbon atoms, and substitution derivatives thereof. Preferred substituents of the aryl group include an alkoxyl group having from 1 to 8 carbon atoms, an alkyl group having from 1 to 8 carbon atoms, a nitro group, a carboxyl group, a hydroxyl group and a halogen atom. Preferred substituents of the alkyl group include an alkoxyl group having from 1 to 8 carbon atoms, a carboxyl group, and an alkoxycarbonyl group.

$Z^-$ represents a counter anion. For example, $BF_4^-$, $AsF_6^-$, $PF_6^-$, $SbF_6^-$, $SiF_6^-$, $ClO_4^-$, perfluoroalkanesulfonic acid anion such as $CF_3SO_3^-$, pentafluorobenzenesulfonic acid anion, bonding polynuclear aromatic sulfonic acid anion, e.g., naphthalene-1-sulfonic acid anion, anthraquinonesulfonic acid anion, and sulfonic acid group-containing dyes can be exemplified, but the present invention is not limited thereto.

Further, two of $R^3$, $R^4$ and $R^5$ and two of $AR^1$ and $Ar^2$ each may be bonded via a single bond or a substituent.

Specific examples are shown below but the present invention is not limited thereto.

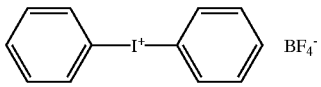
(PAG3-1)

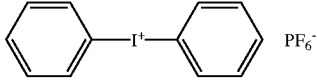
(PAG3-2)

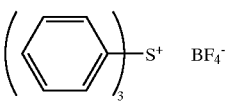
(PAG4-1)

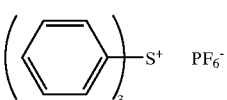
(PAG4-2)

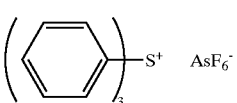
(PAG4-3)

Onium salts represented by formulae (PAG3) and (PAG4) are well known and can be synthesized according to the methods described, for example, in W. Knapczyk et al., *J. Am. Chem. Soc.*, 91, 145 (1969), A. L. Maycok et al., *J. Org. Chem.*, 35, 2532 (1970), B. Goethas et al., *Bull. Soc. Chem. Belg.*, 73, 546 (1964), H. M. Leicester, *J. Ame. Chem. Soc.*, 51, 358 (1929), J. V. Crivello et al., *J. Polym. Chem. Ed.*, 18, 2677 (1980), U.S. Pat. Nos. 2,807,648 and 4,247,473, JP-A-53-101331.

(3) The disulfone derivative represented by formula (PAG5) and the iminosulfonate derivative represented by formula (PAG6)

$$Ar^3-SO_2-SO_2-Ar^4$$ (PAG5)

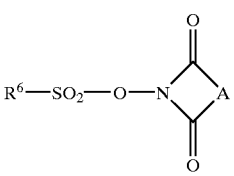
(PAG6)

wherein $Ar^3$ and $Ar^4$ each represents a substituted or unsubstituted aryl group; $R^6$ represents a substituted or unsubstituted alkyl group, or aryl group; A represents a substituted or unsubstituted alkylene group, alkenylene group or arylene group.

Specific examples are shown below but the present invention is not limited thereto.

(PAG5-1)
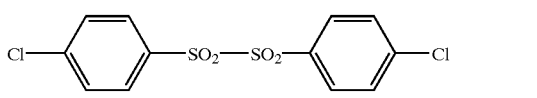

(PAG5-2)
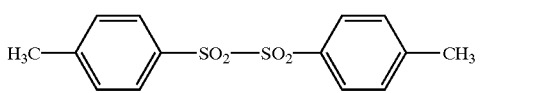

(PAG6-1)
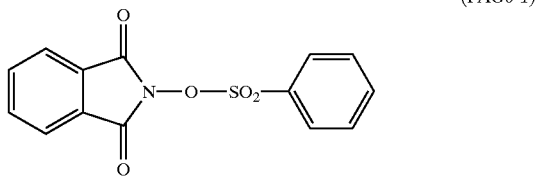

(PAG6-2)
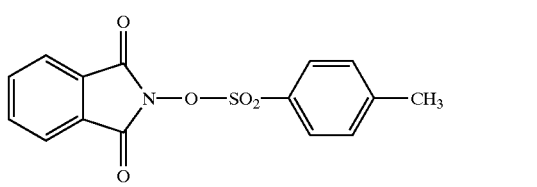

The addition amount of these compounds capable of being decomposed by irradiation of actinic ray or radiation to generate an acid is generally from 0.001 to 40 wt %, preferably from 0.01 to 20 wt %, and more preferably from 0.1 to 5 wt %, based on the total weight (excluding the solvent) of the photosensitive composition.

The content of these photo-acid generators is generally from 0.1 to 30 wt %, preferably from 1 to 10 wt %, based on the entire solid content of the photosensitive composition.

Further, the following yellow dyes can be added to the photosensitive composition of the present invention. Yellow dye the light absorption of which at 417 nm is 70% or more of that at 436 nm is represented by formula (I), (II) or (III):

[I]
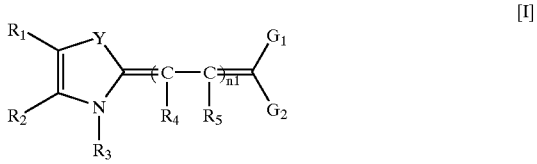

wherein $R_1$ and $R_2$ each represents a hydrogen atom, an alkyl group, an aryl group or an alkenyl group, which has from 1 to 10 carbon atoms, and $R_1$ and $R_2$ may form a ring; $R_3$, $R_4$ and $R_5$ each represents a hydrogen atom or an alkyl group having from 1 to 10 carbon atoms; $G_1$ and $G_2$ each represents an alkoxycarbonyl group, an aryloxycarbonyl group, an acyl group, an arylcarbonyl group, an alkylthio group, an arylthio group, an alkylsulfonyl group, an arylsulfonyl group, or a fluoroalkylsulfonyl group, and $G_1$ and $G_2$ may form a ring; at least one of $R_1$, $R_2$, $R_3$, $R_4$, $R_5$, $G_1$ and $G_2$ has one or more of a sulfonic acid group, a carboxyl group, a sulfonamido group, an imido group, an N-sulfonylamido group, a phenolic hydroxyl group, a sulfonimido group, or metal salts of them, and an inorganic or organic ammonium salt; Y represents a divalent atomic group selected from the group consisting of O, S, NR (wherein R represents a hydrogen atom, an alkyl group, or an aryl group), Se, —C(CH$_3$)$_2$—, —CH=CH—; and $n_1$ represents 0 or 1.

(II)
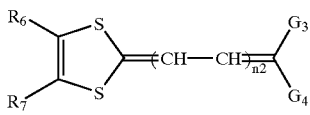

wherein $R_6$ and $R_7$ each represents a hydrogen atom, a substituted or unsubstituted alkyl group, a substituted or unsubstituted aryl group, a substituted or unsubstituted heterocyclic group, a substituted or unsubstituted allyl group, and $R_6$ and $R_7$ may form a ring together with the carbon atoms to which they are bonded; $n_2$ represents 0, 1 or 2; and $G_3$ and $G_4$ each represents a hydrogen atom, a cyano group, a substituted or unsubstituted alkoxycarbonyl group, a substituted or unsubstituted aryloxycarbonyl group, a substituted or unsubstituted acyl group, a substituted or unsubstituted arylcarbonyl group, an alkylthio group, an arylthio group, an alkylsulfonyl group, an arylsulfonyl group, or a fluoroalkylsulfonyl group, provided that $G_3$ and $G_4$ do not represent a hydrogen atom at the same time, $G_3$ and $G_4$ may form a nonmetallic atom ring together with the carbon atom to which they are bonded, further, at least one of $R_6$, $R_7$, $G_3$ and $G_4$ has one or more of a sulfonic acid group, a carboxyl group, a sulfonamido group, an imido group, an N-sulfonylamido group, a phenolic hydroxyl group, a sulfonimido group, or metal salts of them, and an inorganic or organic ammonium salt.

(III)
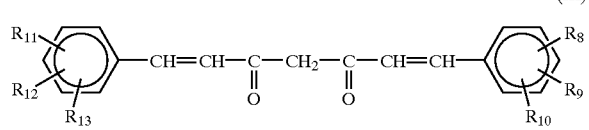

wherein $R_8$, $R_9$, $R_{10}$, $R_{11}$, $R_{12}$ and $R_{13}$, which may be the same or different, each represents a hydrogen atom, a substituted or unsubstituted alkyl group, a substituted or unsubstituted aryl group, an alkoxyl group, a hydroxyl group, an acyl group, a cyano group, an alkoxycarbonyl group, an aryloxycarbonyl group, a nitro group, a carboxyl group, a chloro group, or a bromo group.

Other additives which can be incorporated in the photosensitive composition, support, other coatings such as an organic undercoating layer, methods of coating the photosensitive composition, exposure and development can be effected as described with respect to the positive photosensitive composition containing the first fluorine-containing polymer.

The obtained lithographic printing plate can be exposed through a transparent original by actinic ray emitted from a light source such as a carbon arc lamp, a mercury lamp, a metal halide lamp, a xenon lamp or a tungsten lamp, and then development processed.

The polymers containing the third fluorine-containing monomers as polymer components which are characteristics of the present invention are described below.

The third fluorine-containing monomer is preferably represented by the following formula (Ic):

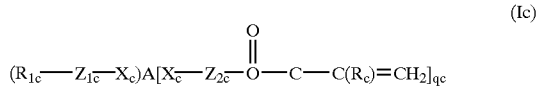
(Ic)

wherein $R_{1c}$ represents a perfluoroalkyl group having from 3 to 20 carbon atoms; $Z_{1c}$ represents

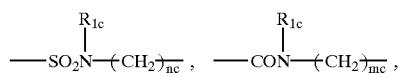

(wherein $R_{1c}$ represents a hydrogen atom or an alkyl group having from 1 to 10 carbon atoms), or —$(CH_2)_{nc}$— (wherein nc represents an integer of from 1 to 6); $Z_{2c}$ represents —$(CH_2)_{mc}$— (wherein mc represents an integer of from 2 to 6) or

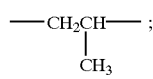

Rc represents a hydrogen atom, a methyl group or a halogen atom (e.g., Cl, Br); Xc represents a divalent linking group represented by

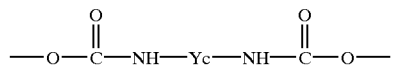

(wherein Yc has 15 or less carbon atoms, and accounts for between 35 and 65% by weight in the Xc group); pc and qc each represents an integer which satisfies pc-qc=4 (provided that pc is 2 or 3); and Ac is a tetravalent linking group represented by the following formula:

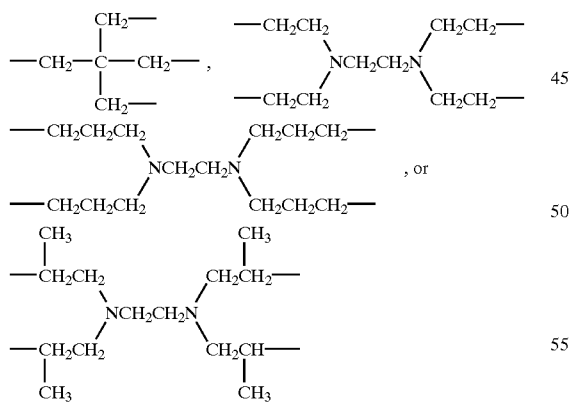

In formula (Ic), two $Z_{1c}$ contained in formula (Ic) may be respectively different two linking groups selected from among the above

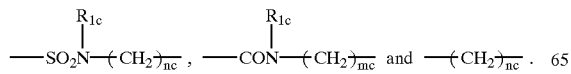

In the third fluorine-containing monomer, $R_{1c}$ represents a perfluoroalkyl group having from 3 to 20 carbon atoms or a perfluoroalkenyl group, and may be straight chain, branched, cyclic, or a combination thereof, or an oxygen atom may be contained in the main chain thereof, e.g., $(CF_3)_2CFOCF_2CF_2$—.

Representative examples of the divalent linking groups represented by the Yc group in the Xc group are shown below.

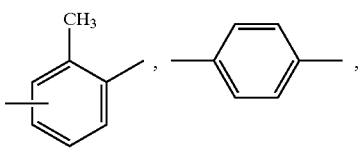

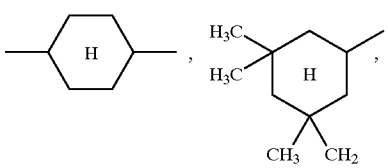

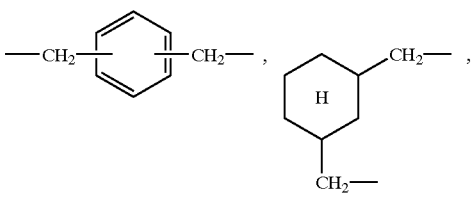

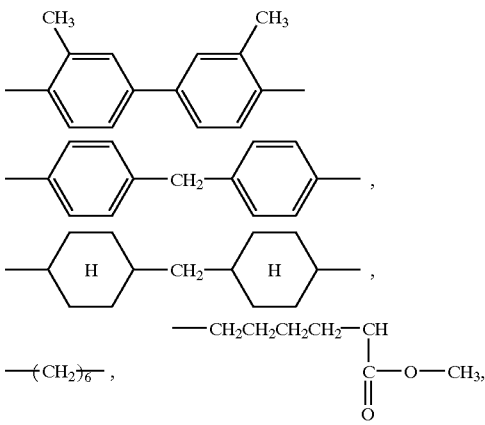

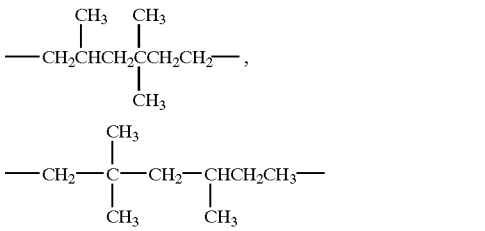

Specific examples of the third fluorine-containing monomers according to the present invention are shown below but the present invention is not limited thereto.

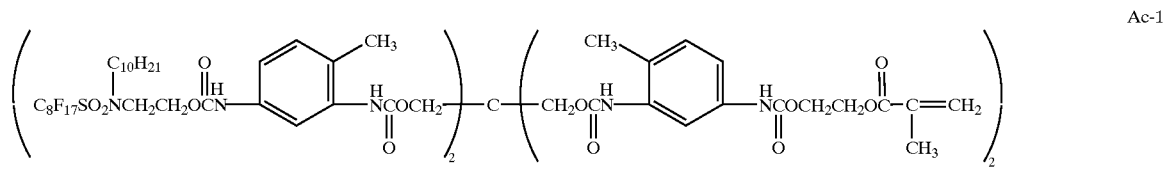
Ac-1
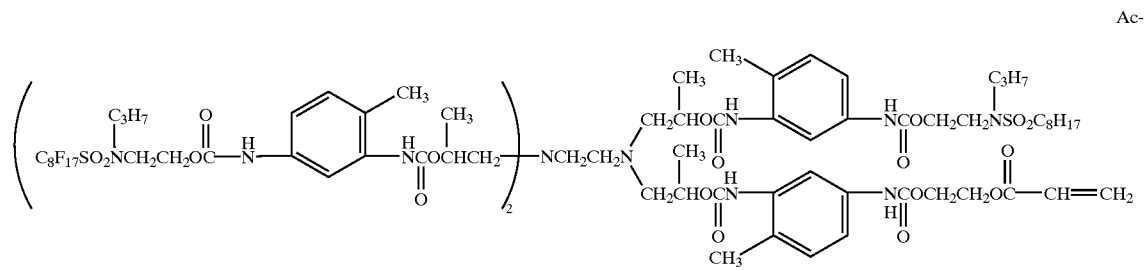
Ac-2
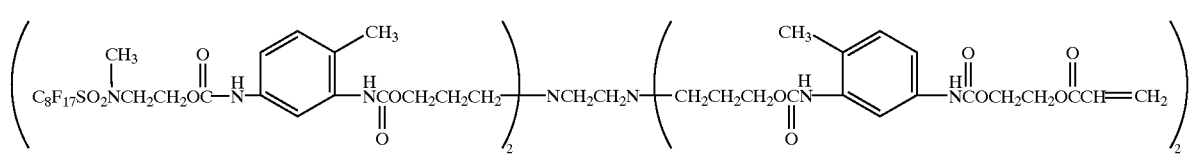
Ac-3
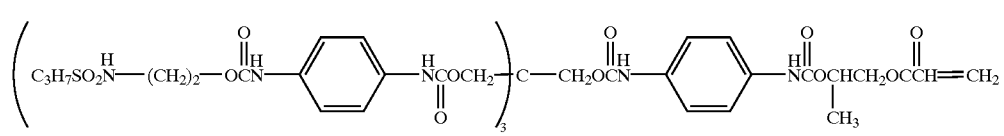
Ac-4
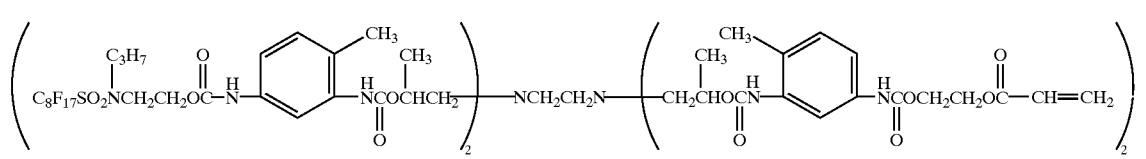
Ac-5
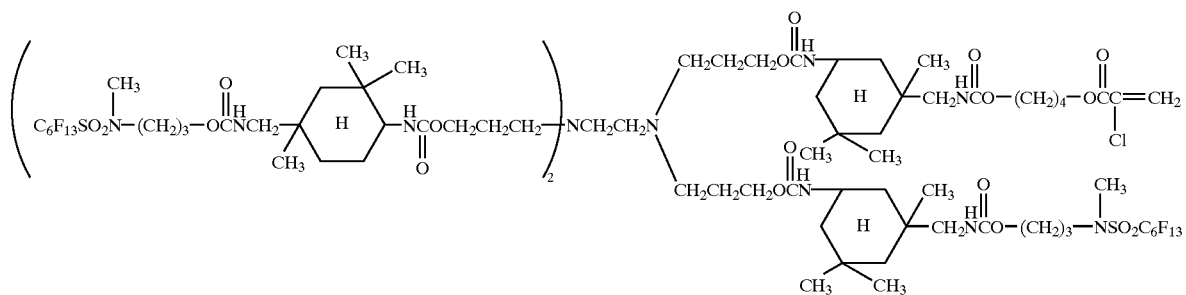
Ac-6
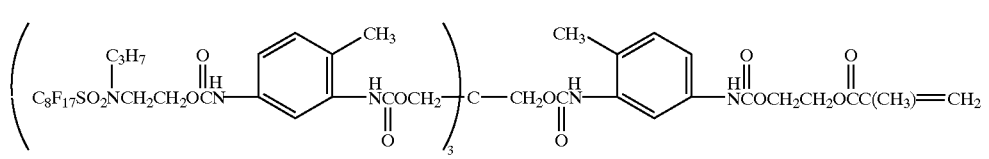
Ac-7
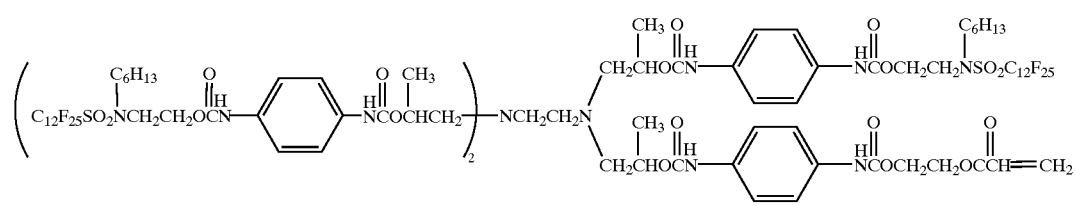
Ac-8

-continued
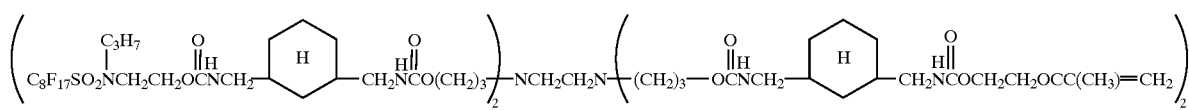
Ac-9
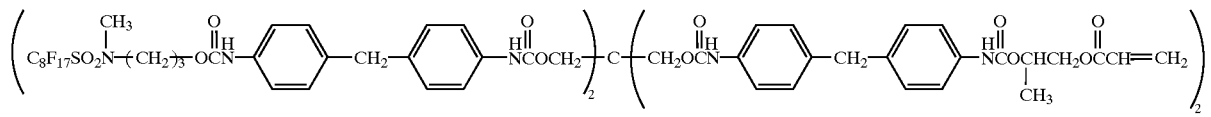
Ac-10
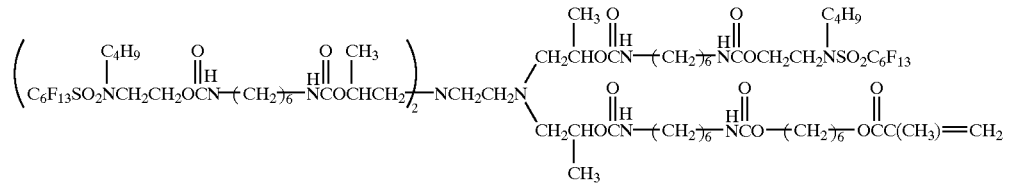
Ac-11
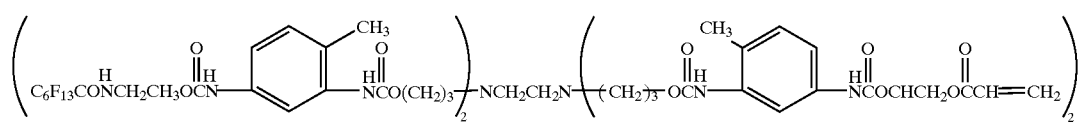
Ac-12
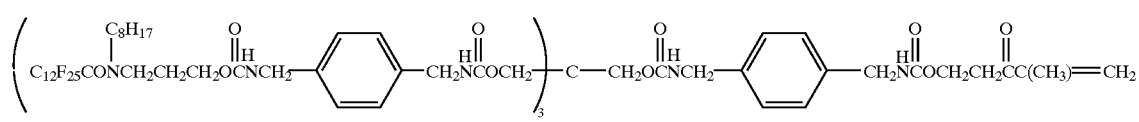
Ac-13
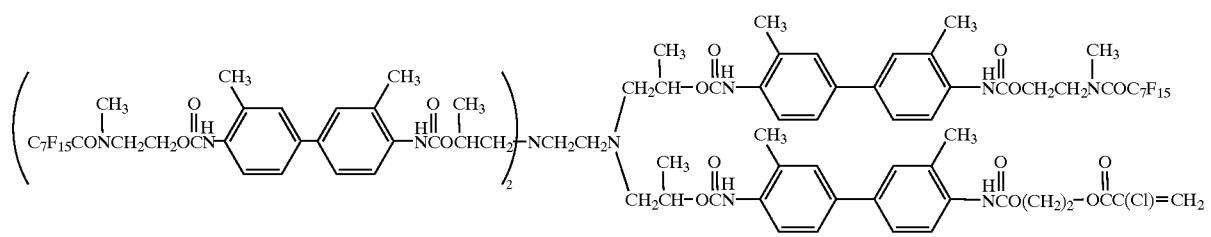
Ac-14
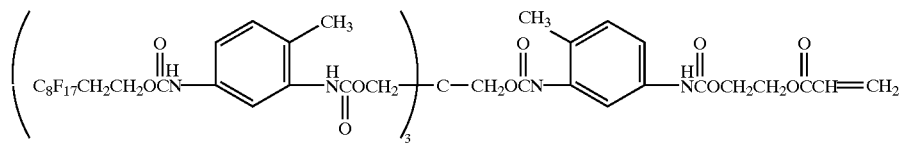
Ac-15
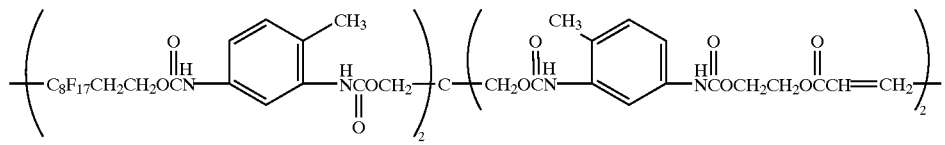
Ac-16
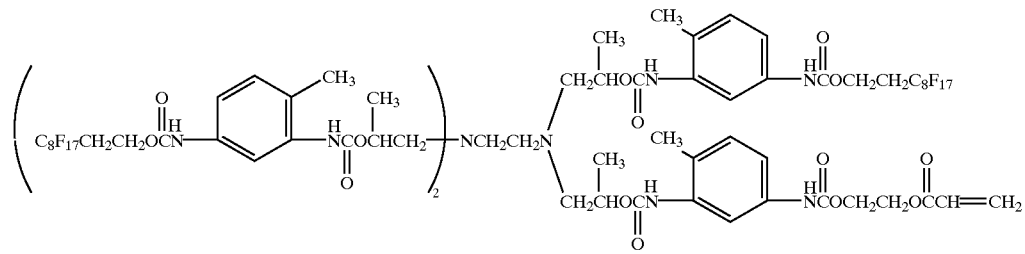
Ac-17

-continued
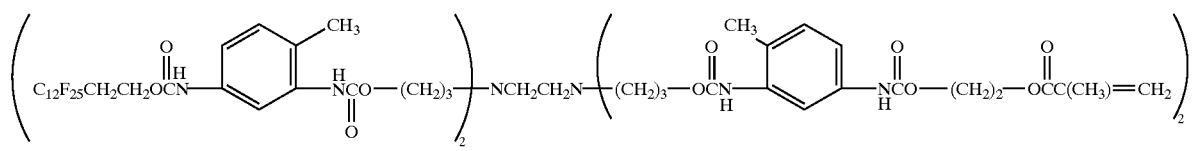
Ac-18
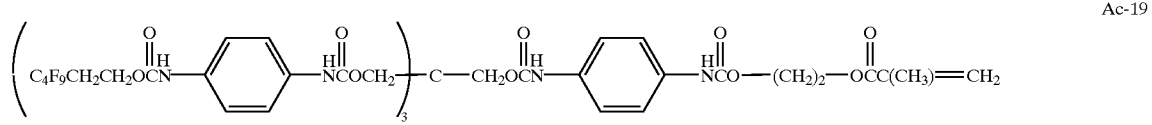
Ac-19
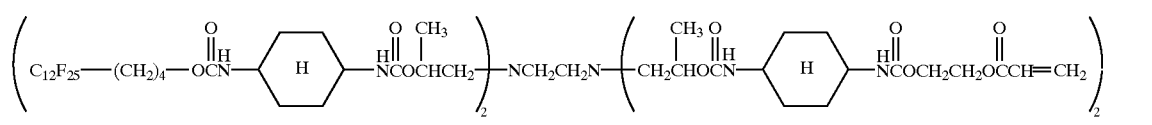
Ac-20
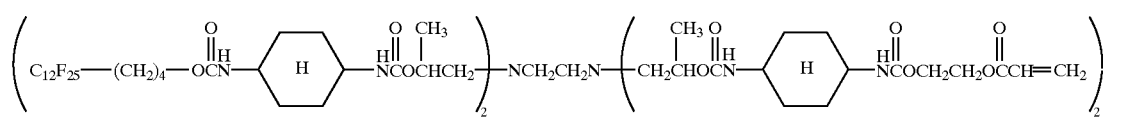
Ac-21
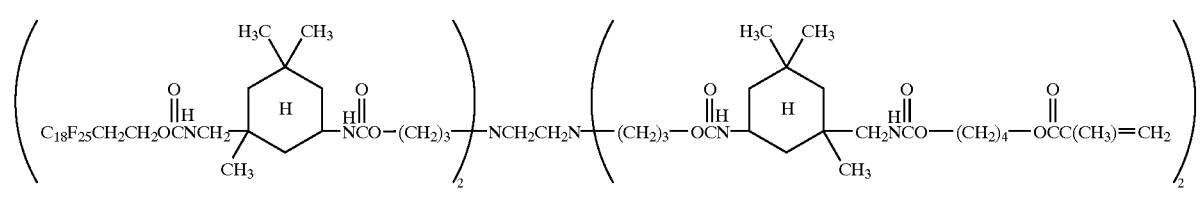
Ac-22
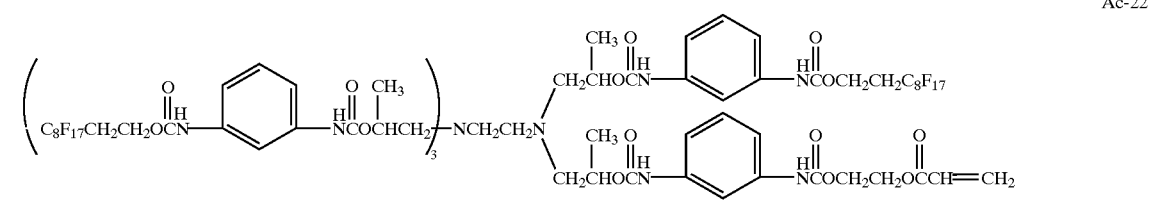
Ac-23
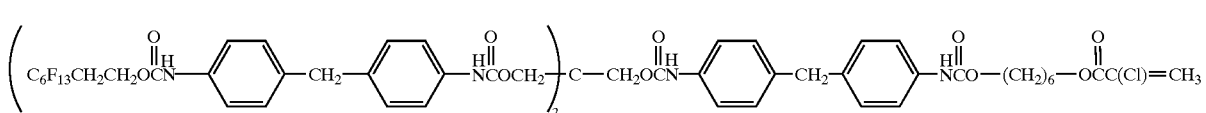
Ac-24
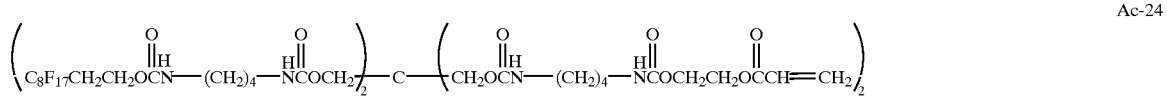
Ac-25
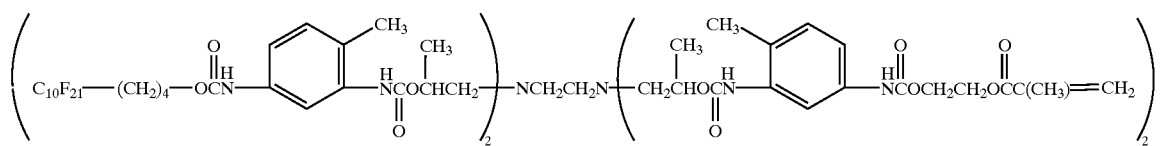
Ac-26
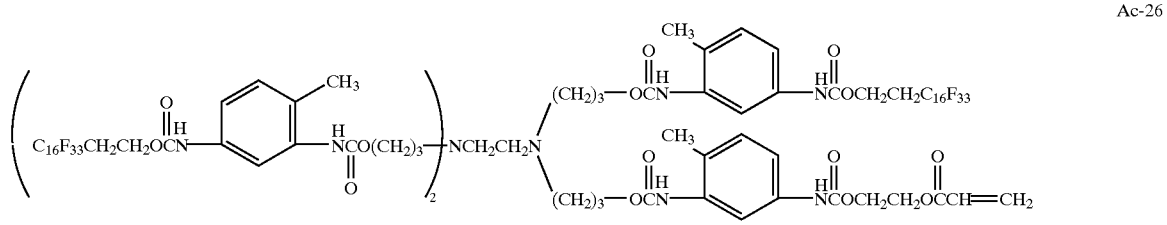
Ac-27
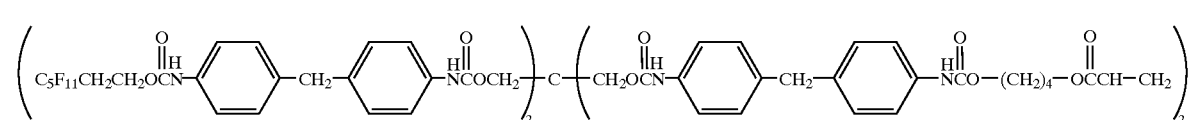

-continued

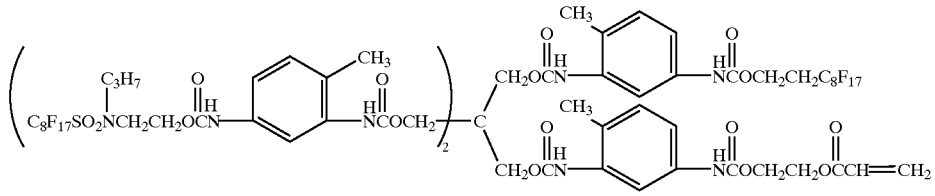
Ac-28

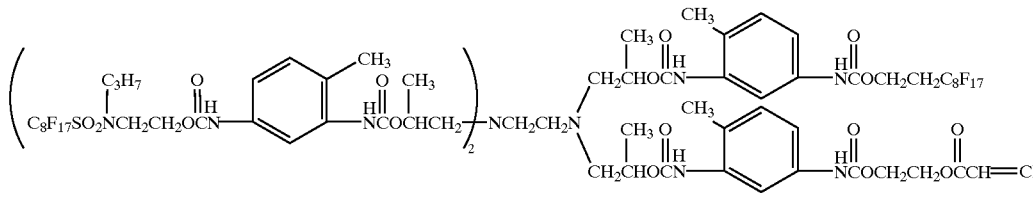
Ac-29

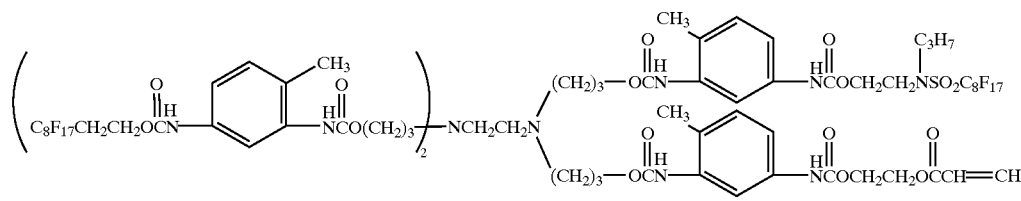
Ac-30

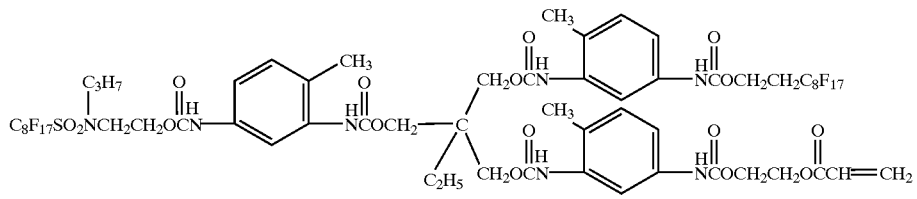
Ac-31

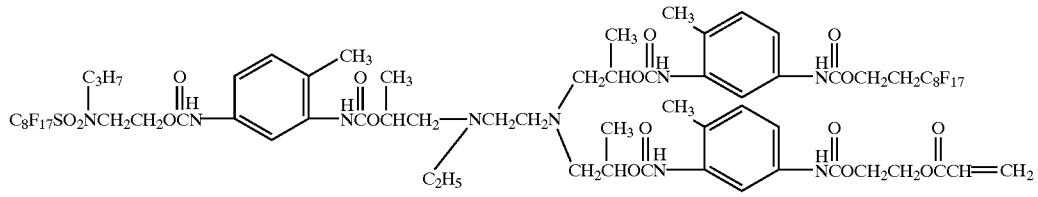
Ac-32

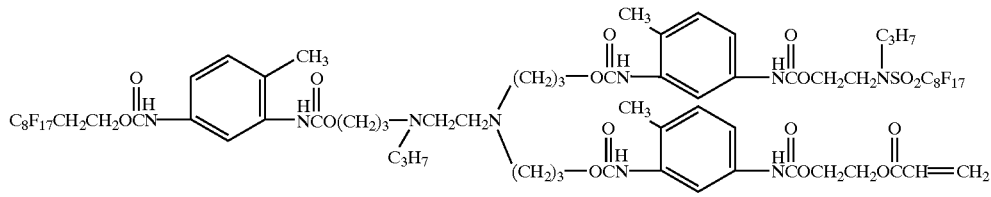
Ac-33

The third fluorine-containing polymers for use in the present invention may be a copolymer of a (meth)acrylate monomer which has two or three perfluoroalkyl group having from 3 to 20 carbon atoms in the molecule and a hydrocarbon (meth)acrylate monomer.

A hydrocarbon (meth)acrylate monomer having an OH group is preferably used in the present invention. Further, hydrocarbon acrylate may be used in combination.

The hydrocarbon acrylate for use in the present invention has 1 or 2 acryloyl groups, which can be selected arbitrarily from those well-known in the industry (e.g., compounds described in Kiyoshi Kato, Shoji Nakahara, *UV Koka Gijutsu Nyumon* (*UV Curing Technique Handbook*), Table 10, pp. 34–35, Table 16, pp. 46–48, Table 20, p. 57, Table 60, pp. 170–172, published by Kobunshi-Kankokai (1984)), such as B-1 to B-8 as shown below.

Compounds (B) Containing 1 Acryloyl Group

B-1  $CH_2=C(R_3)COOR_4$ ($R_4$ is a $C_{1-20}$ alkyl group)

B-2

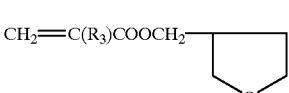
B-3

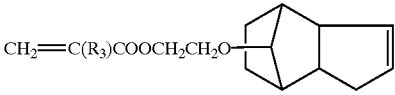
B-4

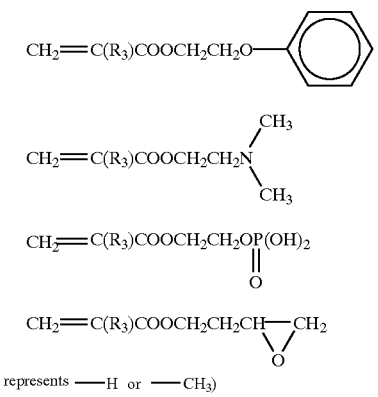

(R₃ represents —H or —CH₃)

Of the above compounds, B-2 is particularly preferred.

The molecular weight of the third fluorine-containing polymers for use in the present invention is not particularly restricted but those having a weight average molecular weight of generally from 3,000 to 200,000, preferably from 4,000 to 100,000 are preferably used. Further, the addition amount of the third fluorine-containing polymers for use in the present invention is preferably from 0.01 to 10 wt %, more preferably from 0.1 to 5 wt %, based on the entire compositions excluding the solvent.

Other additives which can be incorporated in the photosensitive composition, support, other coatings such as an organic undercoating layer, methods of coating the photosensitive composition, exposure and development can be effected as described with respect to the positive photosensitive composition containing the first fluorine-containing polymer. The photosensitive composition containing the third fluorine- containing polymer can contain the yellow dyes represented by formulae (I) to (III) described with respect to the photosensitive composition containing the second fluorine-containing polymer, and do not have to contain a photo-acid generator necessarily.

The obtained lithographic printing plate can be exposed through a transparent original by actinic ray emitted from a light source such as a carbon arc lamp, a mercury lamp, a metal halide lamp, a xenon lamp or a tungsten lamp, and then development processed.

The fourth fluorine-containing polymer according to the present invention is described in detail below.

The fourth fluorine-containing polymer for use in the present invention contains at least the monomers represented by the following formulae (1) to (3) as copolymer components.

A fluoro aliphatic group is in general unsaturated and a monovalent or divalent aliphatic group in which the hydrogen atom on the carbon atom is substituted with a fluorine atom, which includes straight chain, branched or cyclic group. For sufficiently exhibiting the effect of the present invention, the fluoro aliphatic group has from 3 to 20, preferably from 6 to 12, carbon atoms, and contains 40 wt % or more, preferably 50 wt % or more, fluorine atoms bonded to carbon atoms, based on the total weight of the fluorine-containing monomers. A preferred fluoro aliphatic group is substantially completely, or sufficiently fluorinated perfluoro aliphatic group such as $C_nF_{2n+1}$— (n is an integer of 1 or more, preferably 3 or more) (hereinafter sometimes abbreviated to an Rf group).

As the addition polymerization part in an addition polymerizable monomer having a fluoro aliphatic group in which the hydrogen atom on the carbon atom is substituted with a fluorine atom, which is component (1), a vinyl group having a radical polymerizable unsaturated group or derivatives thereof are used. Preferred examples of such addition polymerization parts are acrylate, methacrylate, acrylamide, methacrylamide, styrene, vinyl, and derivatives of these.

As specific examples of acrylate and methacrylate bonded to a fluoro aliphatic group, e.g., a compound represented by Rf—Rd'—OOC—C(Rd")=CH₂ (wherein Rd' represents a single bond, alkylene, sulfonamidoalkylene, or carbonamidoalkylene, Rd" represents a hydrogen atom, a methyl group, a halogen atom, or a perfluoro aliphatic group) can be exemplified.

As specific examples thereof, those disclosed in U.S. Pat. Nos. 2,803,615, 2,642,416, 2,826,564, 3,102,103, 3,282,905, 3,304,278, JP-A-6-256289, JP-A-62-1116, JP-A-62-48772, JP-A-63-77574, JP-A-62-36657, *Nihon KagakuKai-Shi*, No. 10 (1985), pp. 1884–1888 can be exemplified.

Fluoro aliphatic group-bonded macromers described in *Reports Res. Lab.*, Asahi Glass Co., Ltd., Vol. 34 (1984), pp. 27–34 can preferably be used other than the above-described fluoro aliphatic group-bonded monomers.

As fluoro aliphatic group-bonded monomers, a mixture of different lengths of perfluoroalkyl groups as represented by the following structural formula can be used:

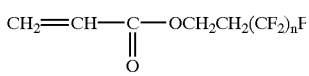

n = 6, 8, 10, 12

The content of fluoro aliphatic group-containing monomers for use in the fourth fluorine-containing polymer of the present invention is from 3 to 70 wt %, preferably from 7 to 40 wt %, based on the weight of the fluorine-containing polymer.

The monomer used as the component (2) is represented by the following formula (1d), (2d), (3d) or (4d):

$$CH_2=CA^{1d}[CO—Wd—R^{2d}] \quad (1d)$$

$$CH_2=CA^{1d}[O—CO—R^{3d}] \quad (2d)$$

$$CH_2=CA^{1d}[Ud] \quad (3d)$$

(4d)

wherein $A^{1d}$ represents a hydrogen atom, a halogen atom, or an alkyl group; Wd represents an oxygen atom or —$NR^{1d}$—; $R^{1d}$ represents a hydrogen atom, an alkyl group, or an aryl group; $R^{2d}$ represents an alkyl group which may have a substituent, or an aryl group which may have a substituent; $R^{3d}$ represents an alkyl group or an aryl group; Ud represents a cyano group, an aryl group, an alkoxyl group, an aryloxy group, an acyloxymethyl group, a nitrogen-containing heterocyclic group, or —$CH_2OCOR^{3d}$ (wherein $R^{3d}$ has the same meaning as above). $A^{1d}$ preferably repesents a hydrogen atom, a halogen atom, or an alkyl group having 1 to 4 carbon atoms; Wd preferably represents an oxygen atom or —$NR^{1d}$—; $R^{1d}$ preferably represents a hydrogen atom, an alkyl group having 1 to 20 carbon atoms, or an aryl group having 6 to 20 carbon atoms; $R^{2d}$ preferably represents an alkyl group having 1 to 8 carbon atoms which may have a substituent, or an aryl group which may have a substituent; and $R^{3d}$ preferably represents an alkyl group having 1 to 20 carbon atoms or an aryl group having 6 to 20 carbon atoms.

When $R^{2d}$ represents an alkyl group which may have a substituent, as the substituent thereof, a halogen atom (e.g., fluorine, chlorine, bromine), a hydroxyl group, an alkoxyl group (e.g., methoxy, ethoxy), an aryloxy group (e.g., phenoxy, a cyano group), an amido group (e.g., acetamido), and an alkoxycarbonyl group (e.g., ethoxycarbonyl) can be exemplified.

When $R^{2d}$ represents an aryl group which may have a substituent, as the substituent thereof, a methyl group can be exemplified in addition to the above substituents.

Specific examples of the preferred compounds as component (2) are shown below.

For example, (meth)acrylates such as methyl (meth) acrylate, ethyl (meth)acrylate, propyl (meth)acrylate, butyl (meth)acrylate, amyl (meth)acrylate, 2-ethylhexyl (meth) acrylate, octyl (meth)acrylate, 2-chloroethyl (meth)acrylate, cyclohexyl (meth)acrylate, 2-hydroxyethyl (meth)acrylate, 2-hydroxypropyl (meth)acrylate, 2-hydroxybutyl (meth) acrylate, diethylene glycol mono(meth)acrylate, 2-hydroxy-3-phenoxypropyl (meth)acrylate, glycidyl (meth)acrylate, diethylaminoethyl (meth)acrylate, furfuryl (meth)acrylate, tetrahydrofuryl (meth)acrylate, phenyl (meth)acrylate, hydroxyphenyl (meth)acrylate, cresyl (meth)acrylate, naphthyl (meth)acrylate, benzyl (meth)acrylate, and methoxybenzyl (meth)acrylate; (meth)acrylamides such as (meth) acrylamide, N-ethyl(meth)acrylamide, N-propyl(meth) acrylamide, N-butyl(meth)acrylamide, N-hexyl(meth) acrylamide, N-octyl(meth)acrylamide, N-cyclohexyl(meth) acrylamide, N-methylol(meth)acrylamide, N-hydroxyethyl (meth)acrylamide, N-benzyl(meth)acrylamide, N-phenyl (meth)acrylamide, N-nitrophenyl(meth)acrylamide, N-tolyl (meth)acrylamide, N-hydroxyphenyl(meth)acrylamide, N,N-dimethyl(meth)acrylamide, N,N-diethyl(meth) acrylamide, and N,N-dicyclohexyl(meth)acrylamide; N-substituted maleimides such as N-methylmaleimide, N-ethylmaleimide, N-propylmaleimide, N-butylmaleimide, N-pentylmaleimide, N-n-hexylmaleimide, N-laurylmaleimide, N-stearylmaleimide, N-cyclohexylmaleimide, N-phenylmaleimide, N-chlorophenylmaleimide, N-tolylmaleimide, N-hydroxymaleimide, and N-benzylmaleimide; allyl compounds such as allyl acetate, allyl caproate, allyl stearate, and allyloxyethanol; vinyl ethers such as ethyl vinyl ether, propyl vinyl ether, butyl vinyl ether, octyl vinyl ether, methoxyethyl vinyl ether, ethoxyethyl vinyl ether, 2-chloroethyl vinyl ether, hydroxyethyl vinyl ether, benzyl vinyl ether, tetrahydrofurfuryl vinyl ether, phenyl vinyl ether, tolyl vinyl ether, and diethylaminoethyl vinyl ether; vinyl esters such as vinyl acetate, vinyl butyrate, vinyl caproate, vinyl chloroacetate, vinyl methoxyacetate, vinyl phenyl acetate, vinyl acetoacetate, vinyl benzoate, and vinyl chlorobenzoate; styrenes such as styrene, α-methylstyrene, methylstyrene, dimethylstyrene, chloromethylstyene, ethoxymethylstyrene, hydroxystyrene, chlorostyrene, and bromostyrene; and N-vinylpyrrolidone, N-vinylpyridine and acrylonitrile can be exemplified.

Of these components (2), compounds represented by formula (1d) or (3d) are particularly preferred.

As an acidic group having an acidic hydrogen atom bonded to the nitrogen atom, which is component (3), any known acidic groups can be used in the present invention. As for such acidic groups, J. A. Dean ed., *Lange's Handbook of Chemistry,* 3rd Ed. (1985), McGraw-Hill Book Co. can be referred to.

Of such acidic groups, as specific examples of partial structures of the acidic groups in which an acidic hydrogen atom is bonded to the nitrogen atom, the compounds represented by the following formulae (A) to (G) can be exemplified.

  (A)

  (B)

  (C)

  (D)

  (E)

  (F)

  (G)

Besides these structures represented by the above formulae, the nitrogen-containing heterocyclic structure having a coupler structure disclosed in JP-A-7-248628 can also be included. As examples of such nitrogen-containing heterocyclic structure, those represented by the following formulae (H) and (I) can be exemplified.

As the addition polymerization part in an addition polymerizable monomer which has an acidic hydrogen atom and the acidic hydrogen atom is bonded to the nitrogen atom, which is component (3), a vinyl group having a radical polymerizable unsaturated group and derivatives thereof are used. Preferred examples of such addition polymerization parts are acrylate, methacrylate, acrylamide, methacrylamide, styrene, vinyl, and derivatives of these.

As preferred examples of monomers which contains an acidic hydrogen atom and the acidic hydrogen atom is bonded to the nitrogen atom, monomers having the structural unit represented by the following formula (5d), (6d) or (7d) can be exemplified.

  (5d)

  (6d)

wherein $A^{2d}$ represents a hydrogen atom, a halogen atom, or an alkyl group having from 1 to 4 carbon atoms; Bd represents an arylene group; Xd represents —CO— or —SO$_2$—; when Xd represents —SO$_2$—, Yd represents a hydrogen atom, an alkyl group, an aryl group, —CO—R$^{4d}$, or —SO$_2$—R$^{4d}$, and when Xd represents —CO—, Yd represents —CO—R$^{4d}$ or —SO$_2$—R ; Zd represents —N—, —NR—, or —O—; Ed represents an arylene group or an alkylene group; $R^{5d}$ represents a hydrogen atom, an alkyl group, or an aryl group; md and sd each represents 0 or 1, provided that md and sd do not represent 0 at the same time; $R^{4d}$ represents an alkyl group or an aryl group; further, Bd and Yd, or Ed and $R^{5d}$ may be bonded to form a nonmetallic atomic ring.

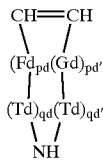
(7d)

wherein Fd and Gd each represents a phenylene group or an alkylene group; Td represents —O—CO—, —CO—, or —SO$_2$—; pd, pd', qd and qd' each represents 0 or 1, provided that qd and qd' do not represent 0 at the same time.

In formula (5d) and (6d), $A^{2d}$ preferably represents a hydrogen atom or a methyl group. The preferred alkyl group represented by Yd, $R_{4d}$ or $R_{5d}$ is an alkyl group having from 1 to 20 carbon atoms (e.g., methyl, ethyl, isopropyl), and the preferred aryl group represented by Yd, $R^{4d}$ or $R^{5d}$ is an aryl group having from 6 to 18 carbon atoms (e.g., phenyl, naphthyl). As the preferred arylene group represented by Bd or Ed, phenylene and naphthylene can be exemplified. As the preferred alkylene group represented by Ed, an alkylene group having from 1 to 20 carbon atoms (e.g., methylene, ethylene) can be exemplified.

The alkyl group and aryl group represented by Yd, $R^{4d}$ or $R^{5d}$ and the arylene group and alkylene group represented by Bd or Ed may have a substituent, and examples of the substituent include a halogen atom (e.g., fluorine, chlorine, bromine), an alkoxyl group (e.g., methoxy, ethoxy), an aryloxy group (e.g., phenoxy), a cyano group, an amido group (e.g., acetamido), and an alkoxycarbonyl group (e.g., ethoxycarbonyl), in addition to the above, an alkyl group having from 1 to 20 carbon atoms, and an aryl group having from 6 to 18 carbon atoms can be exemplified.

In formula (7d), Fd and Gd each preferably represents the same group as defined for Bd or Ed.

Of the monomers represented by formulae (5d), (6d) and (7d) the monomers represented by formulae (5d) and (6d) are more preferred.

The content of the acidic group-containing monomers for use in the fourth fluorine-containing polymer of the present invention is from 5 to 80 wt %, preferably from 10 to 70 wt %, based on the weight of the fluorine-containing polymer.

Specific examples of monomers containing an acidic group in which an acidic hydrogen is bonded to the nitrogen atom are shown below.

M-1
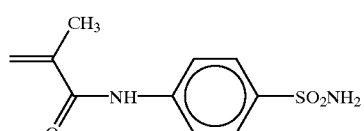

M-2
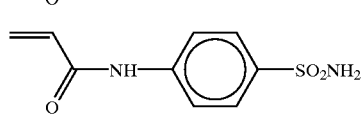

M-3
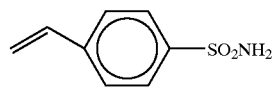

M-4
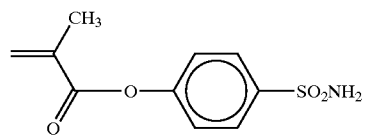

M-5
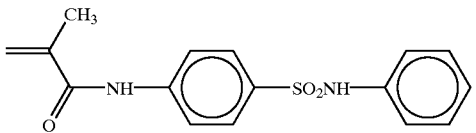

M-6
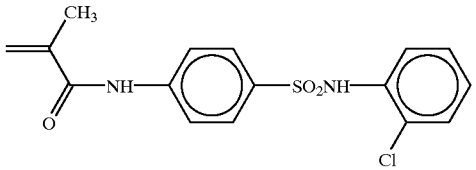

M-7
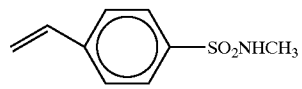

M-8
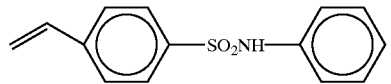

M-9
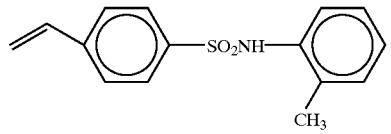

M-10
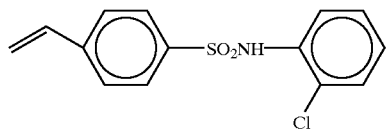

M-11
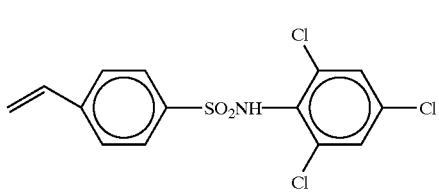

M-12
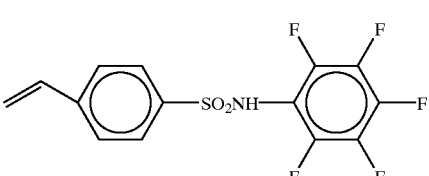

M-13
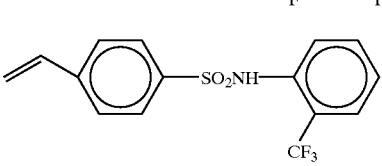

-continued

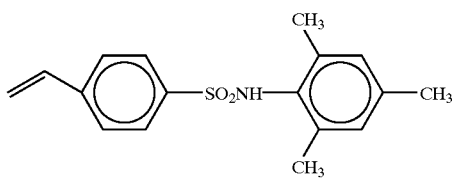
M-14

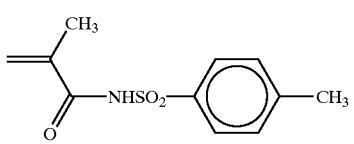
M-15

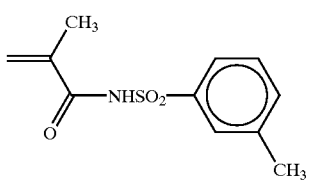
M-16

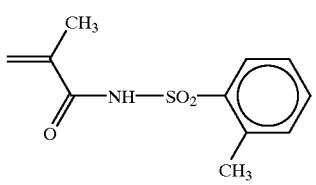
M-17

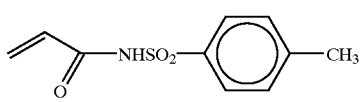
M-18

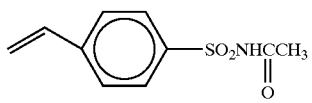
M-19

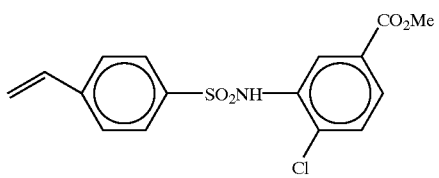
M-20

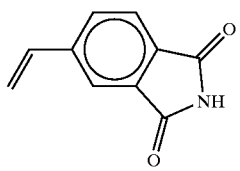
M-21

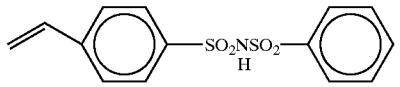
M-22

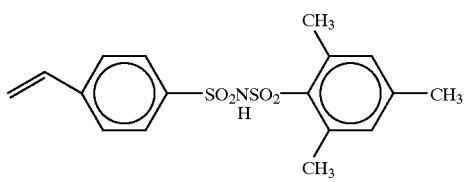
M-23

-continued

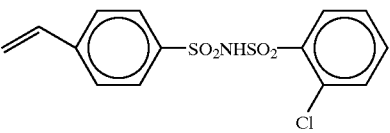
M-24

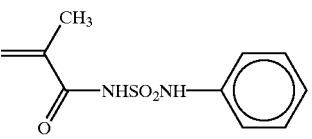
M-25

M-26

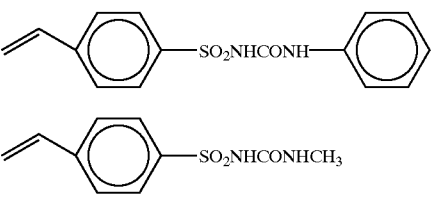
M-27

M-28

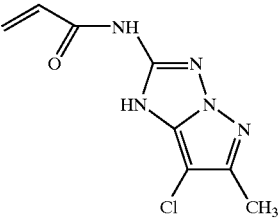
M-29

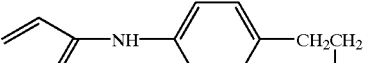
M-30

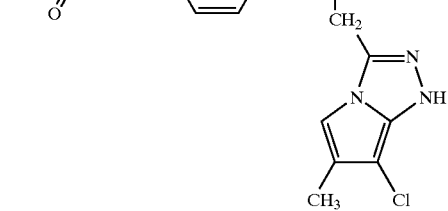

M-31

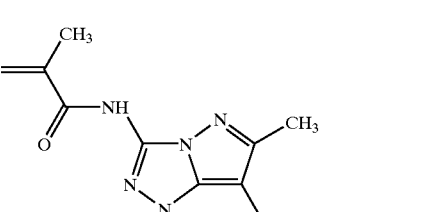

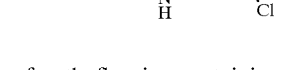

The fourth fluorine-containing polymer of the present invention can be manufactured by conventionally well-known methods. For example, the fourth fluorine-containing polymer can be produced by adding a widely used radical polymerization initiator to (meth)acrylate having a fluoro aliphatic group, (meth)acrylate having an aliphatic group or an aromatic group, and a vinyl monomer containing an acidic group in which an acidic hydrogen atom is bonded to a nitrogen atom in an organic solvent and bringing about thermal polymerization, alternatively, in some cases, by adding other addition polymerizable unsaturated compounds and in the same manner as above.

Further, as examples of other addition polymerizable unsaturated compounds which are used according to cases, those described in J. Brandrup, *Polymer Handbook,* 2nd Ed., Chap. 2, pp. 1–483, Wiley Interscience (1975) can be used, for example, (meth)acrylates such as methyl (meth)acrylate, ethyl (meth)acrylate, 2-chloroethyl (meth)acrylate, 2-hydroxyethyl (meth)acrylate, and glycidyl (meth)acrylate; (meth)acrylamides such as (meth)acrylamide, N-ethyl (meth)acrylamide, N-propyl(meth)acrylamide, N-methylol (meth)acrylamide, N,N-dimethyl(meth)acrylamide, N-hydroxyethyl(meth)acrylamide, and N-(p-hydroxyphenyl) (meth)acrylamide; alkali compounds such as allyl acetate, allyl caproate, and allyloxyethanol; vinyl ethers such as ethyl vinyl ether, propyl vinyl ether, butyl vinyl ether, octyl vinyl ether, methoxyethyl vinyl ether, ethoxyethyl vinyl ether, 2-chloroethyl vinyl ether, hydroxyethyl vinyl ether, benzyl vinyl ether, tetrahydrofurfuryl vinyl ether, phenyl vinyl ether, tolyl vinyl ether, and diethylaminoethyl vinyl ether; vinyl esters such as vinyl acetate, vinyl butyrate, vinyl caproate, vinyl chloroacetate, vinyl methoxyacetate, vinyl phenyl acetate, vinyl acetoacetate, vinyl benzoate, and vinyl chlorobenzoate; styrenes such as styrene, α-methylstyrene, methylstyrene, dimethylstyrene, chloromethylstyrene, ethoxymethylstyrene, hydroxystyrene, chlorostyrene, and bromostyrene; vinyl ketones such as methyl vinyl ketone, ethyl vinyl ketone, propyl vinyl ketone, and phenyl vinyl ketone; olefins such as isobutylene, butadiene, and isoprene; and butyl crotonate, dimethyl itaconate, diethyl itaconate, dimethyl maleate, diethyl fumarate, N-vinylpyrrolidone, N-vinylpyridine, and acrylonitrile can be exemplified.

Other than these monomers, polyoxyalkylene (meth) acrylates disclosed in JP-A-62-226143 and JP-A-3-172849 can be used.

Specific examples of the structures of the fourth fluorine-containing polymer according to the present invention are shown below. Numerals in formulae indicate the molar ratio of each monomer component.

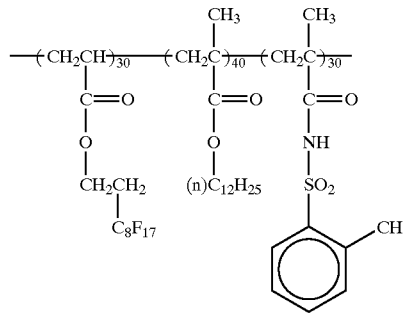

Pd-1

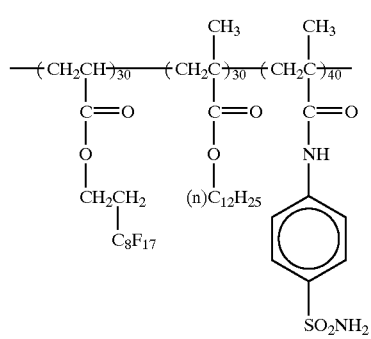

Pd-2

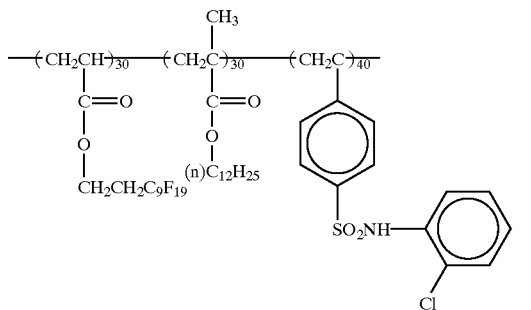

Pd-3

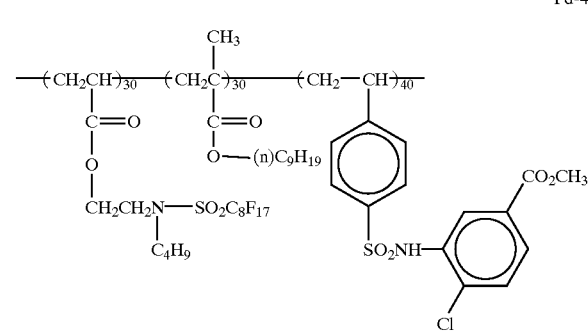

Pd-4

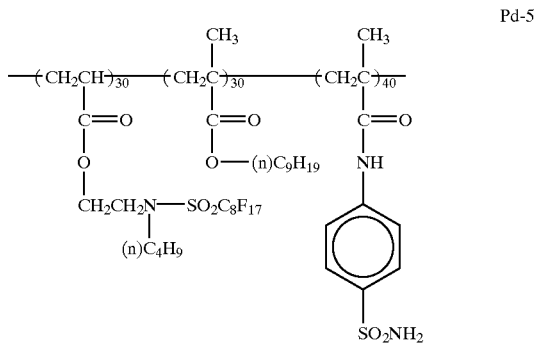

Pd-5

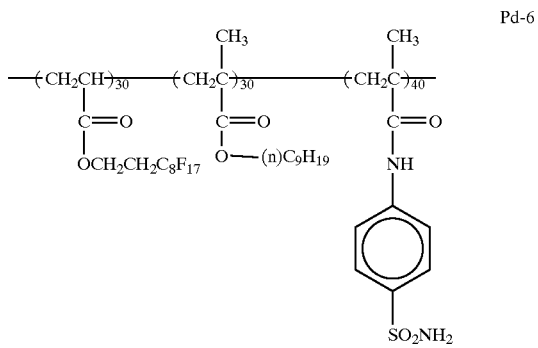

Pd-6

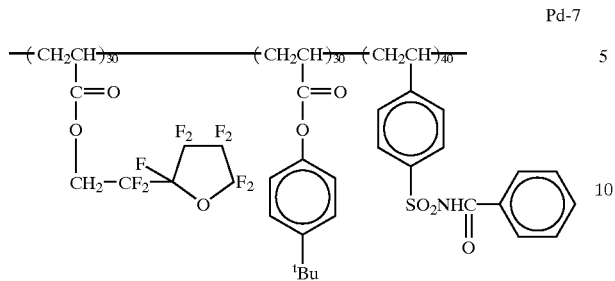

Pd-7

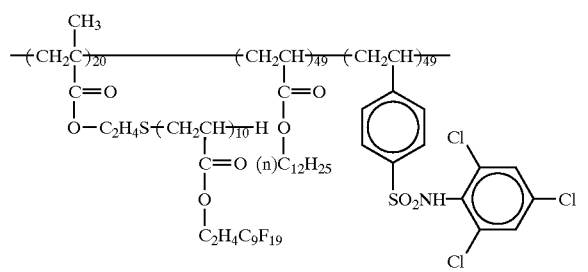

Pd-8

Pd-9

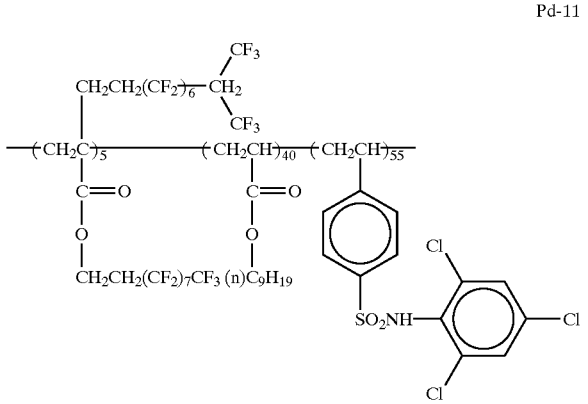

Pd-10

Pd-11

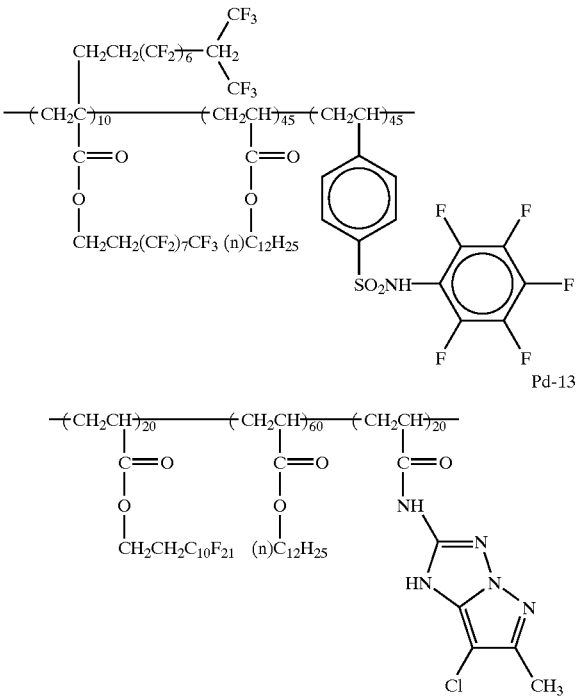

Pd-12

Pd-13

The fourth fluorine-containing polymer for use in the present invention has an average molecular weight of from 3,000 to 200,000, preferably from 6,000 to 100,000. The addition amount of the fourth fluorine-containing polymer is preferably from 0.001 to 10 wt %, more preferably from 0.01 to 5 wt %, based on the entire composition excluding the solvent.

Resins Having a Phenolic Hydroxyl Group Soluble in an Alkaline Aqueous Solution

Examples of resins having a phenolic hydroxyl group which are soluble in an alkaline aqueous solution (hereinafter referred to as "resins having a phenolic hydroxyl group") for use in the present invention include novolak resins, e.g., a phenol/formaldehyde resin, an m-cresol/formaldehyde resin, a p-cresol/formaldehyde resin, an m-/p- mixed cresol/formaldehyde resin, and a phenol/cresol (m-, p-, or m-/p-mixed)/formaldehyde resin.

These resins having a phenolic hydroxyl group have a weight average molecular weight of from 500 to 20,000 and a number average molecular weight of from 200 to 10,000.

Further, as disclosed in U.S. Pat. No. 4,123,279, a condensation product of phenol/formaldehyde having an alkyl group having from 3 to 8 carbon atoms as a substituent, e.g., t-butylphenol/formaldehyde resin, an octylphenol/formaldehyde resin can be used in combination. These resins having a phenolic hydroxyl group may be used alone or in combination of two or more.

In the present invention, resins having a phenolic hydroxyl group and a copolymer containing 10 mol % or more of at least one copolymer component selected from the above-described (4) to (6) (hereinafter referred to as "the specific copolymer") are preferably used in combination.

It is essential that the specific copolymer of the present invention contain at least one copolymer component selected from the above-described (4) to (6) in an amount of 10 mol % or more, preferably 20 mol % or more. If this amount is less than 10 mol %, the interaction with the resin containing a phenolic hydroxyl group becomes insufficient resulting in the reduction of development latitude.

A copolymer component other than (4) to (6) may be contained.

Monomers corresponding to (4) are monomers comprising low molecular weight compounds respectively having, in one molecule, one or more of a sulfonamido group in which at least one hydrogen atom is bonded to the nitrogen atom, and a polymerizable unsaturated bond. Of these monomers, low molecular weight compounds having an acryloyl group, an aryl group or a vinyloxy group, and a substituted or mono-substituted aminosulfonyl group or a substituted sulfonylimino group are preferred.

As such compounds, the compounds represented by the following formulae (Id) to (Vd) are exemplified.

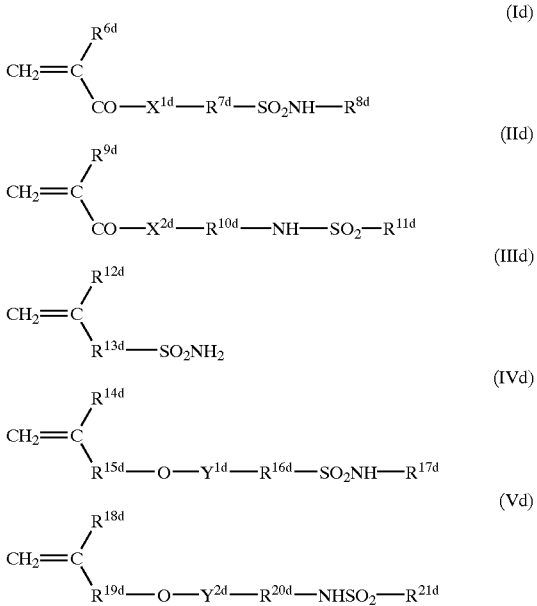

wherein $X^{1d}$ and $X^{2d}$ each represents —O— or —$NR^{22d}$—; $R^{6d}$, $R_{9d}$, $R^{12d}$, $R^{14d}$ and $R^{18d}$ each represents a hydrogen atom or —$CH_3$; $R^{7d}$, $R_{10d}$, $R_{13d}$, $R_{16d}$ and $R^{20d}$ each represents an alkylene group, a cycloalkylene group, an arylene group, or an aralkylene group, each of which may have a substituent and has from 1 to 12 carbon atoms; $R^{8d}$, $R_{17d}$ and $R^{22d}$ each represents a hydrogen atom, an alkyl group, a cycloalkyl group, an aryl group, or an aralkyl group, each of which may have a substituent and has from 1 to 12 carbon atoms; $R_{11d}$ and $R^{21d}$ each represents an alkyl group, a cycloalkyl group, an aryl group, or an aralkyl group, each of which may have a substituent and has from 1 to 12 carbon atoms; $R^{15d}$ and $R^{19d}$ each represents an alkylene group, a cycloalkylene group, an arylene group, or an aralkylene group, each of which may have a single bond or a substituent and has from 1 to 12 carbon atoms; and $Y^{1d}$ and $Y^{2d}$ each represents a single bond or —CO—.

Specifically, m-aminosulfonylphenyl methacrylate, N-(p-aminosulfonylphenyl)methacrylamide, and N-(p-aminosulfonylphenyl)acrylamide are preferably used as such monomers.

Monomers corresponding to (5) are monomers comprising low molecular weight compounds respectively having, in one molecule, one or more of an active imino group represented by the following formula, and a polymerizable unsaturated bond.

Specifically, N-(p-toluenesulfonyl)methacrylimide and N-(p-toluenesulfonyl)acrylimide are preferably used as such monomers.

Monomers corresponding to (6) are monomers comprising acrylamide, methacrylamide, acrylate, methacrylate, or hydroxystyrene each having a phenolic hydroxyl group.

Specifically, N-(4-hydroxyphenyl)acrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, and p-hydroxystyrene are preferably used as such monomers.

As other copolymerizable components, for example, monomers of the following (7) to (18) can be exemplified.

(7) Acrylates and methacrylates having an aliphatic hydroxyl group, e.g., 2-hydroxyethyl acrylate and 2-hydroxyethyl methacrylate.

(8) Alkyl acrylates, e.g., methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate.

(9) Alkyl methacrylates, e.g., methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate.

(10) Acrylamide or methacrylamide, e.g., acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(11) Vinyl ethers, e.g., ethyl vinyl ether, 2-chloroethyl vinyl ether, hydroxyethyl vinyl ether, propyl vinyl ether, butyl vinyl ether, octyl vinyl ether, and phenyl vinyl ether.

(12) Vinyl esters, e.g., vinyl acetate, vinyl chloroacetate, vinyl butyrate, and vinyl benzoate.

(13) Styrenes, e.g., styrene, α-styrene, methylstyrene, and chloromethylstyrene.

(14) Vinylketones, e.g., methylvinylketone, ethylvinylketone, propyl vinyl ketone, and phenyl vinyl ketone.

(15) Olefins, e.g., ethylene, propylene, isobutylene, butadiene, and isoprene.

(16) N-vinylpyrrolidone, N-vinylcarbazole, 4-vinylpyridine, acrylonitrile, and methacrylonitrile.

(17) Unsaturated imide, e.g., maleimide, N-acryloylacrylamide, N-acetylmethacrylamide, N-propionylmethacrylamide, and N-(p-chlorobenzoyl) methacrylamide.

(18) Unsaturated carboxylic acids, e.g., acrylic acid, methacrylic acid, maleic anhydride, and itaconic acid.

The specific copolymers for use in the present invention preferably have a weight average molecular weight of 2,000 or more and a number average molecular weight of 1,000 or more, more preferably a weight average molecular weight of from 5,000 to 300,000 and a number average molecular weight of from 2,000 to 250,000, and dispersion degree (weight average molecular weight/number average molecular weight) of from 1.1 to 10.

These specific copolymers may be used alone or in combination of two or more.

It is necessary that the compounding ratio by weight of the resins having a phenolic hydroxyl group to the specific copolymers be within the range of from 50/50 to 5/95, preferably from 40/60 to 10/90.

If the compounding ratio of the resins having a phenolic hydroxyl group is larger than this range, glycosis structure is reversed and resistance to solubility cannot be improved, while when the compounding ratio of the specific copolymers is larger than this range, the surface layer by the resins having a phenolic hydroxyl group becomes thin and the improvement of development latitude becomes unsatisfactory.

The alkali-soluble high molecular compound comprising these resin having a phenolic hydroxyl group and specific copolymer may be comprised of one or two or more respectively in combination, and the addition amount thereof is from 30 to 99 wt %, preferably from 40 to 95 wt %, particularly preferably from 50 to 90 wt %, based on the solid content of the entire printing plate material. When the addition amount of the alkali-soluble high molecular compound is less than 30 wt %, the durability of the recording layer is deteriorated, on the other hand if it exceeds 90 wt %, the sensitivity and durability are lowered.

Substance Which Absorbs Light and Generates Heat

As substances which absorb light and generate heat, various pigments or dyes can be used in the present invention.

As such pigments, those commercially available and pigments described in *Color Index* (*C.I.*), *The Latest Pigment Handbook,* compiled by Nihon Ganryo Gijutsu Kyokai (1977), *The Latest Pigment Applied Technique,* published by CMC Publishing Co. (1986), *Printing Ink Technique,* CMC Publishing Co. (1984) can be used.

Various kinds of pigments can be used, e.g., black pigments, yellow pigments, orange pigments, brown pigments, red pigments, purple pigments, blue pigments, green pigments, fluorescent pigments, metal powder pigments, and polymer-attaching pigments can be exemplified. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments, and carbon black can be used.

These pigments can be used without surface treatment or may be surface-treated. As methods of surface treatments, a method of surface-coating with resins and waxes, a method of adhering surfactants, and a method of attaching reactive substances (e.g., silane coupling agents, epoxy compounds and polyisocyanate) on the surfaces of pigments can be exemplified. These surface treatment methods are described in *Natures and Applications of Metal Soaps,* Saiwai Shobo Co., *Printing Ink Technique,* CMC Publishing Co. (1984), and *The Latest Pigment Applied Technique,* CMC Publishing Co. (1986).

The particle size of pigments is preferably from 0.01 to 10 $\mu$m, more preferably from 0.05 to 1 $\mu$m, and particularly preferably from 0.1 to 1 $\mu$m. If the particle size of pigments is less than 0.01 $\mu$m, it is not preferred from the viewpoint of the stability of the dispersion in a photosensitive layer-coating solution, while when it exceeds 10 $\mu$m, it is not preferred in view of the uniformity of the photosensitive layer.

Well-known methods in the manufacture of inks and toners can be used as dispersing methods of pigments. Examples of dispersing apparatus include a sand mill, an attritor, a pearl mill, a super-mill, a ball mill, an impeller, a disperser, a KD mill, a colloid mill, a dynatron, a three-roll mill, a pressure kneader, etc., and details are described in *The Latest Pigment Applied Technique,* CMC Publishing Co. (1986).

As dyes for this purpose, those commercially available and known dyes described, for example, in *Dye Handbook,* compiled by Yuki Gosei Kagaku Kyokai (1970) can be utilized. Specifically, azo dyes, metal complex azo dyes, pyrazolone azo dyes, anthraquinone dyes, phthalocyanine dyes, carbonium dyes, quinoneimine dyes, methine dyes, and cyanine dyes can be used.

Of these pigments and dyes, those which absorb infrared rays or near infrared rays are particularly preferably used in the laser which emits infrared rays or near infrared rays.

As such pigments which absorb infrared rays or near infrared rays, carbon blacks are preferably used. In addition, as dyes which absorb infrared rays or near infrared rays, e.g., cyanine dyes disclosed in JP-A-58-125246, JP-A-59-84356, JP-A-59-202829, and JP-A-60-78787, methine dyes disclosed in JP-A-58-173696, JP-A-58-181690, and JP-A-58-194595, naphthoquinone dyes disclosed in JP-A-58-112793, JP-A-58-224793, JP-A-59-48187, JP-A-59-73996, JP-A-60-52940, and JP-A-60-63744, squarylium dyes disclosed in JP-A-58-112792, and cyanine dyes disclosed in British Patent 434,875 can be exemplified.

Further, near infrared-absorbing sensitizing dyes disclosed in U.S. Pat. No. 5,156,938 are also preferably used. In addition, substituted arylbenzo(thio)pyrylium salts disclosed in U.S. Pat. No. 3,881,924, trimethine thiapyrylium salts disclosed in JP-A-57-142645 (corresponding to U.S. Pat. No. 4,327,169), pyrylium based compounds disclosed in JP-A-58-181051, JP-A-58-220143, JP-A-59-41363, JP-A-59-84248, JP-A-59-84249, JP-A-59-146063, and JP-A-59-146061, cyanine dyes disclosed in JP-A-59-216146, pentamethine thiopyrylium salts disclosed in U.S. Pat. No. 4,283,475, pyrylium compounds disclosed in JP-B-5-13514 and JP-B-5-19702, Epolight III-178, Epolight III-130, and Epolight III-125 are particularly preferably used.

As another example of particularly preferred dyes, near infrared-absorbing dyes disclosed in U.S. Pat. No. 4,756,993 as formulae (I) and (II) can be exemplified.

These pigments or dyes can be added to the printing plate material in an amount of from 0.01 to 50 wt %, preferably from 0.1 to 10 wt %, based on the entire solid content of the material, and in the case of dyes, particularly preferably the amount of from 0.5 to 10 wt % and in the case of pigments, particularly preferably the amount of from 3.1 to 10 wt %, can be added to the printing plate material. If the addition amount of pigments or dyes is less than 0.01 wt %, the sensitivity lowers, and when it exceeds 50 wt %, the uniformity of the photosensitive layer is lost and the durability of the recording layer is deteriorated.

These dyes or pigments may be added in the same layer with other components, alternatively, another layer can be provided and added therein. If another layer is provided, they are preferably added to the adjacent layer to the layer which contains substances which are thermal-decomposable and substantially lower the solubility of binders when they are in the state not being decomposed. Dyes or pigments and binder resins are preferably added to the same layer but they may be added to different layers.

Other Components

Further, various additives can be added to the positive type photosensitive composition according to the present invention according to necessity. For example, it is preferred to contain, in combination, onium salts, o-quinonediazide compounds, aromatic sulfone compounds, aromatic sulfonate compounds which are thermal-decomposable and substantially lower the solubility of high molecular compounds soluble in an alkaline aqueous solution when they are in the state not being decomposed, in view of improving prevention of the image area from being dissolved in a developing solution.

Onium salts which can be used include those described above.

The addition amount of o-quinonediazide compounds is preferably from 1 to 50 wt %, more preferably from 5 to 30 wt %, and particularly preferably from 10 to 30 wt %, based on the entire solid content of the printing plate material. These compounds can be used alone or may be used in mixture.

The addition amount of additives other than o-quinonediazide compounds is preferably from 1 to 50 wt %, more preferably from 5 to 30 wt %, and particularly preferably from 10 to 30 wt %.

For further improving sensitivity, cyclic acid anhydrides, phenols and organic acids can be used in combination. Examples of cyclic acid anhydrides include, as disclosed in U.S. Pat. No. 4,115,128, phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride, and pyromellitic anhydride. Examples of phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4,3",4"-tetrahydroxy-3,5,3',5'-tetramethyltriphenylmethane. Further, examples of organic acids include, as are disclosed in JP-A-60-88942 and JP-A-2-96755, sulfonic acids, sulfinic acids, alkylsulfuric acids, phosphonic acids, phosphates, and carboxylic acids, specifically, p-toluenesulfonic acid, dodecylbenzenesulfonic acid, p-toluenesulfinic acid, ethyl sulfate, phenyl phosphonate, phenyl phosphinate, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicarboxyic acid, erucic acid, lauric acid, n-undecanoic acid, and ascorbic acid can be exemplified.

The content of cyclic acid anhydrides, phenols and organic acids in the printing plate material is preferably from 0.05 to 20 wt %, more preferably from 0.1 to 15 wt %, and particularly preferably from 0.1 to 10 wt %.

Surfactants can be added to the printing plate material of the present invention for widening the processing stability against development conditions, e.g., nonionic surfactants as disclosed in JP-A-62-251740 and JP-A-3-208514, and ampholytic surfactants as disclosed in JP-A-59-121044 and JP-A-4-13149 can be added.

Specific examples of nonionic surfactants include sorbitan tristearate, sorbitan monopalmitate, sorbitan trioleate, stearic acid monoglyceride, polyoxyethylenenonylphenyl ether, etc.

Specific examples of ampholytic surfactants include alkyldi(aminoethyl)glycine, alkylpolyaminoethylglycine hydrochloride, 2-alkyl-N-carboxyethyl-N-hydroxyethyl-imidazolinium betaine, N-tetradecyl-N,N-betaine type surfactants (e.g., Amorgen K, trade name, Daiichi Kogyo Seiyaku Co., Ltd.), etc. The content of these nonionic and ampholytic surfactants in the printing plate material is preferably from 0.05 to 15 wt %, more preferably from 0.1 to 5 wt %.

Printing out agents for obtaining a visible image immediately after heating by exposure, and dyes and pigments as coloring agents of the image can be added to the printing plate material according to the present invention.

As the printing out agent, combinations of organic dyes which can form a salt with the compounds which release an acid upon heating by exposure (photo-acid releasing agents) can be exemplified as representatives. Specifically, combinations of o-naphthoquinonediazide-4-sulfonic acid halogenide with salt-forming organic dyes disclosed in JP-A-50-36209 and JP-A-53-8128, and trihalomethyl compounds with salt-forming organic dyes disclosed in JP-A-53-36223, JP-A-54-74728, JP-A-60-3626, JP-A-61-143748, JP-A-61-151644 and JP-A-63-58440can be exemplified. As such trihalomethyl compounds, there are oxazole compounds and triazine compounds and both are excellent in aging stability and clear printing out image can be obtained.

As coloring agents of the image, other dyes can be used besides the above-described salt-forming organic dyes. Oil-soluble dyes and basic dyes can be cited as appropriate dyes including the salt-forming organic dyes. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015) can be exemplified. Further, dyes disclosed in JP-A-62-293247 are particularly preferably used. These dyes can be added to the printing plate material in an amount of from 0.01 to 10 wt %, preferably from 0.1 to 3 wt %, based on the entire solid content of the printing plate material.

Moreover, plasticizers can be added to the printing plate material for improving the flexibility of the coating film, e.g., butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers or polymers of acrylic acid or methacrylic acid, etc., can be used.

The image recording material according to the present invention is in general manufactured by dissolving the above-described each component in a solvent and coating the coating solution on an appropriate support. Examples of solvents used include ethylene dichloride, cyclohexanone, methyl ethyl ketone, methanol, ethanol, propanol, ethylene glycol monomethyl ether, 1-methoxy-2-propanol, 2-methoxyethylacetate, 1-methoxy-2-propylacetate, dimethoxyethane, methyl lactate, ethyl lactate, N,N-dimethylacetamide, N,N-dimethylformamide, tetramethylurea, N-methylpyrrolidone, dimethyl sulfoxide, sulforane, γ-butyrolactone, toluene, etc., but solvents are not limited thereto. These solvents are used alone or in mixture. The concentration of the above components (entire solid content including additives) in a solvent is preferably from 1 to 50 wt %. The coating amount on the support obtained after coating and drying (solid content) is varied according to purposes, but it is, in general, preferably from 0.5 to 5.0 g/m² as to the photosensitive printing plate. Various coating methods can be used, e.g., bar coating, rotary coating, spray coating, curtain coating, dip coating, air knife coating, blade coating, and roll coating can be used. As the coating amount reduces, apparent sensitivity increases but film characteristics of the photosensitive film decreases.

Surfactants, e.g., fluorine surfactants disclosed in JP-A-62-170950 can be added to the photosensitive layer according to the present invention for improving the coating property. Addition amount is preferably from 0.01 to 1 wt %, more preferably from 0.05 to 0.5 wt %, based on the entire printing plate material.

A support for use in the present invention is a plate having dimensional stability, for example, paper; paper laminated with plastics (e.g., polyethylene, polypropylene, polystyrene); metal plates (e.g., aluminum, zinc, copper); plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal); and paper or plastic films laminated or deposited with metals as above.

Polyester films or aluminum plates are preferably used in the present invention, above all, aluminum plates are particularly preferably used as they are dimensionally stable and comparatively inexpensive. Suitable aluminum plates include pure aluminum plates and alloy plates containing aluminum as a main component and a small amount of different elements. Further, plastic films laminated or deposited with aluminum may be used. Different elements contained in aluminum alloys include silicon, iron, manganese, copper, magnesium, chromium, zinc, bismuth, nickel and titanium. The content of these different elements in alloys is at most 10 wt %. Pure aluminum is particularly used in the present invention, but 100% pure aluminum is difficult to obtain in the light of purifying techniques. Accordingly, a negligible amount of different elements can be contained. Thus the composition of the aluminum plate applied to the present invention is not specified and well-known aluminum plates can be arbitrarily used. The thickness of the aluminum plate for use in the present invention is from about 0.1 to about 0.6 mm, preferably from 0.15 to 0.4 mm, and particularly preferably from 0.2 to 0.3 mm.

Prior to the surface roughening of an aluminum plate, degreasing is performed to remove the rolling oil on the surface of the plate by means of, e.g., surfactants, organic solvents or alkaline aqueous solution, if required.

Various methods are used for surface roughening treatment of an aluminum plate, e.g., a mechanical roughening method, an electrochemical roughening method, and a chemical roughening method comprising selectively dissolving the surface. Known mechanical methods such as a ball abrading method, a brushing method, a blasting method, and an abrading method using buff can be used. As an electrochemical roughening method, a method of performing alternating current or direct current electrolysis in a hydrochloric acid or nitric acid electrolytic solution. Further, as disclosed in JP-A-54-63902, a method of combination of mechanical roughening with electrochemical roughening can also be used.

The thus-surface roughened aluminum plate is subjected to anodic oxidation treatment for increasing water retentive property and abrasion resistance of the surface, if necessary, after being subjected alkali-etching treatment and neutralizing treatment according to necessity. Various electrolytes which form a porous oxide film are applicable as the electrolyte for use in the anodic oxidation treatment of the aluminum plate, e.g., sulfuric acid, phosphoric acid, oxalic acid, chromic acid or mixed acid of these is generally used. The concentration of the electrolyte is determined arbitrarily depending on the kind of the electrolyte.

Treatment conditions of anodic oxidation cannot be determined unconditionally as conditions fluctuate variously depending upon the electrolytic solution to be used, but generally appropriately the concentration of an electrolytic solution is from 1 to 80 wt %, temperature of the solution is from 5 to 70° C., electric current density is from 5 to 60 A/dm$^2$, voltage is from 1 to 100 V, and electrolytic time is from 10 seconds to 5 minutes.

If the amount of anodic oxidation coating is less than 1.0 g/m$^2$, press life comes to be insufficient and the nonimage area of the lithographic printing plate is liable to be scratched, as a result, "scratch stain", i.e., adhesion of ink at that scratch, is liable to occur.

After anodic oxidation treatment, aluminum surface is subjected to hydrophilization treatment, if necessary. As preferred hydrophilization treatments for use in the present invention, there is a method of treatment with alkali metal silicate, e.g., an aqueous solution of sodium silicate as disclosed in U.S. Pat. Nos. 2,714,066, 3,181,461, 3,280,734 and 3,902,734. In this method, a support is immersed and treated in a sodium silicate aqueous solution or electrolytically treated. As other methods, treatment is performed with potassium zirconium acid fluoride as disclosed in JP-B-36-22063, and with polyvinylsulfonic acid as disclosed in U.S. Pat. Nos. 3,276,868, 4,153,461, and 4,689,272.

The image recording material according to the present invention comprises a support having provided thereon a positive type printing material but, if necessary, an undercoating layer can be provided between them.

Various organic compounds are used as such an undercoating layer, e.g., carboxymethyl cellulose, dextrin, gum arabic, organic phosphonic acids, e.g., phosphonic acids having an amino group, such as 2-aminoethylphosphonic acid, phenylphosphonic acid which may have a substituent, naphthylphosphonic acid, alkylphosphonic acid, glycerophosphonic acid, methylenediphosphonic acid, and ethylenediphosphonic acid, organic phosphoric acid, e.g., phenylphosphoric acid which may have a substituent, naphthylphosphoric acid, alkylphosphoric acid, and glycerophosphoric acid, organic phosphinic acid, e.g., phenylphosphinic acid which may have a substituent, naphthylphosphinic acid, alkylphosphinic acid, and glycerophosphinic acid, amino acids, e.g., glycine and β-alanine, and amine hydrochloride having a hydroxyl group such as triethanolamine hydrochloride. These compounds may be used in combination of two or more.

The coating amount of the organic undercoating layer is from 2 to 200 mg/m$^2$, preferably from 5 to 100 mg/m$^2$. If the coating amount is less than 2 mg/m$^2$ or larger than 200 mg/m$^2$, sufficient press life cannot be obtained.

The thus-prepared positive type image recording material is generally subjected to imagewise exposure and development process.

Light sources having light emission wavelength in near infrared to infrared region are preferably used in the present invention. A solid state laser and a semiconductor laser are particularly preferred.

Alkali aqueous solutions so far been known can be used as a developing solution and a replenisher. For example, inorganic alkali salts such as sodium silicate, potassium silicate, tertiary sodium phosphate, tertiary potassium phosphate, tertiary ammonium phosphate, secondary sodium phosphate, secondary potassium phosphate, secondary ammonium phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide can be exemplified. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine are also used.

These alkali agents are used alone or in combination of two or more.

Of these alkali agents, a particularly preferred developing solution is an aqueous solution of silicate such as sodium silicate and potassium silicate for the reason that the adjustment of developing property becomes possible by the ratio of silicon oxide $SiO_2$, the component of silicate, to alkali metal oxide $M_2O$ and the concentrations. For example, alkali metal silicates as disclosed in JP-A-54-62004 and JP-B-57-7427 are effectively used.

It is known that when development is conducted by using an automatic processor, a vast volume of PS plates can be processed without replacing the developing solution in a developing tank for a long period of time by the addition of a replenisher having higher alkalinity than that of the developing solution to the developing solution. This system is preferably applied to the present invention. The developing solution and the replenisher can contain various surfactants and organic solvents according to necessity for purposes of accelerating or controlling development, dispersing developer scum, and increasing the affinity of the image area of a printing plate to ink. As preferred surfactants, anionic, cationic, nonionic, and ampholytic surfactants can be exemplified.

Further, a developing solution and a replenisher can contain reducing agents such as -hydroquinone, resorcin, sodium salts and potassium salts of inorganic acid such as sulfurous acid, sulfurous acid hydroacid, and further organic carboxylic acid, defoaming agents, and water softeners, if necessary.

The printing plate development processed with the above-described developing solution and the replenisher is post-treated with a washing water, a rinsing water containing surfactants, and a desensitizing solution containing gum arabic and starch derivatives. When the image recording material of the present invention is used as a printing plate, these treatments can be used in various combinations as post-treatment.

The case in which the image recording material of the present invention is used as a photosensitive lithographic printing plate is described. If an unnecessary image area is present (e.g., the film edge trace of the original film) on the lithographic printing plate obtained by image exposure, development, washing and/or rinsing and/or gumming, this unnecessary image area is erased. For this erasure, a method of coating an erasing solution on the unnecessary image area, allowing to stand for a predetermined time, and then washing with water as disclosed in JP-A-2-13293 is preferably used, but a method of irradiating the unnecessary image area with an actinic ray introduced by an optical fiber and then performing development as disclosed in JP-A-59-174842 is also utilized.

The thus-obtained lithographic printing plate can be offered to printing process after being coated with a desensitizing gum as required, but when a lithographic printing plate having higher press life is desired, the plate is subjected to burning treatment.

When a lithographic printing plate is subjected to burning treatment, it is preferred to treat the plate prior to burning with surface adjusting solutions as disclosed in JP-B-61-2518, JP-B-55-28062, JP-A-62-31859 and JP-A-61-159655.

For that treatment, a method of coating a surface adjusting solution on the lithographic printing plate using sponge or absorbent cotton impregnated with a surface adjusting solution, or a method of coating by immersing the lithographic printing plate in a vat filled with a surface adjusting solution, or a method of coating by an automatic coater can be applied. Making the coating amount uniform by means of squeegee or squeegee rollers after coating results in preferred effect.

The coating amount of a surface adjusting solution is, in general, preferably from 0.03 to 0.8 $g/m^2$ (by dry weight).

The lithographic printing plate coated with a surface adjusting solution is heated at high temperature after drying using a burning processor (e.g., Burning Processor BP-1300, commercially available from Fuji Photo Film Co., Ltd.), if necessary. The heating temperature and time depend upon the kinds of components comprising the image but are preferably from 180 to 300° C. and from 1 to 20 minutes.

The burning-treated lithographic printing plate can be arbitrarily subjected to conventional treatments such as washing and gumming according to necessity, but when a surface adjusting solution containing water-soluble high molecular compounds is used, desensitizing treatment such as gumming can be omitted.

A lithographic printing plate obtained through these processes is loaded on an offset printing machine and used for printing a lot of sheets.

EXAMPLE

The present invention is described in detail with referring to examples, but the present invention is not construed as being limited thereto.

Synthesis Example 1a

A polymer was prepared as follows. Fifteen point five (15.5) grams of 2-(perfluorooctyl)ethyl acrylate, 9.58 g of N-(4-chloro-2-carboxyphenyl)methacrylamide, 7.62 g of lauryl methacrylate, and 63.14 g of tetrahydrofuran were put in a three necked flask having a capacity of 300 ml and the content of the flask was stirred under nitrogen atmosphere with maintaining the temperature at 65° C. Thereto was added 1.44 g of 2,2'-azobis(2,4-dimethylvaleronitrile) and stirring was continued. After 4 hours, the temperature was raised to 68° C. and the reaction solution was allowed to stand for 1 hour. After termination of the reaction, the temperature was lowered to room temperature and the reaction solution was poured into 400 ml of methanol. The solid precipitated was filtered and dried.

Yield: 22 g. The solid obtained was revealed to be a high molecular compound having a weight average molecular weight of 18,000 by GPC (gel permeation chromatography).

Synthesis Examples 2a to 5a

Polymers as shown in Table 1a below were prepared in the same manner as in Synthesis Example 1a. A comparative compound (polymer) was also prepared in the same manner.

TABLE 1a

| Synthesis Example | Polymer Name | Polymer Composition | Weight Average Molecular Weight |
|---|---|---|---|
| 1a | Pa-1 | | 18,000 |
| 2a | Pa-2 | | 30,000 |
| 3a | Pa-3 | | 21,000 |
| 4a | Pa-4 | | 20,000 |

TABLE 1a-continued

| Synthesis Example | Polymer Name | Polymer Composition | Weight Average Molecular Weight |
|---|---|---|---|
| 5a Comparison | Pa-6 | | 15,000 |
| | Ra-1 | 2-(Perfluorooctyl)ethyl Acrylate (0.3 mol)<br>Lauryl Methacrylate (0.3 mol)<br>N-(p-Carboxyphenyl)meth-acrylamide (0.4 mol) | 24,000 |

Examples 1a to 4a and Comparative Examples 1a and 2a

In the following examples and comparative examples "%" means "wt %" unless otherwise indicated.

An aluminum plate (JIS A 1050) having a thickness of 0.24 mm was subjected to brush-graining treatment with applying to the aluminum surface a suspension of pumice stone having an average particle size of about 2.1 $\mu$m and water using a rotating brush shown below. The first brush was, hair length: 100 mm, hair diameter: 0.95 mm, and density: 70/cm$^2$, and the second brush was, hair length: 80 mm, hair diameter: 0.295 mm, and density: 670/cm$^2$. The rotation rate of brush rolls was 250 rpm respectively. After brush-graining, the plate was thoroughly washed with water, etching was effected by immersing the plate in a 10% sodium hydroxide aqueous solution at 60° C. for 25 seconds, the plate was further washed with flowing water, then washed with a 20% nitric acid aqueous solution for neutralization followed by washing with water. Under the condition of $V_A$ of 12.7 V using alternating waveform electric current of sine wave, the plate was subjected to electrolytic surface roughening treatment in a 1% nitric acid aqueous solution by the quantity of electricity of anode of 160 C/dm$^2$. The surface roughness determined was 0.79 $\mu$m (Ra). Subsequently, the plate was immersed in a 1% sodium hydroxide aqueous solution at 40° C. for 30 seconds, then immersed in a 30% sulfuric acid aqueous solution and desmutting treatment was performed at 60° C. for 40 seconds. Then, the plate was anodically oxidized by direct current in a 20% sulfuric acid aqueous solution at electric density of 2 A/dm$^2$ so as to reach the oxide film amount of 1.6 g/m$^2$, thereby a substrate was prepared.

Undercoating solution (A) having the following composition was coated on the surface of the thus treated substrate and dried at 80° C. for 30 seconds.

The coating amount after drying was 10 mg/m$^2$.

| Undercoating Solution (A) | |
|---|---|
| β-Alanine | 0.10 g |
| Methanol | 40 g |
| Pure water | 60 g |

Thus, substrate (I) was prepared. oxidized by direct current in a 20% sulfuric acid aqueous solution The photosensitive solution shown in Table 2a below was coated on substrate (I) by rod coating in an amount of 12 ml/m$^2$, dried at 100° C. for 1 minute, thereby a positive type photosensitive lithographic printing plate was obtained. Dry coating amount was 1.15 g/m$^2$. For shortening vacuum contact time, a matting layer was provided as disclosed in JP-B-61-28986.

TABLE 2a

| Photosensitive Solution | |
|---|---|
| Esterified product of 1,2-diazonaphthoquinone-5-sulfonyl chloride and pyrogallol/acetone resin (disclosed in Example 1 in U.S. Pat. No. 3,635,709) | 0.8 g |
| Cresol/formaldehyde novolak resin (meta/para ratio of 6/4, weight average molecular weight: 8,000) | 1.5 g |
| Phenol/formaldehyde novolak resin (weight average molecular weight: 15,000) | 0.3 g |
| Poly[N-(p-aminosulfonylphenyl)acrylamide-co-n-butyl acrylate-co-diethylene glycol monomethyl ether methacrylate] (molar ratio of each monomer is 40/40/20, weight average molecular weight: 40,000, number average molecular weight: 20,000) | 0.2 g |
| p-n-Octylphenol/formaldehyde resin (disclosed in U.S. Pat. No. 4,123,279) | 0.02 g |
| Naphthoquinonediazido-1,2-diazido-4-sulfonic acid chloride | 0.01 g |
| Tetrahydrophthalic anhydride | 0.02 g |
| Benzoic acid | 0.02 g |
| Pyrogallol | 0.05 g |
| 4-[p-N,N-bis(Ethoxycarbonylmethyl)aminophenyl]-2,6-bis(trichloromethyl)-s-triazine | 0.07 g |
| A dye obtained by replacing the counter anion of Victoria Pure Blue BOH (manufactured by Hodogaya Chemical Co., Ltd.) with 1-naphthalenesulfonic acid | 0.045 g |
| F176PF | 0.01 g |
| Fluorine-containing polymer (see Table 3a) | 0.1 g |
| MEK/1-methoxy-2-propanol = 15 g/10 g | |

Each of the thus-prepared photosensitive lithographic printing plates was evaluated as follows.

The lithographic printing plate was exposed by a metal halide lamp of 3 kW from the distance of 1 m for 1 minute through a step wedge (density difference of each step was 0.15, manufactured by Fuji Photo Film Co., Ltd.). The exposed plate was development processed in PS Processor 900V (manufactured by Fuji Photo Film Co., Ltd.) at 30° C. for 12 seconds using an aqueous solution having a molar ratio of SiO$_2$/K$_2$O of 1.16 and SiO$_2$ concentration of 1.4%. Sensitivity was expressed by clear step number. The higher the step number, the higher is the sensitivity.

Gradation was the difference between the above clear step number in the sensitivity evaluation and solid step number. The smaller the value, the higher is the contrast.

Exposure and development were carried out in the same manner as above except that the same developing solution as above in which pH was increased or decreased by 0.2 up and down was used. The development latitude expressed the change of solid step number due to pH. The smaller the value, the more excellent is the development latitude.

The results obtained are shown in Table 4a below.

TABLE 3a

| | Fluorine-Containing Polymer |
|---|---|
| Example 1a | Pa-1 |
| Example 2a | Pa-2 |
| Example 3a | Pa-3 |
| Example 4a | Pa-6 |

TABLE 3a-continued

| | Fluorine-Containing Polymer |
|---|---|
| Comparative Example 1a | Not added |
| Comparative Example 2a | Ra-1 |

The addition amount was 0.1 g in solid content.

TABLE 4a

| | Fluorine-containing Polymer | Sensitivity | Gradation | Development Latitude |
|---|---|---|---|---|
| Example 1a | Pa-1 | 5.75 | 5.0 | 6 |
| Example 2a | Pa-2 | 6.0 | 4.5 | 4 |
| Example 3a | Pa-3 | 5.75 | 5.0 | 5 |
| Example 4a | Pa-6 | 6.0 | 5.0 | 7 |
| Comparative Example 1a | Not added | 5.75 | 6.5 | 8 |
| Comparative Example 2a | Ra-1 | 6.0 | 7.0 | 9 |

As is apparent from the results in Table 4a, in Examples 1a to 4a, enhancement of high contrast and excellent development latitude could be obtained without lowering the sensitivity.

Examples 5a to 9a and Comparative Example 3a

A 1S aluminum plate having a thickness of 0.30 mm was subjected to brush-graining treatment using a No. 8 nylon brush and a suspension of 800 mesh pumice and water, and the surface of the plate was thoroughly washed with water. The etching was effected by immersing the plate in a 10% sodium hydroxide aqueous solution at 70° C. for 60 seconds, the plate was further washed with flowing water, then washed with a 20% $HNO_3$ aqueous solution for neutralization followed by washing with water. Under the condition of $V_A$ of 12.7 V using alternating waveform electric current of sine wave, the plate was subjected to electrolytic surface roughening treatment in a 1% nitric acid aqueous solution by the quantity of electricity of anode of 300 $C/dm^2$. The surface roughness determined was 0.45 μm (Ra). Subsequently, the plate was immersed in a 30% $H_2SO_4$ aqueous solution and desmutting treatment was performed at 55° C. for 2 minutes. Then, the cathode was arranged on the surface subjected to graining treatment in a 20% $H_2SO_4$ aqueous solution at 33° C., and the plate was anodically oxidized at electric density of 5 $A/dm^2$ for 50 seconds. The oxide film obtained had an oxide film amount of 2.7 $g/m^2$.

Further, the plate was immersed in a 2.5 wt % aqueous solution of sodium silicate ($SiO_2$: 28 to 30%, $Na_2O$: 9 to 10%, Fe: 0.02% or less) having pH of 11.2 at 70° C. for 13 seconds followed by washing with water. The amount of silicate at that time was 10 $mg/m^2$. The amount of Si element was measured by fluorescent X-ray analysis.

A liquid composition (sol) of SG method was prepared by the following procedure.

Each of the following composition was weighed and put in a beaker and stirred at 25° C. for 20 minutes.

| | |
|---|---|
| $Si(OC_2H_5)_4$ | 38 g |
| 3-Methacryloxypropyltrimethoxysilane | 13 g |
| A 85% phosphoric acid aqueous solution | 12 g |
| Ion exchange water | 15 g |
| Methanol | 100 g |

The solution was poured from the beaker to a three necked flask. A reflux cooler was attached to the three necked flask and the flask was immersed in an oil bath at room temperature. The temperature was raised to 50° C. over 30 minutes while stirring the content of the flask with a magnetic stirrer. The content of the flask was allowed to react for further 1 hour while maintaining the temperature of the oil bath at 50° C., thereby a liquid composition (sol) was obtained.

The sol was diluted with methanol/ethylene glycol (ratio of 20/1 (by weight)) so as to reach the concentration of 0.5 wt %, and coated on the substrate by a wheeler, then dried at 100° C. for 1 minute. The coating amount at that time was 4 $mg/m^2$. The amount of Si element was measured by fluorescent X-ray analysis and the obtained amount was taken as the coating amount.

On the thus-treated aluminum plate was coated high sensitivity photopolymerizable composition 1 as shown below so that dry coating amount became 1.5 $g/m^2$, and dried at 100° C. for 1 minute, thereby a photosensitive layer was formed.

| Photopolymerizable Composition 1 | |
|---|---|
| Tetramethylolmethane tetraacrylate | 1.5 g |
| Linear organic high polymer (B1) allyl methacrylate/methacrylic acid copolymer (copolymerization molar ratio: 80/20) | 2.0 g |
| Sensitizer (C1) | 0.15 g |

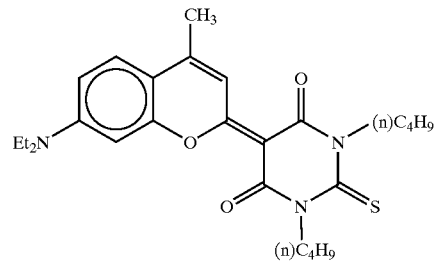

($\lambda_{max}$ = 479 nm (in THF), $\epsilon$ = 6.9 × $10^4$)

| | |
|---|---|
| Photopolymerization Initiator (D1) | 0.2 g |

-continued

Photopolymerizable Composition 1

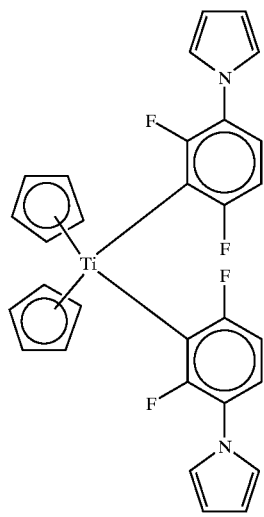

| | |
|---|---|
| IRGACURE 907 (E1) (manufactured by Ciba Geigy Co.) | 0.4 g |
| Fluorine-containing polymer (Pa) | 0.2 g |
| Dispersion of ε-phthalocyanine/(B1) | 0.2 g |
| Fluorine-based nonionic surfactant Megafac F177 (manufactured by Dainippon Chemicals and Ink Co., Ltd.) | 0.03 g |
| Methyl ethyl ketone | 9.0 g |
| Propylene glycol monomethyl ether acetate | 7.5 g |
| Toluene | 11.0 g |

On this photosensitive layer was coated a 3 wt % polyvinyl alcohol aqueous solution (saponification degree: 98 mol %, polymerization degree: 500) as an oxygen-cutting off protective layer in a dry coating amount of 2.5 g/m$^2$, and then dried at 120° C. for 3 minutes. Thus, a photopolymerizable lithographic printing plate was obtained.

The plate was exposed from 1% to 99% every 1% each at two places by the condition of 0.15 mJ/cm$^2$, 4,000 dpi, 175 lines/inch using XLP4000 (Ar laser 75 mW, 488 nm, manufactured by Optoronics Co., Ltd.).

Subsequently, post-heat treatment was conducted by exposing the plate to temperature of 120° C. for 20 seconds.

Development was carried out by immersion in the following developing solution at 25° C. for 30 seconds.

| Developing Solution | |
|---|---|
| 1K Potassium silicate | 30 g |
| Potassium hydroxide | 15 g |
| Water | 1,000 g |

Gum solution GU-7 (manufactured by Fuji Photo Film Co., Ltd.) was diluted with water to 2 times and the printing plate was treated with this solution.

Under the condition of 4,000 dpi and 175 lines/inch, the amount of the printing plate energy reproduced by 1% was found as the sensitivity of the sample.

Press life was measured by using SORKZ (manufactured by Heidelberg) as a printing machine, Kraf G (N) (manufactured by Dainippon Chemicals and Ink Co., Ltd.) as ink, and acidic PS plate cleaner CL-2 (manufactured by Fuji Photo Film Co., Ltd.) as a plate cleaner.

After each sample was stored at 60° C. for three days, exposure, development and printing were performed in the same manner as above. The scum of nonimage area was visually observed and aging stability was evaluated.

After 5,000 sheets were printed, the ink adhered to the plate was cleaned by wiping the dot area with printing sponge impregnated with PS plate cleaner CL-2. Then, 150,000 sheets were printed with cleaning the ink on the plate in the same manner as above with PS plate cleaner CL-2 every 10,000 sheets until the printed number reached 145,000.

A printed matter was taken out every 10,000 sheets and the dot where the plate was cleaned with PS plate cleaner CL-2 and the dot not cleaned were evaluated. The results obtained are shown in Table 5a below.

Solid press life indicates the sheet number which can be printed normally without dropout occurring in solid printing and highlight press life shows the number of printed sheets reproduced by 2% dot of 175 lines/inch on the printed matter.

Gradation was the difference between the above clear step number in the sensitivity evaluation and solid step number. The smaller the value, the higher is the contrast.

TABLE 5a

| | Fluorine-Containing Polymer | Gray Scale Step Number (solid/tail) | Grada-tion | Press Life (number of printed sheet) | |
|---|---|---|---|---|---|
| | | | | Solid | Highlight |
| Example 5a | Pa-2 | 3.0/8.0 | 5 | 10 | 6 |
| Example 6a | Pa-4 | 3.0/8.0 | 5 | 10 | 6 |
| Example 7a | Pa-6 | 3.0/8.0 | 5 | 10 | 6 |
| Example 8a | Pa-14 | 3.0/8.0 | 5 | 10 | 6 |
| Example 9a | Pa-15 | 3.0/8.0 | 5 | 10 | 6 |
| Comparative Example 3a | Not added | 2.0/8.0 | 6 | 10 | 6 |

It is apparently seen from the results in Table 5a that in the photosensitive lithographic printing plate according to the present invention, the enhancement of high contrast of the image of the printing plate can be realized while maintaining the press life by the use of the fluorine-containing polymer of the present invention in the photosensitive resin composition.

Examples of thermally crosslinkable lithographic printing plate are described below.

Structure of Crosslinking Agent KZ-1

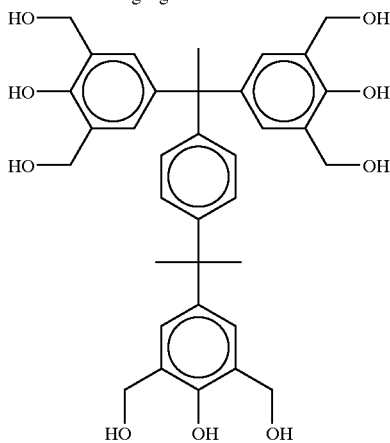

Structure of Crosslinking Agent KZ-2

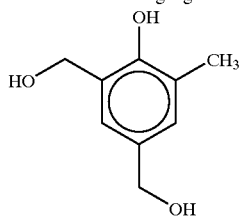

Acquisition of Binder Polymer (BP-1)

Poly(p-hydroxystyrene) (trade name, Maruka Linker M S-4P) was acquired from Maruzen Petrochemical Co., Ltd. and this was used as BP-1.

Examples 10a to 13a

An aluminum plate (quality of material 1050) having a thickness of 0.30 mm was washed and degreased with trichloroethylene, then subjected to brush-graining treatment using a nylon brush and a suspension of 400 mesh pumice and water, and the surface of the plate was thoroughly washed with water. The etching was effected by immersing the plate in a 25% sodium hydroxide aqueous solution at 45° C. for 9 seconds, the plate was further washed with water, then further immersed in a 2% $HNO_3$ aqueous solution for 20 seconds followed by washing with water. The etching amount of the grained surface at this time was about 3 $g/m^2$. The plate was anodically oxidized by direct current with a 7% $H_2SO_4$ aqueous solution being an electrolytic solution at electric density of 15 $A/dm^2$. The oxide film obtained was 3 $g/m^2$. The plate was then washed with water and dried. Undercoating solution having the following composition was coated on this aluminum plate and dried at 80° C. for 30 seconds. The coating amount after drying was 10 $mg/m^2$.

| Undercoating Solution | |
|---|---|
| β-Alanine | 0.1 g |
| Phenylphosphonic acid | 0.05 g |
| Methanol | 40 g |
| Pure water | 60 g |

Solution (G) having the following composition was prepared. This solution was coated on the above undercoated aluminum plate, dried at 100° C. for 1 minute, thereby a negative type lithographic printing plate materials (G-1) to (G-4) were obtained. The coating amount after drying was 1.5 $g/m^2$.

| Solution (G) | |
|---|---|
| Fluorine-containing polymer | 0.05 g |
| Acid generator (SH-1) | 0.3 g |
| Crosslinking agent | 0.5 g |
| Binder polymer (BP-1) | 1.5 g |
| Infrared absorber (IK-1) | 0.07 g |
| AIZEN SPILON BLUE C-RH (manufactured by Hodogaya Chemical Co., Ltd.) | 0.035 g |
| Megafac F177 (fluorine-based nonionic surfactant, manufactured by Dainippon Chemicals and Ink Co., Ltd.) | 0.01 g |
| Methyl ethyl ketone | 12 g |
| Methyl alcohol | 10 g |
| 1-Methoxy-2-propanol | 8 g |

Fluorine-containing polymers and crosslinking agents used in solutions (G-1) to (G-4) are shown in Table 6a below. Acid generator (SH-1) and infrared absorber (IK-1) are shown below.

TABLE 6a

| Example No. | Kind of Lithographic Printing Plate Material | Kind of Fluorine-Containing Polymer | Kind of Crosslinking Agent |
|---|---|---|---|
| Example 10a | (G-1) | (Pa-1) | (KZ-1) |
| Example 11a | (G-2) | (Pa-2) | (KZ-1) |
| Example 12a | (G-3) | (Pa-3) | (KZ-1) |
| Example 13a | (G-4) | (Pa-4) | (KZ-2) |

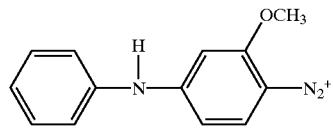

[SH-1]

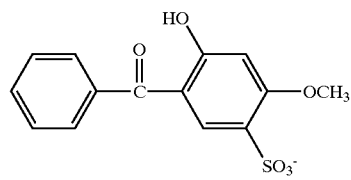

[IK-1]

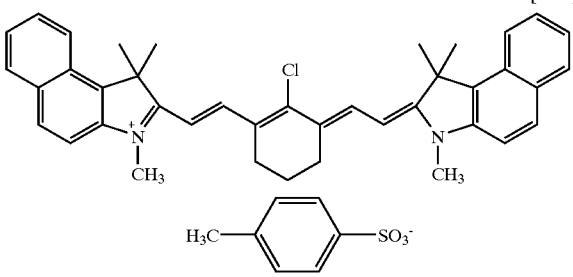

The surface of each of the obtained negative type lithographic printing plate materials (G-1) to (G-4) was touched with a bare hand, then each plate was scanning-exposed with a semiconductor laser emitting infrared rays of wavelengths of about 820 to 850 nm. After exposure, the plate was heat-treated at 110° C. for 30 seconds using a panel heater, and development processed with a developing solution DP-4 (diluted with water to 8 times, manufactured by Fuji Photo Film Co., Ltd.). After image formation, the part where touched with a bare hand was observed visually whether the image was dropped out or not. In negative type lithographic printing plate materials (G-1) to (G-4), apparent image dropout was not generated.

Comparative Example 4a

A solution was prepared in the same manner as in Example 10a except that the fluorine-containing polymer used in Solution (G) in Example 10a was replaced with high polymer compound (Ra-1). This solution was coated on the undercoated aluminum plate used in Example 10a, dried at 100° C. for 1 minute, thereby negative type lithographic printing plate material (Q-1) was obtained. The weight after drying was 1.5 g/m². An image was formed by the same procedure as in Example 10a using the obtained lithographic printing plate material (Q-1). After image formation, the part where touched with a bare hand was observed visually whether the image was dropped out or not. In negative type lithographic printing plate material (Q-1), apparent image dropout was generated.

Examples of thermal positive type lithographic printing plate are described below.

Preparation of Copolymer 1

Four point six one (4.61) grams (0.0192 mol) of N-(p-aminosulfonylphenyl)methacrylamide, 2.94 g (0.0258mol) of ethyl methacrylate, 0.80 g (0.015 mol) of acrylonitrile, and 20 g of N,N-dimethylacetamide were added to a three necked flask equipped with a stirrer, a condenser and a dropping funnel having a capacity of 20 ml, and the mixture was stirred with heating at 65° C. in a hot water bath. To the mixture was added 0.15 g of V-65 (a product of Wako Pure Chemical Co., Ltd.) and the mixture was stirred in nitrogen atmosphere for 2 hours with maintaining the temperature at 65° C. Further, a mixture of 4.61 g of N-(p-aminosulfonylphenyl)methacrylamide, 2.94 g of ethyl methacrylate, 0.80 g of acrylonitrile, N,N-dimethylacetamide and 0.15 g of V-65 was dropwise added to this reaction solution by means of a dropping funnel over 2 hours. After termination of the dropwise addition, the reaction mixture was stirred for further 2 hours at 65° C. After completion of the reaction, 40 g of methanol was added thereto and cooled. The mixture obtained was put in 2 liters of water with stirring the water and stirring was continued for 30 minutes. The precipitated product was filtered and dried, thereby 15 g of white solid was obtained. This copolymer 1 was found to have a weight average molecular weight (polystyrene standard) of 53,000 by gel permeation chromatography.

Preparation of Substrate

An aluminum plate (quality of material 1050) having a thickness of 0.30 mm was washed with trichloroethylene and degreased, then subjected to brush-graining treatment using a nylon brush and a suspension of 400 mesh pumice and water, and the surface of the plate was thoroughly washed with water. The etching was effected by immersing the plate in a 25% sodium hydroxide aqueous solution at 45° C. for 9 seconds, the plate was further washed with water, then further immersed in a 20% nitric acid aqueous solution for 20 seconds followed by washing with water. The etching amount of the grained surface at this time was about 3 g/m². The plate was anodically oxidized by direct current with a 7% sulfuric acid aqueous solution being an electrolytic solution at electric density of 15 A/dm². The oxide film obtained was 3 g/m². The plate was then washed with water and dried. Undercoating solution having the following composition was coated on this aluminum plate and dried at 90° C. for 1 minute. The coating amount after drying was 10 mg/m².

| Undercoating Solution | |
|---|---|
| β-Alanine | 0.5 g |
| Methanol | 95 g |
| Pure water | 5 g |

Further, the plate was treated with a 2.5 wt % aqueous solution of sodium silicate 30° C. for 10 seconds. Undercoating solution having the following composition was coated on this aluminum plate and dried at 80° C. for 15 seconds, thereby a substrate was obtained. The coating amount after drying was 15 mg/m².

| Undercoating Solution | |
|---|---|
| The compound shown below | 0.3 g |
| Methanol | 100 g |
| Water | 1 g |

—(CH₂—CH)₈₅—   —(CH₂—CH)₁₅—

(structure with phenyl-COOH group on left unit, and phenyl-CH₂N⁺Et₃Cl⁻ group on right unit)

Molecular weight: 28,000

Example 14a

The following photosensitive solution 1 was prepared. This photosensitive solution 1 was coated on the above-prepared substrate in a coating amount of 1.8 g/m², and a lithographic printing plate was obtained.

| Photosensitive Solution 1 | |
|---|---|
| Fluorine-containing polymer (Pa-1) | 0.03 g |
| Above-prepared copolymer 1 | 0.75 g |
| m-Cresol/p-cresol novolak resin (m/p ratio: 6/4, weight average molecular weight: 3,500, 0.5 wt % of unreacted cresol was contained) | 0.25 g |
| p-Toluenesulfonic acid | 0.003 g |
| Tetrahydrophthalic anhydride | 0.03 g |
| A cyanine dye (having the following structure) | 0.017 g |
| A dye obtained by replacing the counter ion of Victoria Pure Blue BOH with 1-naphthalenesulfonic acid anion | 0.015 g |
| Megafac F177 (fluorine-based nonionic surfactant, manufactured by Dainippon Chemicals and Ink Co., Ltd.) | 0.05 g |
| γ-Butyrolactone | 10 g |
| Methyl ethyl ketone | 10 g |
| 1-Methoxy-2-propanol | 1 g |

Cyanine Dye A

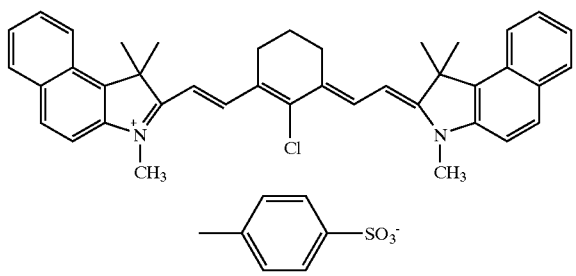

The developing stability against scratch of the lithographic printing plate obtained was evaluated. The results obtained are shown in Table 7a below.

Developing Stability Against Scratch

The lithographic printing plate obtained was exposed using a semiconductor laser having output of 500 mW, wavelength of 830 nm and beam diameter of 17 μm ($1/e^2$), at main scanning rate of 5 m/sec. The scratching test was effected using a continuous load-scratching tester model SB62 (manufactured by Shinto Kagaku Co. Ltd.) by sticking a No. 5 filter paper manufactured by Advantec Toyo Co., Ltd. on the square flat surface of 1 cm² of the scratch jig which makes in contact with the plate, applying 100 g of load thereto, and effecting scratching at a rate of 6 cm/sec, and then developing the plate using a developing solution DP-4 (dilution: 1/8, manufactured by Fuji Photo Film Co., Ltd.). The evaluation was based on the following criteria:

C: Photosensitive film at the part scratched was completely dissolved.
B: Photosensitive film at the part scratched was partially dissolved.
A: Photosensitive film at the part scratched was not dissolved at all.

TABLE 7a

| Example No. | Developing Stability against Scratch |
|---|---|
| Example 14a | A |
| Example 15a | A |
| Example 16a | A |
| Comparative Example 5a | C |

Examples 15a and 16a, Comparative Example 5a

Lithographic printing plates were prepared in the same manner as in Example 14a except for using fluorine-containing polymers Pa-2 and Pa-5 were used in place of Pa-1. Comparative Example 5a did not contain the fluorine-containing polymer according to the present invention. The developing stability against scratch of each of the lithographic printing plates obtained was evaluated in the same manner as in Example 14a. The results obtained are shown in Table 7a above.

It can be seen from the results in Table 7a that developing stability against scratch before development is conspicuously improved by the addition of the specific polymer.

A photosensitive resin composition containing the first fluorine-containing polymer was given image-forming property of high contrast, satisfying antihalation, safelight tolerance and development latitude without decreasing the sensitivity by the addition of a specific fluorine-containing polymer.

Synthesis examples of the second fluorine-containing polymers and examples are described below but the present invention is not limited thereto.

Synthesis Example 1b

Twenty-five point six (25.6) grams of the above-described compound (1b-5) as constituting unit (1), 26.4 g of the above-described compound (2b-7) as constituting unit (2), 20.4 g of lauryl methacrylate as constituting unit (3), and 160 g of dimethylacetamide were put in a three necked flask having a capacity of 500 ml and stirred in nitrogen atmosphere with maintaining the temperature at 65° C. Two point three zero (2.30) grams of 2,2'-azobis(2,4-dimethylvaleronitrile) was added thereto and stirring was continued. Four hours after the addition of 2,2'-azobis (2,4-dimethylvaleronitrile), the temperature was raised to 75° C. and maintained that temperature for 1 hour. After termination of the reaction, the temperature was lowered to room temperature and the reaction mixture was poured into 400 ml of water. The solid precipitated was filtered and dried.

Yield: 68.4 g. The solid obtained was revealed to be a high molecular compound having a weight average molecular weight of 25,000 by GPC (a fluorine-containing polymer, corresponding to Pb-5).

Synthesis Examples 2b to 4b

Copolymers shown in Table 1b were prepared in the same manner as in Synthesis Example 1b except that the constitution units (1), (2) and (3) in Synthesis Example 1b were changed. Comparative polymers shown in Table 1b were prepared in the same manner as in Synthesis Example 1b except for using the materials shown in Table 1b.

TABLE 1b

| Synthesis Example No. | Polymer Name | Polymer Composition | Weight Average Molecular Weight |
|---|---|---|---|
| 1b | Pb-5 | | 25,000 |
| 2b | Pb-3 | | 28,000 |
| 3b | Pb-6 | | 24,000 |
| 4b | Pb-8 | | 22,000 |
| Comparative Example | Rb-1 | (structure with $C_8H_{17}$, $CO_2$, 50) | 21,000 |
| Comparative Example | Rb-2 | (Cpd. 1–5)$_{20}$(Cpd. 2–7)$_{40}$(methyl methacrylate)$_{40}$ | 23,000 |

For Rb-1: structure with 50 subscript, CO(OC$_2$H$_4$)$_{20}$OCH$_3$

Examples 1b to 4b and Comparative Examples 1b to 3b

An aluminum plate (JISA 1050) having a thickness of 0.24 mm was subjected to brush-graining treatment with applying to the aluminum surface a suspension of pumice having an average particle size of about 2.1 μm and water using a rotating brush shown below. The first brush was, hair length: 100 mm, hair diameter: 0.95 mm, and density: 70/cm², and the second brush was, hair length: 80 mm, hairdiameter: 0.295 mm, and density: 670/cm². The rotation rate of brush rolls was 250 rpm respectively. After brush-graining, the plate was thoroughly washed with water, etching was effected by immersing the plate in a 10% sodium hydroxide aqueous solution at 60° C. for 25 seconds, the plate was further washed with flowing water, then washed with a 20% nitric acid aqueous solution for neutralization followed by washing with water. Under the condition of $V_A$ of 12.7 V using alternating waveform electric current of sine wave, the plate was subjected to electrolytic surface roughening treatment in a 1% nitric acid aqueous solution by the quantity of electricity of anode of 160 C/dm². The surface roughness determined was 0.79 μm (Ra). Subsequently, the plate was immersed in a 1% sodium hydroxide aqueous solution at 40° C. for 30 seconds, then immersed in a 30% sulfuric acid aqueous solution and desmutting treatment was performed at 60° C. for 40 seconds. Then, the plate was anodically oxidized by direct current in a 20% sulfuric acid aqueous solution at electric density of 2A/dm² so as to reach the oxide film amount of 1. 6 g/m², thereby a substrate was prepared.

Undercoating solution (A) having the following composition was coated on the surface of the-thus treated substrate and dried at 80° C. for 30 seconds.

The coating amount after drying was 10 mg/m².

| Undercoating Solution (A) | |
|---|---|
| β-Alanine | 0.10 g |
| Methanol | 40 g |
| Pure water | 60 g |

Thus, substrate (I) was prepared.

The photosensitive solution shown in Table 2b below was coated on substrate (I) by rod coating in an amount of 12 ml/m², dried at 100° C. for 1 minute, thereby obtaining a positive type photosensitive lithographic printing plate. Dry coating amount was 1.15 g/m². For shortening vacuum contact time, a matting layer was provided as disclosed in JP-B-61-28986.

TABLE 2b

| Photosensitive Solution | |
|---|---|
| Esterified product of 1,2-diazonaphthoquinone-5-sulfonyl chloride and pyrogallol/acetone resin (disclosed in Example 1 in U.S. Pat. No. 3,635,709) | 0.8 g |
| Cresol/formaldehyde novolak resin (meta/para ratio of 6/4, weight average molecular weight: 8,000) | 1.5 g |
| Phenol/formaldehyde novolak resin (weight average molecular weight: 15,000) | 0.2 g |
| Naphthoquinonediazido-1,2-diazido-4-sulfonic acid chloride | 0.02 g |
| Tetrahydrophthalic anhydride | 0.16 g |
| 4-[p-N,N-bis(Ethoxycarbonylmethyl)aminophenyl]-2,6-bis(trichloromethyl)-s-triazine (hereinafter abbreviated to triazine A) | 0.07 g |
| A dye obtained by replacing the counter anion of Victoria Pure Blue BOH (manufactured by Hodogaya Chemical Co., Ltd.) with 1-naphthalenesulfonic acid | 0.045 g |
| F176PF | 0.01 g |
| Fluorine-containing polymer (see Table 3b) | 0.1 g |
| MEK/1-methoxy-2-propanol = 15 g/10 g | |

Each of the thus-prepared photosensitive lithographic printing plates was evaluated as follows.

The lithographic printing plate was exposed by a metal halide lamp of 3 kW from the distance of 1 m for 1 minute through a step wedge (density difference of each step was 0.15, manufactured by Fuji Photo Film Co., Ltd.). The exposed plate was development processed in PS Processor 900U (manufactured by Fuji Photo Film Co., Ltd.) at 30° C. for 12 seconds using an aqueous solution having a molar ratio of $SiO_2/K_2O$ of 1.16 and $SiO_2$ concentration of 1.4%. Sensitivity was expressed by clear step number (No. of the step where the composition was eluted). The higher the step number, the higher is the sensitivity.

Gradation was the difference between the above clear step number in the sensitivity evaluation and solid step number (No. of the step where the composition was not eluted). The smaller the value, the higher is the contrast.

Exposure and development were carried out in the same manner as above except that the same developing solution as above in which pH was increased or decreased by 0.2 up and down was used. The development latitude expressed as the change of solid step number due to pH. The smaller the value, the more excellent is the development latitude.

The results obtained are shown in Table 4b below.

TABLE 3b

| | Fluorine-Containing Polymer |
|---|---|
| Example 1b | Pb-5 |
| Example 2b | Pb-3 |
| Example 3b | Pb-6 |
| Example 4b | Pb-8 |
| Comparative Example 1b | Not added |
| Comparative Example 2b | Rb-1 |
| Comparative Example 3b | Rb-2 |

The addition amount was 0.1 g in solid content.

TABLE 4b

| | Fluorine-containing Polymer | Sensitivity | Gradation | Development Latitude |
|---|---|---|---|---|
| Example 1b | Pb-5 | 5.0 | 5.5 | 6 |
| Example 2b | Pb-3 | 5.0 | 5.0 | 5 |
| Example 3b | Pb-6 | 5.0 | 5.5 | 6 |
| Example 4b | Pb-8 | 5.0 | 6.0 | 7 |
| Comparative Example 1b | Not added | 5.0 | 6.5 | 8 |
| Comparative Example 2b | Rb-1 | 6.5 | 8.0 | 10 |
| Comparative Example 3b | Rb-2 | 5.0 | 7.0 | 9 |

As is apparent from the results in Table 4b, in Examples 1b to 4b, enhancement of high contrast and excellent development latitude could be obtained without lowering the sensitivity.

Examples 5b to 7b and Comparative Example 4b

An aluminum plate (JIS A 1050) having a thickness of 0.24 mm was subjected to brush-graining treatment using a nylon brush and a suspension of 400 mesh pumice and water, and the surface of the plate was thoroughly washed with water. The etching was effected by immersing the plate in a 10% sodium hydroxide aqueous solution at 70° C. for 60 seconds, the plate was further washed with flowing water, then washed with a 20% $HNO_3$ aqueous solution for neutralization followed by washing with water. Under the condition of $V_A$ of 12.7 V using alternating waveform electric current of sine wave, the plate was subjected to electrolytic surface roughening treatment in a 1% nitric acid aqueous solution by the quantity of electricity of anode of 160 $C/dm^2$. The surface roughness determined was 0.6 μm (Ra). Subsequently, the plate was immersed in a 30% $H_2SO_4$ aqueous solution and desmutting treatment was performed at 55° C. for 2 minutes. Then, the plate was anodically oxidized in a 20% $H_2SO_4$ aqueous solution at electric density of 14 $A/dm^2$ so as to reach the anodic oxidation film amount of 2.5 $g/m^2$, then plate was washed with water. Thus, substrate (A) was obtained.

Substrate (A) was treated in a 2.5 wt % aqueous solution of sodium silicate at 30° C. for 20 seconds, the plate was washed with water, thereby substrate (B) was prepared.

On the surface of the thus-treated substrate (B) was coated undercoating solution (I) having the composition shown below and dried at 70° C. for 10 seconds. The coating amount after drying was 15 $mg/m^2$.

| Undercoating Solution (I) | |
| --- | --- |
| Polyvinyl benzoic acid (Mw: 42,000) | 0.3 g |
| Methanol | 100 g |
| Water | 1 g |

The same photosensitive layer and matting layer as in Examples 1b to 4b were provided on the substrate.

Each of the thus-prepared photosensitive lithographic printing plates was evaluated as follows. The lithographic printing plate was exposed by a metal halide lamp of 3 kW from the distance of 1 m for 30 seconds through a step wedge (density difference of each step was 0.15, manufactured by Fuji Photo Film Co., Ltd.). The exposed plate was development processed in PS Processor 900U (manufactured by Fuji Photo Film Co., Ltd.) at 30° C. for 12 seconds using the developing solution a shown in Table 5b below (pH: about 13.0). Sensitivity was expressed by clear step number. The higher the step number, the higher is the sensitivity.

Gradation was the difference between the above clear step number in the sensitivity evaluation and solid step number. The smaller the value, the higher is the contrast.

Exposure and development were carried out in the same manner as above except that the same developing solution as above in which pH was increased or decreased by 0.2 up and down was used. The development latitude expressed the change of solid step number due to pH. The smaller the value, the more excellent is the development latitude.

TABLE 5b

| Developing Solution a | |
| --- | --- |
| D-Sorbitol | 5.1 wt % |
| Sodium hydroxide | 1.1 wt % |
| Triethanolamine/ethylene oxide adduct (30 mol) | 0.03 wt % |
| Water | 93.8 wt % |

The results obtained are shown in Table 6b below.

TABLE 6b

| Example No. | Fluorine-Containing Polymer | Sensitivity | Gradation | Development Latitude |
| --- | --- | --- | --- | --- |
| Example 5b | Pb-5 | 3.0 | 4.0 | 5.5 |
| Example 6b | Pb-6 | 3.0 | 3.75 | 4.38 |
| Example 7b | Pb-8 | 3.0 | 4.0 | 6.5 |
| Comparative Example 4b | Not added | 3.0 | 5.0 | 8.0 |

As is apparent from the results in Table 6b, in Examples 5b to 7b, enhancement of high contrast and excellent development latitude could be obtained without lowering the sensitivity even if the support and the developing solution were changed.

A positive type photosensitive composition was given image-forming property of high contrast, satisfying antihalation, safelight tolerance and development latitude without decreasing the sensitivity by the addition of a specific fluorine-containing polymer.

Synthesis examples of the third fluorine-containing polymers and examples are described below but the present invention is not limited thereto.

Synthesis Example 1c

Thirty parts by weight of fluorine-containing monomer (A-2), 10 parts by weight of methyl methacrylate (hereinafter abbreviated to MMA), 15 parts by weight of hydroxyethyl methacrylate (hereinafter abbreviated to HEMA), 10 parts by weight of i-butyl methacrylate (hereinafter abbreviated to i-BuMA), and 150 parts by weight of methyl isobutyl ketone were charged in a glass flask equipped with a stirrer, a condenser and thermostatic property, and 0.4 parts by weight of azobisiso-butyronitrile (hereinafter abbreviated to AIBN) as a polymerization initiator, and 0.3 parts by weight of lauryl-mercaptan as a chain transferring agent were added to the flask under refluxing with introducing a nitrogen gas. After the content in the flask was refluxed for 7 hours, the polymerization was terminated. Molecular weight calculated in terms of polystyrene by gel permeation chromatography (GPC) was 10,200.

Synthesis Examples 2c to 4c

Polymers shown in Table 1c were synthesized in the same manner as in Synthesis Example 1c. Comparative polymer was also synthesized in the same manner.

TABLE 1c

| | Fluorine-Containing Monomer (weight part) | Copolymer Component | Molecular Weight of Copolymer |
| --- | --- | --- | --- |
| Synthesis Example 1c | A-2 (30) | MMA/HEMA/i-BuMA (10/15/10) | 10,200 |
| Synthesis Example 2c | A-19 (20) | MMA/i-BuMA (10/20) | 16,300 |
| Synthesis Example 3c | A-22 (10) | MMA (40) | 8,000 |
| Synthesis Example 4c | A-31 (30) | MMA/HEMA/i-BuMA (20/10/15) | 10,000 |

TABLE 1c-continued

| | Fluorine-Containing Monomer (weight part) | Copolymer Component | Molecular Weight of Copolymer |
|---|---|---|---|
| Comparative Polymer | Monomer shown below (20) | MMA/i-BuMA (60/20) | 11,000 |

Polymer of Comparative Example

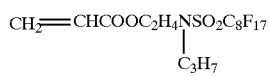

Example 1c to 4c and Comparative Examples 1c and 2c

An aluminum plate (JIS A 1050) having a thickness of 0.24 mm was subjected to brush-graining treatment with applying to the aluminum surface a suspension of pumice having an average particle size of about 2.1 $\mu$m and water using a rotating brush shown below. The first brush was, hair length: 100 mm, hair diameter: 0.95 mm, and density: 70/cm$^2$, and the second brush was, hair length: 80 mm, hair diameter: 0.295 mm, and density: 670/cm$^2$. The rotation rate of brush rolls was 250 rpm respectively. After brush-graining, the plate was thoroughly washed with water, etching was effected by immersing the plate in a 10% sodium hydroxide aqueous solution at 60° C. for 25 seconds, the plate was further washed with flowing water, then washed with a 20% nitric acid aqueous solution for neutralization followed by washing with water. Under the condition of $V_A$ of 12.7 V using alternating waveform electric current of sine wave, the plate was subjected to electrolytic surface roughening treatment in a 11% nitric acid aqueous solution by the quantity of electricity of anode of 160 C/dm$^2$. The surface roughness determined was 0.50 $\mu$m (Ra). Subsequently, the plate was immersed in a 1% sodium hydroxide aqueous solution at 40° C. for 30 seconds, then immersed in a 30% sulfuric acid aqueous solution and desmutting treatment was performed at 60° C. for 40 seconds. Then, the plate was anodically oxidized by direct current in a 20% sulfuric acid aqueous solution at electric density of 2 A/dm$^2$ so as to reach the oxide film amount of 1.6 g/m$^2$, and the plate was washed, thereby a substrate was prepared.

Undercoating solution (I) having the following composition was coated on the surface of the-thus treated support and dried at 80° C. for 30 seconds. Thus, the support (A) was prepared. The coating amount after drying was 5 mg/m$^2$.

| Undercoating Solution (I) | |
|---|---|
| β-Alanine | 0.05 g |
| TEA-HCl | 0.05 g |
| Methanol | 40 g |
| Pure water | 60 g |

The photosensitive solution shown in Table 2b below was coated on the support (A) by rod coating in an amount of 12 ml/m$^2$, dried at 100° C. for 1 minute, thereby a photosensitive lithographic printing plate was obtained. Dry coating amount was 1.15 g/m$^2$. For shortening vacuum contact time, a matting layer was provided as disclosed in JP-B-61-28986.

TABLE 2c

| Photosensitive Solution | |
|---|---|
| Esterified product of 1,2-diazonaphthoquinone-5-sulfonyl chloride and pyrogallol/acetone resin (disclosed in Example 1 in U.S. Pat. 3,635,709) | 0.8 g |
| Cresol/formaldehyde novolak resin (meta/para ratio of 6/4, weight average molecular weight: 8,000) | 1.2 g |
| Phenol/p-cresol/formaldehyde resin (phenol/p-cresol ratio: 55/45, weight average molecular weight: 8,000, remaining monomer ratio: 0.5% | 0.3 g |
| Phenol/formaldehyde novolak resin (weight average molecular weight: 15,000) | 0.2 g |
| Poly[N-(p-aminosulfonylphenyl)acrylamide-co-n-butyl acrylate-co-diethylene glycol monomethyl ether methacrylate] (molar ratio of each monomer is 40/40/20, weight average molecular weight: 40,000, number average molecular weight: 20,000) | 0.4 g |
| p-Octylphenol/formaldehyde resin (disclosed in U.S. Pat. 4,123,279) | 0.02 g |
| Naphthoquinonediazido-1,2-diazido-4-sulfonic acid chloride | 0.02 g |
| Tetrahydrophthalic anhydride | 0.16 g |
| Benzoic acid | 0.02 g |
| Pyrogallol | 0.05 g |
| 4-[p-N,N-bis(Ethoxycarbonylmethyl)aminophenyl]-2,6-bis(trichloromethyl)-s-triazine (hereinafter abbreviated to triazine A) | 0.07 g |
| Dye represented by formula (A) | 0.007 g |
| A dye obtained by replacing the counter anion of Victoria Pure Blue BOH (manufactured by Hodogaya Chemical Co., Ltd.) with 1-naphthalenesulfonic acid | 0.045 g |
| F176PF | 0.02 g |
| Fluorine-containing polymer (see Table 3c) | 0.03 g |
| MEK/1-methoxy-2-propanol = | 15 g/10 g |

Dye represented by formula (A)

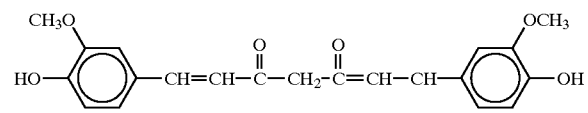

Each of the thus-prepared photosensitive lithographic printing plates was evaluated as follows.

The lithographic printing plate was exposed by a metal halide lamp of 3 kW from the distance of 1 m for 1 minute through a step wedge (density difference of each step was 0.15, manufactured by Fuji Photo Film Co., Ltd.). The exposed plate was development processed in PS Processor 900V (manufactured by Fuji Photo Film Co., Ltd.) at 30° C. for 12 seconds using an aqueous solution having a molar ratio of SiO$_2$/K$_2$O of 1.16 and SiO$_2$ concentration of 1.4%. Sensitivity was expressed by clear step number. The higher the step number, the higher is the sensitivity.

Gradation was the difference between the above clear step number in the sensitivity evaluation and solid step number. The smaller the value, the higher is the contrast.

Defoaming property was evaluated by spontaneously dropping 200 ml of a coating solution into a 50 ml of a coating solution under normal pressure, and the time until the foam generated at room temperature vanished was evaluated using a foaming tester.

The results obtained are shown in Table 3c below.

TABLE 3c

| Example No. | Fluorine-Containing Polymer | Gradation | Defoaming Property of Coating Solution (the time until foams vanish) |
| --- | --- | --- | --- |
| Example 1c | Synthesis Example 1c | 5.5 | 5 min |
| Example 2c | Synthesis Example 2c | 5.0 | 7 min |
| Example 3c | Synthesis Example 3c | 5.5 | 6 min |
| Example 4c | Synthesis Example 4c | 5.5 | 5 min |
| Comparative Example 1c | Polymer of Comparative Example | 6.0 | 10 min |
| Comparative Example 2c | Not added | 6.5 | 8 min |

As can be seen from the results in Table 3c, the photosensitive printing plate in Examples 1c to 4c are high contrast and excellent in defoaming property.

A positive type photosensitive lithographic printing plate showing image-forming property of high contrast and excellent defoaming property can be obtained by the addition of the third fluorine-containing polymer.

The present invention is described with referring to examples using the fourth fluorine-containing polymers but the present invention is not limited thereto.

Synthesis of Fluorine-Containing Polymer

Synthesis Example 1d

A polymer was prepared as follows. Forty-six point six (46.6) grams of 2-(perfluorooctyl)ethyl acrylate, 28.8 g of N-(4-sulfamoylphenyl)methacrylamide, 18.9 g of n-nonyl methacrylate, and 180 g of dimethylacetamide were put in a three necked flask having a capacity of 500 ml and the content of the flask was stirred under nitrogen atmosphere with maintaining the temperature at 65° C. Three point seven three (3.73) grams of 2,2'-azobis(2,4-dimethylvaleronitrile) was added thereto and stirring was continued. Four hours after the addition of 2,2'-azobis(2,4-dimethylvaleronitrile), the temperature was raised to 68° C. and maintained that temperature for 1 hour. After termination of the reaction, the temperature was lowered to room temperature and the reaction mixture was poured into 400 ml of water. The solid precipitated was filtered and dried.

Yield: 32.5 g. The solid obtained was revealed to be a high molecular compound having a weight average molecular weight of 23,000 by GPC.

Synthesis Examples 2d and 3d

Polymers as shown in Table 1d below were prepared in the same manner as in Synthesis Example 1d. A comparative compound (polymer) was also prepared in the same manner.

TABLE 1d

| Synthesis Example | Polymer Name | Polymer Composition | Weight Average Molecular Weight |
| --- | --- | --- | --- |
| 1d | Pd-6 | | 23,000 |
| 2d | Pd-2 | | 18,000 |
| 3d | Pd-5 | | 15,000 |

TABLE 1d-continued

| Synthesis Example | Polymer Name | Polymer Composition | Weight Average Molecular Weight |
| --- | --- | --- | --- |
| Comparison | Rd-1 | 2-(Perfluorooctyl)ethyl Acrylate (0.05 mol) M-1 (0.05 mol) | 20,000 |
| Comparison | Rd-2 | 2-(Perfluorooctyl)ethyl Acrylate (0.03 mol) n-Nonyl methacrylate (0.03 mol) Methacrylic acid (0.04 mol) | 21,000 |

Synthesis Example 4d
Preparation of Specific Copolymer 1

Thirty-one point zero (31.0) grams (0.36 mol) of methacrylic acid, 39.1 g (0.36 mol) of ethyl chloroformate, and 200 ml of acetonitrile were added to a three necked flask equipped with a stirrer, a condenser and a dropping funnel having a capacity of 500 ml, and the mixture was stirred with cooling in a ice water bath. To this mixture was dropwise added 36.4 g (0.36 mol) of triethylamine by means of a dropping funnel over about 1 hour. After termination of dropwise addition, the ice water bath was taken out and the reaction mixture was stirred at room temperature for 30 minutes.

To this reaction mixture, 51.7 g (0.30 mol) of p-aminobenzenesulfonamide was added and the mixture was stirred at 70° C. in an oil bath for 1 hour. After completion of the reaction, the mixture was poured into 1 liter of water with stirring the water, and stirring was continued for 30 minutes. The mixture was filtered and precipitated product was taken out, this precipitated product was made slurry with 500 ml of water. The slurry was filtered, the obtained solid was dried, and white solid of N-(p-aminosulfonylphenyl)methacrylamide was obtained (yield: 46.9 g).

Four point six one (4.61) grams (0.0192 mol) of N-(p-aminosulfonylphenyl)methacrylamide, 2.94 g (0.0258 mol) of ethyl methacrylate, 0.80 g (0.015 mol) of acrylonitrile, and 20 g of N,N-dimethylacetamide were added to a three necked flask equipped with a stirrer, a condenser and a dropping funnel having a capacity of 20 ml, and the mixture was stirred with heating at 65° C. in a hot water bath. To the mixture was added 0.15 g of V-65 (a product of Wako Pure Chemical Co., Ltd.) and the mixture was stirred in nitrogen atmosphere for 2 hours with maintaining the temperature at 65° C. Further, a mixture of 4.61 g of N-(p-aminosulfonylphenyl)methacrylamide, 2.94 g of ethyl methacrylate, 0.80 g of acrylonitrile, N,N-dimethylacetamide and 0.15 g of V-65 was dropwise added to this reaction solution by means of a dropping funnel over 2 hours. After termination of the dropwise addition, the reaction mixture was stirred for further 2 hours at 65° C. After completion of the reaction, 40 g of methanol was added thereto and cooled. The mixture obtained was put in 2 liters of water with stirring the water and stirring was continued for 30 minutes. The precipitated product was filtered and dried, thereby 15 g of white solid was obtained. This copolymer 1 was found to have a weight average molecular weight (polystyrene standard) of 53,000 by gel permeation chromatography.

Preparation of Substrate

An aluminum plate (quality of material 1050) having a thickness of 0.30 mm was washed with trichloroethylene and degreased, then subjected to brush-graining treatment using a nylon brush and a suspension of 400 mesh pumice and water, and the surface of the plate was thoroughly washed with water. The etching was effected by immersing the plate in a 25% sodium hydroxide aqueous solution at 45° C. for 9 seconds, the plate was further washed with water, then further immersed in a 20% nitric acid aqueous solution for 20 seconds followed by washing with water. The etching amount of the grained surface at this time was about 3 g/m². The plate was anodically oxidized by direct current with a 7% sulfuric acid aqueous solution being an electrolytic solution at electric density of 15 A/dm². The oxide film obtained was 3 g/m². The plate was then washed with water and dried. Undercoating solution having the following composition was coated on this aluminum plate and dried at 90° C. for 1 minute. The coating amount after drying was 10 mg/m².

| Undercoating Solution | |
|---|---|
| β-Alanine | 0.5 g |
| Methanol | 95 g |
| Water | 5 g |

Further, the plate was treated with a 2.5 wt % aqueous solution of sodium silicate 30° C. for 10 seconds. Undercoating solution having the following composition was coated on this aluminum plate and dried at 80° C. for 15 seconds, thereby a substrate was obtained. The coating amount after drying was 15 mg/m².

| Undercoating Solution | |
|---|---|
| The compound shown below | 0.3 g |
| Methanol | 100 g |
| Water | 1 g |

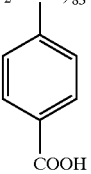

Molecular weight: 28,000

Example 1d

The following photosensitive solution 1 was prepared. This photosensitive solution 1 was coated on the above-prepared substrate in a coating amount of 1.8 g/m² to obtain a lithographic printing plate.

| Photosensitive Solution 1 | |
|---|---|
| Fluorine-containing polymer (Pd-6) | 0.03 g |
| Specific copolymer 1 | 0.75 g |
| m-Cresol/p-cresol novolak resin (m/p ratio: 6/4, weight average, molecular weight: 3,500, 0.5 wt % of unreacted cresol was contained) | 0.25 g |
| p-Toluenesulfonic acid | 0.003 g |
| Tetrahydrophthalic anhydride | 0.03 g |
| Cyanine dye A (having the following structure) | 0.017 g |
| A dye obtained by replacing the counter ion of Victoria Pure Blue BOH with 1-naphthalenesulfonic acid anion | 0.015 g |
| Megafac F177 (fluorine-based nonionic surfactant, manufactured by Dainippon Chemicals and Ink Co., Ltd.) | 0.05 g |
| γ-Butyrolactone | 10 g |
| Methyl ethyl ketone | 10 g |
| 1-Methoxy-2-propanol | 1 g |
| Cyanine Dye A | |

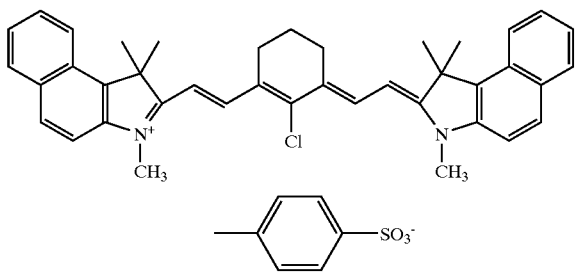

The developing stability against scratch of the lithographic printing plate obtained was evaluated. The results obtained are shown in Table 2d below.

Developing Stability Against Scratch

The lithographic printing plate obtained was exposed using a semiconductor laser having output of 500 mW, wavelength of 830 nm and beam diameter of 17 μm (1/e²), at main scanning rate of 5 m/sec. The scratching test was effected using a continuous load-scratching tester model SB62 (manufactured by Shinto Kagaku Co. Ltd.) by sticking a No. 5 filter paper manufactured by Advantec Toyo Co., Ltd. on the square flat surface of 1 cm² of the scratch jig which makes in contact with the plate, applying 100 g of load thereto, and effecting scratching at a rate of 6 cm/sec, and then developing the plate using a developing solution DP-4 (dilution: 1/8, manufactured by Fuji Photo Film Co., Ltd.). The evaluation was based on the following criteria:

C: Photosensitive film at the part scratched was completely dissolved.

B: Photosensitive film at the part scratched was partially dissolved.

A: Photosensitive film at the part scratched was not dissolved at all.

TABLE 2d

| Example No. | Developing Stability against Scratch |
|---|---|
| Example 1d | A |
| Example 2d | A |
| Example 3d | A |
| Comparative Example 1d | C |
| Comparative Example 2d | C |

Examples 2d and 3d, Comparative Examples 1d AND 2d

Lithographic printing plates were prepared in the same manner as in Example 1d except for using fluorine-containing polymers Pd-2, Pd-5, Rd-1 and Rd-2 were used in place of Pd-6. The developing stability against scratch of each of the lithographic printing plates obtained was evaluated in the same manner as in Example 1d. The results obtained are shown in Table 2d above.

It can be seen from the results in Table 2d that developing stability against scratch before development is conspicuously improved by the addition of the specific polymer.

By the use of the fourth fluorine-containing polymer of the present invention, a positive type photosensitive composition for infrared laser for direct plate-making which is excellent in handlability can be obtained.

While the invention has been described in detail and with reference to specific examples thereof, it will be apparent to one skilled in the art that various changes and modifications can be made therein without departing from the spirit and scope thereof.

What is claimed is:

1. A positive working photosensitive composition for an infrared laser which comprises the following (a), (b) and (c):
   (a) a substance which absorbs infrared rays or near infrared rays and generates heat,
   (b) an alkaline aqueous solution-soluble resin having a phenolic hydroxyl group, and
   (c) a fluorine-containing polymer containing at least the following (1), (2) and (3) as a copolymer component:
   (1) an addition polymerizable fluorine-containing monomer having, at the side chain, a fluoro aliphatic group,
   (2) a monomer represented by the following formula (1), (2), (3) or (4):

  [1]

  [2]

  [3]

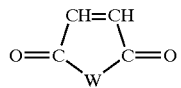  [4]

wherein $A^1$ represents a hydrogen atom, a halogen atom, or an alkyl group; W represents an oxygen atom or $NR^1$; $R^1$ represents a hydrogen atom, an alkyl group, or an aryl group; $R^2$ represents an alkyl group which may have a substituent, or an aryl group which may have a substituent; $R^3$ represents an alkyl group or an aryl group; U represents a cyano group, an aryl group, an alkoxyl group, an aryloxy group, an acyloxymethyl group, a nitrogen-containing heterocyclic group, or $CH_2OCOR^3$ (wherein $R^3$ has the same meaning as above); and
   (3) an addition polymerizable monomer having an acidic hydrogen atom and an acidic group, said acidic hydrogen atom being bonded to a nitrogen atom of the acidic group.

2. The positive working photosensitive composition for an infrared laser as claimed in claim 1, wherein said positive working photosensitive composition further contains a copolymer containing at least one of the following (4), (5) and (6) in an amount of 10 mol % or more as a copolymer component:
   (4) a monomer having a sulfonamido group in which at least one hydrogen atom is bonded on the nitrogen atom in one molecule,
   (5) a monomer having an active imino group represented by the following formula in one molecule:

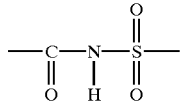

(6) acrylamide, methacrylamide, acrylic ester, methacrylic ester, or hydroxystyrene each having a phenolic hydroxyl group.

3. The positive working photosensitive composition for an infrared laser as claimed in claim 1, wherein said substance which absorbs infrared rays or near infrared rays and generates heat is a cyanine dye.

* * * * *